US012812965B2

(12) United States Patent
Oh et al.

(10) Patent No.: US 12,812,965 B2
(45) Date of Patent: Nov. 24, 2026

(54) SEMICONDUCTOR DEVICE

(71) Applicant: SAMSUNG ELECTRONICS CO., LTD., Suwon-si (KR)

(72) Inventors: Joong Suk Oh, Suwon-si (KR); Ho Young Kim, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 365 days.

(21) Appl. No.: 18/409,884

(22) Filed: Jan. 11, 2024

(65) Prior Publication Data

US 2024/0395807 A1 Nov. 28, 2024

(30) Foreign Application Priority Data

May 23, 2023 (KR) ........................ 10-2023-0065977

(51) Int. Cl.

| | |
|---|---|
| ***H10W 20/20*** | (2026.01) |
| ***H10D 84/83*** | (2025.01) |
| ***H10W 10/00*** | (2026.01) |
| ***H10W 10/17*** | (2026.01) |
| ***H10W 20/41*** | (2026.01) |

(52) U.S. Cl.

CPC .......... *H10D 84/83* (2025.01); *H10W 10/014* (2026.01); *H10W 10/17* (2026.01); *H10W 20/427* (2026.01)

(58) Field of Classification Search

CPC . H10D 30/6735; H10W 20/20; H10W 20/427

See application file for complete search history.

(56) References Cited

U.S. PATENT DOCUMENTS

| | | | | |
|---|---|---|---|---|
| 11,195,911 | B2 | 12/2021 | Xie et al. | |
| 11,195,928 | B2 * | 12/2021 | Lim .................. | H10D 30/6735 |
| 2018/0069000 | A1 | 3/2018 | Bergendahl et al. | |
| 2022/0157722 | A1 | 5/2022 | Bouche et al. | |
| 2022/0238370 | A1 | 7/2022 | Chen et al. | |

(Continued)

FOREIGN PATENT DOCUMENTS

| | | |
|---|---|---|
| EP | 4369388 | 5/2024 |

OTHER PUBLICATIONS

European Office Action in European Appln. No. 24152145.9, mailed on Sep. 20, 2024, 7 pages.

(Continued)

*Primary Examiner* — Ali Naraghi

(74) *Attorney, Agent, or Firm* — Fish & Richardson P.C.

(57) ABSTRACT

A semiconductor device includes a substrate with opposite first and second surfaces in a first direction, an active pattern on the first surface in a second direction, a gate electrode in a third direction on the active pattern, a source/drain on at least one side of the gate electrode and connected to the active pattern, a gate cutting structure on one side of the active pattern and cutting the gate electrode, the gate cutting structure including third and fourth surfaces opposite to each other in the first direction, and the fourth surface being coplanar with the second surface of the substrate, a power rail on the second surface of the substrate and extending in the second direction, and a via contact through the substrate, a first end of the via contact contacting the power rail, and a second end of the via contact connected to the source/drain.

9 Claims, 44 Drawing Sheets

(56) References Cited

U.S. PATENT DOCUMENTS

| | | | |
|---|---|---|---|
| 2022/0301878 | A1 | 9/2022 | Xie et al. |
| 2022/0328477 | A1 | 10/2022 | Chen et al. |
| 2022/0336641 | A1 | 10/2022 | Wang et al. |
| 2022/0344263 | A1 | 10/2022 | Peng et al. |
| 2022/0367462 | A1 | 11/2022 | Chiang et al. |
| 2023/0067354 | A1* | 3/2023 | Wei ...................... H10D 30/014 |
| 2024/0113193 | A1* | 4/2024 | Li ...................... H10D 30/6735 |
| 2024/0321959 | A1* | 9/2024 | Xie ...................... H10D 30/014 |
| 2024/0371873 | A1* | 11/2024 | Chen .................. H10D 30/6735 |

OTHER PUBLICATIONS

European Search Report in European Appln. No. 24152145.9, mailed on Sep. 2, 2024, 4 pages.

* cited by examiner

SEMICONDUCTOR DEVICE

CROSS-REFERENCE TO RELATED APPLICATION

This application claims priority from Korean Patent Application No. 10-2023-0065977, filed on May 23, 2023, in the Korean Intellectual Property Office, and all the benefits accruing therefrom under 35 U.S.C. 119, the contents of which in its entirety are herein incorporated by reference.

BACKGROUND

1. Field

The present disclosure relates to a semiconductor device.

2. Description of Related Art

One of scaling methods for increasing an integration density of a semiconductor device includes a multi-gate transistor, in which a multi-channel active pattern (or a silicon body) in a shape of a fin or a nanowire is formed on a substrate, and a gate is formed on a surface of the multi-channel active pattern. Because such a multi-gate transistor uses a three-dimensional channel, it is easy to scale the same. Further, current control capability of the multi-gate transistor may be improved without increasing a gate length of the multi-gate transistor. In addition, the multi-gate transistor may effectively suppress SCE (short channel effect) in which potential of a channel area is affected by drain voltage.

SUMMARY

According to an aspect of the present disclosure, there is provided a semiconductor device, including a substrate including a first surface and a second surface opposite to each other in a first direction, an active pattern on the first surface of the substrate and extending in a second direction intersecting the first direction, a gate electrode on the first surface of the substrate and covering the active pattern, wherein the gate electrode extends in a third direction intersecting the first and second directions, a source/drain pattern on at least one side of the gate electrode and connected to the active pattern, a gate cutting structure on one side of the active pattern and cutting the gate electrode, a power rail on the second surface of the substrate and extending in the second direction, and a via contact extending through the substrate, wherein one end of the via contact contacts the power rail while the other end thereof is connected to the source/drain pattern, wherein the gate cutting structure includes a third surface and a fourth surface opposite to each other in the first direction, wherein the fourth surface of the gate cutting structure is coplanar with the second surface of the substrate.

According to another aspect of the present disclosure, there is provided a semiconductor device, including a substrate including a first surface and a second surface opposite to each other in a first direction, an active pattern on the first surface of the substrate and extending in the second direction intersecting the first direction, a gate electrode on the first surface of the substrate, wherein the gate electrode covers the active pattern and extends in a third direction intersecting the first and second directions, an active cutting structure spaced apart from the gate electrode in the second direction and extending in the third direction, wherein the active cutting structure cuts the active pattern, a source/drain pattern on at least one side of the gate electrode and connected to the active pattern, a power rail on the second surface of the substrate and extending in the second direction, and a via contact extending through the substrate, wherein one end of the via contact contacts the power rail while the other end thereof is connected to the source/drain pattern, wherein the active cutting structure includes a fifth surface and a sixth surface opposite to each other in the first direction, wherein the sixth face of the active cutting structure is coplanar with the second face of the substrate.

According to another aspect of the present disclosure, there is provided a semiconductor device, including a substrate including a first surface and a second surface opposite to each other in a first direction, a lower pattern on the first surface of the substrate and extending in a second direction intersecting the first direction, a plurality of sheet patterns on the lower pattern and spaced apart from the lower pattern in the first direction, a gate electrode on the first surface of the substrate and extending in a third direction intersecting the first and second directions, wherein the gate electrode surrounds the plurality of sheet patterns, an active cutting structure spaced apart from the gate electrodes in the second direction, and extending in the third direction, wherein the active cutting structure cuts the lower pattern and the plurality of sheet patterns, and extends through the substrate, a source/drain pattern on an upper surface of the lower pattern and on at least one side of the gate electrode, wherein the source/drain pattern is connected to the plurality of sheet patterns, a gate cutting structure on one side of each of the plurality of sheet patterns, wherein the gate cutting structure cuts the gate electrode and extends through the substrate, a power rail on the second surface of the substrate and extending in the second direction, and a via contact extending through the substrate, wherein one end of the via contact contacts the power rail while the other end thereof is connected to the source/drain pattern, wherein the gate cutting structure includes a third surface and a fourth surface opposite to each other in the first direction, wherein the active cutting structure includes a fifth surface and a sixth surface opposite to each other in the first direction, wherein the second surface of the substrate, the fourth surface of the gate cutting structure, and the sixth surface of the active cutting structure are coplanar with each other.

BRIEF DESCRIPTION OF DRAWINGS

Features will become apparent to those of skill in the art by describing in detail exemplary embodiments with reference to the attached drawings, in which.

DETAILED DESCRIPTIONS

In a diagram of a semiconductor device according to some embodiments, a fin-type transistor (FinFET) including a fin-type pattern-shaped channel area, a transistor including nanowires or nanosheets, MBCFET™ (Multi-Bridge Channel Field Effect Transistor) or a vertical transistor (Vertical FET) is shown illustratively. However, embodiments may be implemented in any semiconductor device, e.g., a tunneling transistor (tunneling FET), a three-dimensional (3D) transistor, a planar transistor, a 2D (two-dimensional) material transistor (2D material based FETs) and a heterostructure thereof, a bipolar junction transistor, a lateral double diffusion transistor (LDMOS), etc.

Figure 1:
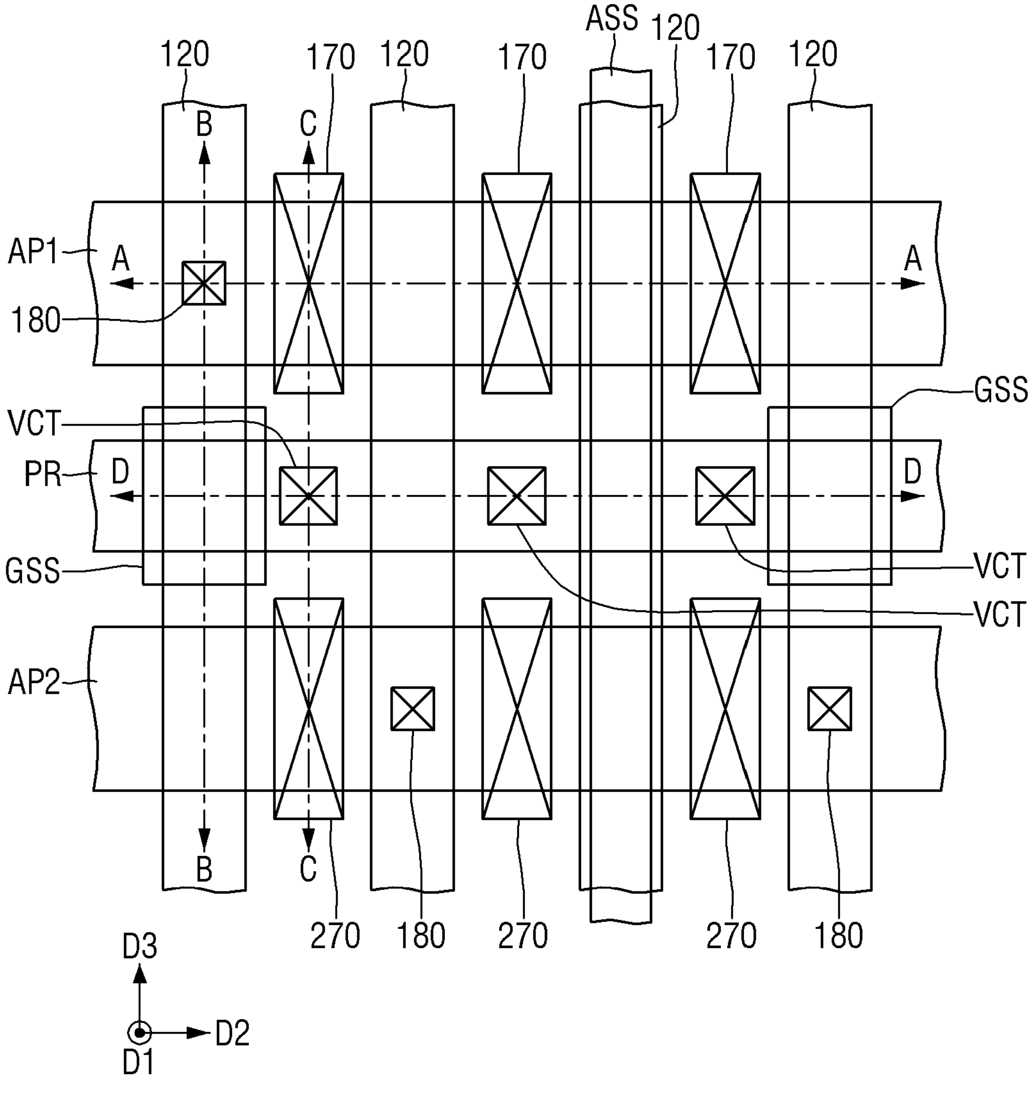
FIG. 1 is a layout diagram of a semiconductor device according to some embodiments.
Figure 2:
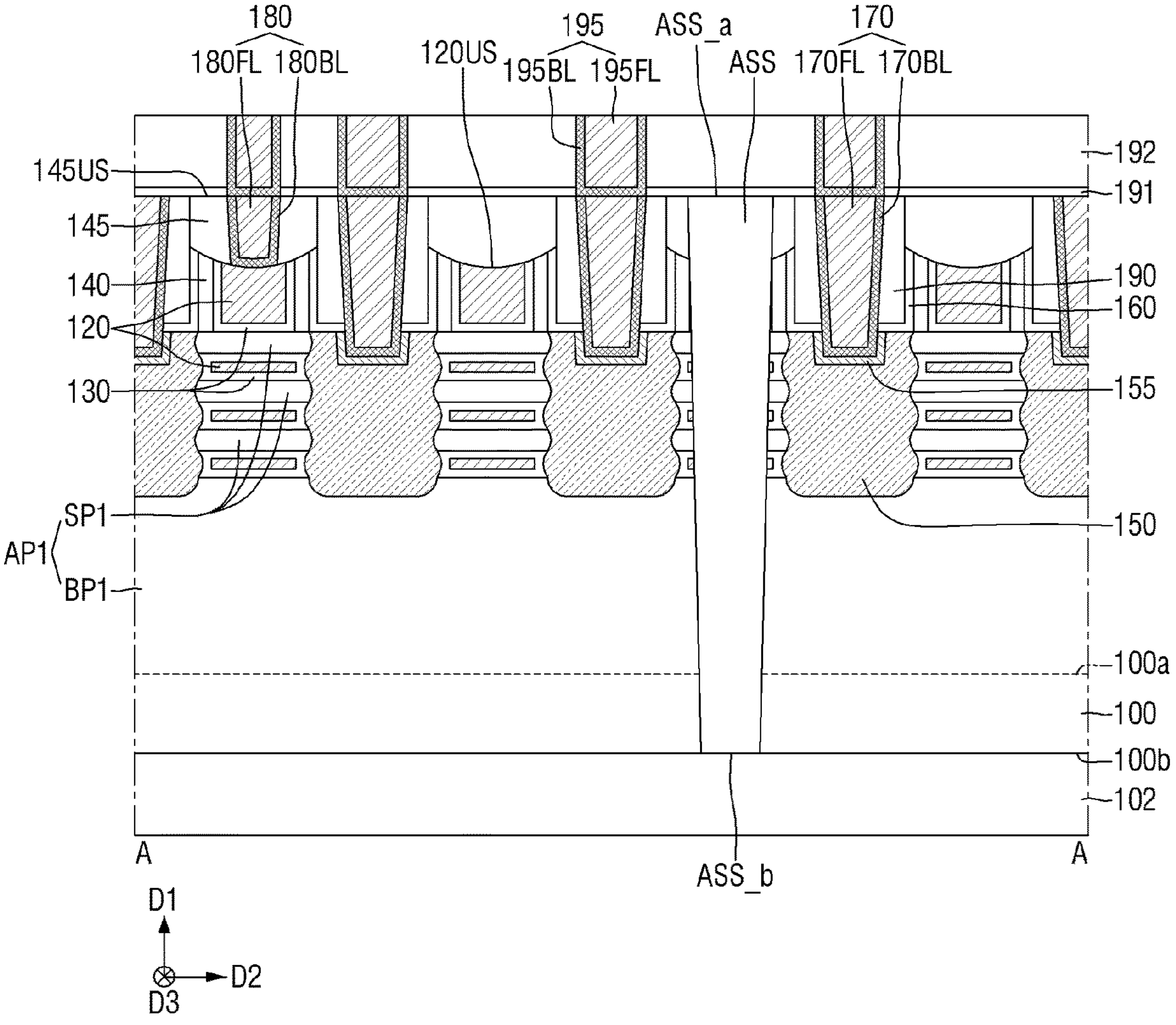
FIG. 2 is a cross-section along line A-A in FIG. 1.
Figure 3:
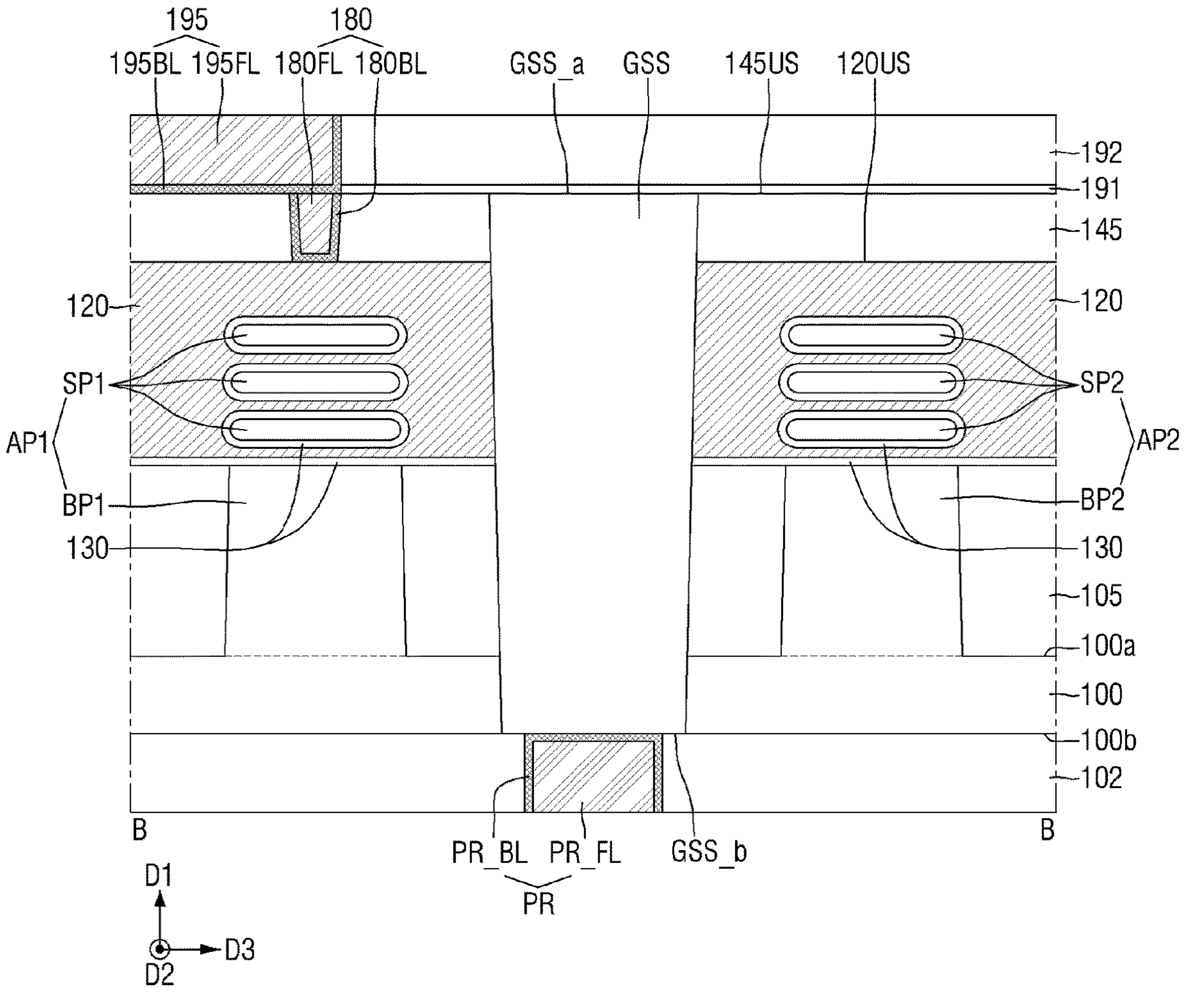
FIG. 3 is a cross-section along line B-B in FIG. 1.
Figure 4:
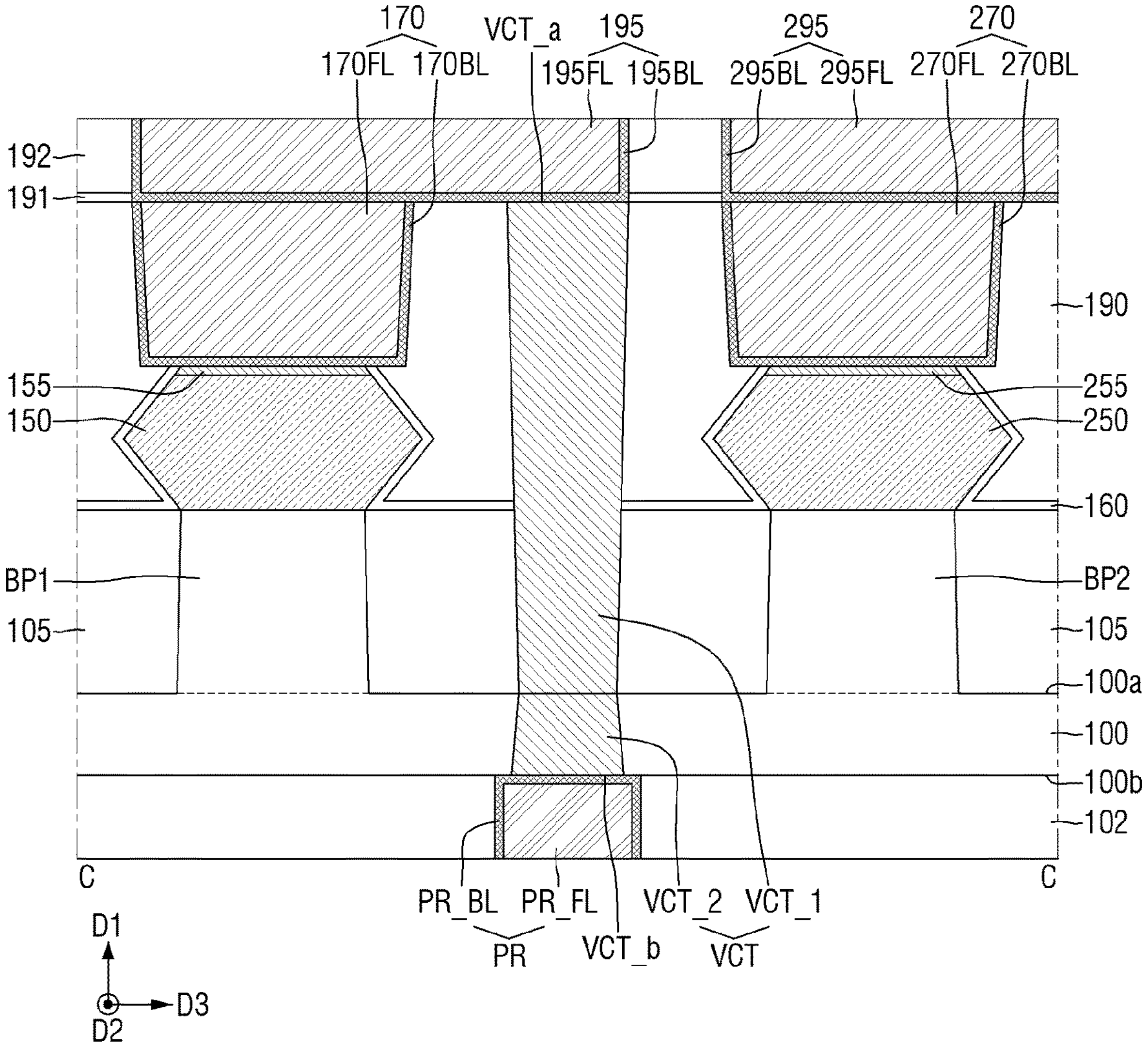
FIG. 4 is a cross-section along line C-C in FIG. 1.
Figure 5:
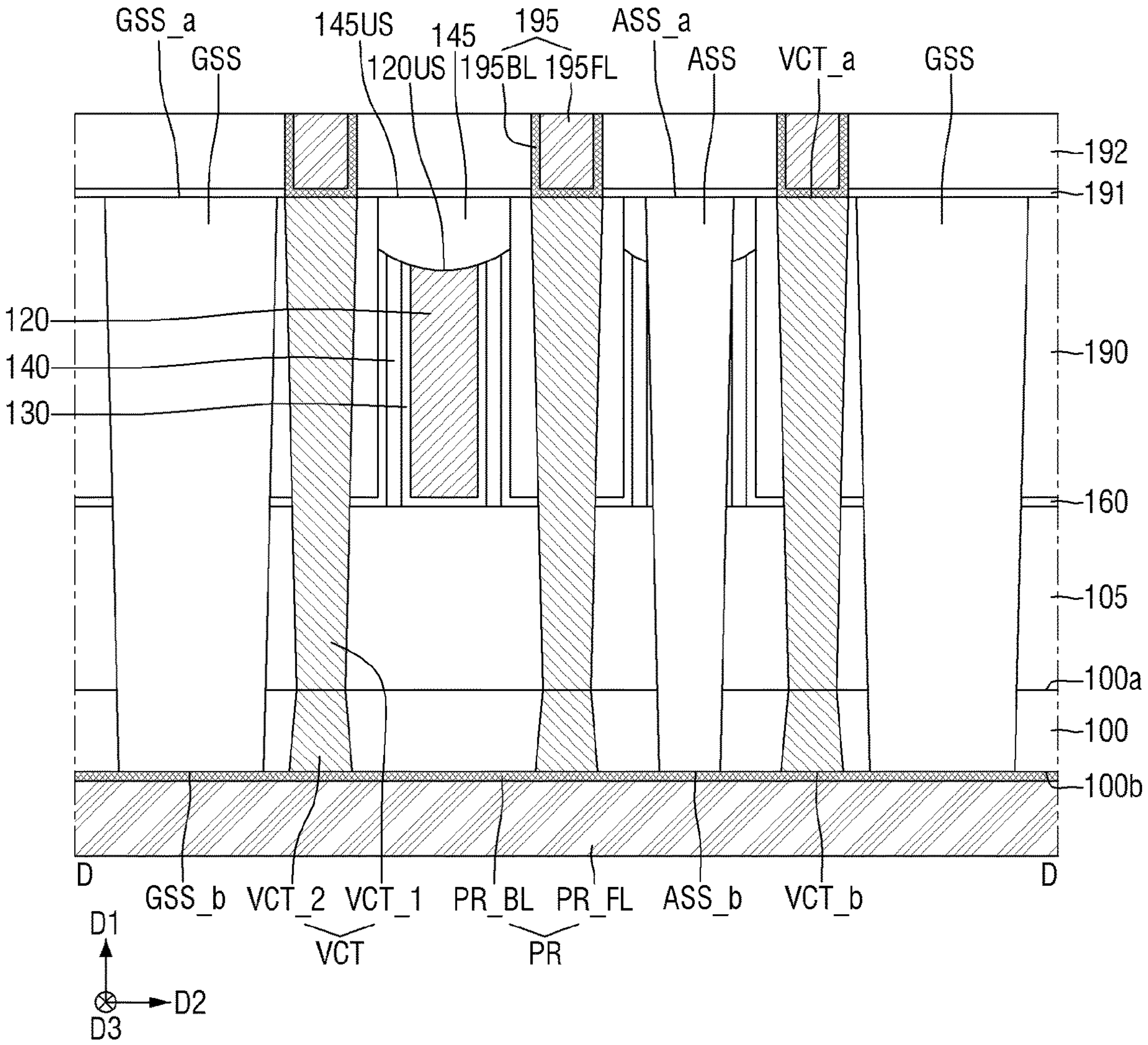
FIG. 5 is a cross-section along line D-D in FIG. 1.

First, referring to FIG. 1 to FIG. 5, a semiconductor device according to some embodiments is described. FIG. 1 is an illustrative layout diagram for illustrating a semiconductor device according to some embodiments. FIG. 2 is an illustrative cross-section cut along a line A-A in FIG. 1. FIG. 3 is an illustrative cross-section cut along a line B-B in FIG. 1. FIG. 4 is an illustrative cross-section cut along a line C-C in FIG. 1. FIG. 5 is an illustrative cross-sectional view as cut along a line D-D in FIG. 1.

Referring to FIG. 1 to FIG. 5, a semiconductor device according to some embodiments may include a first active pattern AP1, a second active pattern AP2, a plurality of gate electrodes 120, a first source/drain contact 170, a second source/drain contact 270, a gate contact 180, a power rail PR, a via contact VCT, a gate cutting structure GSS, and an active cutting structure ASS.

First, a substrate 100 may be provided. The substrate 100 may include a first surface 100*a* and a second surface 100*b* opposite to each other in a first direction D1. The first surface 100*a* of the substrate 100 may be referred to as an upper surface of the substrate 100 or a front side of the substrate 100. The second surface 100*b* of the substrate 100 may be referred to as a lower surface of the substrate 100 or a back side of the substrate 100.

For example, the substrate 100 be a bulk silicon substrate or a silicon-on-insulator (SOI) substrate. In another example, the substrate 100 may be a silicon substrate, or may be made of a material other than silicon, e.g., silicon germanium, SGOI (silicon germanium on insulator), indium antimonide, lead telluride compound, indium arsenide, indium phosphide, gallium arsenide or gallium antimonide.

Each of the first active pattern AP1 and the second active pattern AP2 may be disposed on the first surface 100*a* of the substrate 100. Each of the first active pattern AP1 and the second active pattern AP2 may extend along a second direction D2 while being disposed on the substrate 100. The first active pattern AP1 and the second active pattern AP2 may be spaced apart from each other in a third direction D3.

In a plan view, as illustrated in FIG. 1, each of the first active pattern AP1 and the second active pattern AP2 may include a long side extending in the second direction D2 and a short side extending in the third direction D3. In this regard, the second direction D2 may intersect with the third direction D3 and the first direction D1. Furthermore, the third direction D3 may intersect the first direction D1. The first direction D1 may be a thickness direction of the substrate 100.

Each of the first active pattern AP1 and the second active pattern AP2 may be a multi-channel active pattern. The first active pattern AP1 may include a first lower pattern BP1 and a plurality of first sheet patterns SP1. The second active pattern AP2 may include a second lower pattern BP2 and a plurality of second sheet patterns SP2.

The first lower pattern BP1 may protrude from the substrate 100 in the first direction D1. The first lower pattern BP1 may extend (e.g., lengthwise) in the second direction D2. The first lower pattern BP1 may be a fin-shaped pattern. The plurality of first sheet patterns SP1 may be disposed on the first lower pattern BP1. The plurality of first sheet patterns SP1 may be spaced apart from the first lower pattern BP1 in the first direction D1. Furthermore, the plurality of first sheet patterns SP1 may be spaced apart from each other in the first direction D1. Although it is illustrated that three first sheet patterns SP1 are arranged in the first direction D1, this is only for convenience of illustration and any suitable number of first sheet patterns SP1 may be used.

The second lower pattern BP2 may protrude from substrate 100 in the first direction D1. The second lower pattern BP2 may extend (e.g., lengthwise) in the second direction D2. The second lower pattern BP2 may be a fin-shaped pattern. The plurality of second sheet pattern SP2 may be disposed on the second lower pattern BP2. The plurality of second sheet patterns SP2 may be spaced apart from the second lower pattern BP2 in the first direction D1. Furthermore, the plurality of second sheet patterns SP2 may be spaced apart from each other in the first direction D1. Although it is illustrated that three second sheet patterns SP2 are arranged in the first direction D1, this is only for convenience of illustration and any suitable number of second sheet patterns SP2 may be used.

Each of the first lower pattern BP1 and the second lower pattern BP2 may be formed by etching a portion of the substrate 100, or may include an epitaxial layer grown from the substrate 100. For example, each of the first lower pattern BP1 and the second lower pattern BP2 may include an elemental semiconductor material, e.g., silicon or germanium. In another example, each of the first lower pattern BP1 and the second lower pattern BP2 may include a compound semiconductor, e.g., each of the first lower pattern BP1 and the second lower pattern BP2 may include a group IV-IV compound semiconductor or a group III-V compound semiconductor.

For example, the group IV-IV compound semiconductor may include a binary compound including two of carbon (C), silicon (Si), germanium (Ge), and tin (Sn), a ternary compound including three thereof, or a compound obtained by doping a group IV element thereto. For example, the group III-V compound semiconductor may include a binary compound obtained by combining one of aluminum (Al), gallium (Ga), and indium (In) as a group III element and one of phosphorus (P), arsenic (As), and antimony (Sb) as a group V element with each other, a ternary compound obtained by combining two of aluminum (Al), gallium (Ga), and indium (In) as a group III element and one of phosphorus (P), arsenic (As), and antimony (Sb) as a group V with each other, or a quaternary compound obtained by combining three of aluminum (Al), gallium (Ga), and indium (In) as a group III element and one of phosphorus (P), arsenic (As), and antimony (Sb) as a group V with each other.

Each of the first sheet patterns SP1 and the second sheet patterns SP2 may include one of silicon or germanium as the elemental semiconductor material, the group IV-IV compound semiconductor, or the group III-V compound semiconductor. Each of the first sheet patterns SP1 may include the same material as that of the first lower pattern BP1, or may include a different material from that of the first lower pattern BP1. Each of the second sheet patterns SP2 may include the same material as that of the second lower pattern BP2, or may include a different material from that of the second lower pattern BP2.

In the semiconductor device according to some embodiments, each of the first lower pattern BP1 and the second lower pattern BP2 may be a silicon lower pattern including silicon, while each of the first sheet patterns SP1 and the second sheet patterns SP2 may be a silicon sheet patterns including silicon.

A field insulating film 105 may be formed on the substrate 100. The field insulating film 105 may be formed on the first surface 100*a* of the substrate 100.

The field insulating film 105 may cover a sidewall of the first lower pattern BP1 and a sidewall of the second lower pattern BP2. Each of the first sheet patterns SP1 and each of the second sheet patterns SP2 may be positioned at a higher vertical level than that of an upper surface of the field insulating film 105, e.g., relative to the second surface 100*b* of the substrate 100. The field insulating film 105 may include, e.g., an oxide film, a nitride film, an oxynitride film, or a combination thereof. The field insulating film 105 is illustrated as a single film but may include a plurality of films, e.g., the field insulating film 105 may include a field liner extending along a sidewall and a bottom surface of a fin trench defining the first and second lower patterns BP1 and BP2, and a field filling film disposed on the field liner.

The plurality of gate electrodes 120 may be disposed on the substrate 100. For example, the plurality of gate electrodes 120 may be disposed on the field insulating film 105. Each of the plurality of gate electrodes 120 may extend (e.g., lengthwise) in the third direction D3. The plurality of gate electrodes 120 may be spaced apart from each other in the second direction D2.

The plurality of gate electrodes 120 may be disposed on the first active pattern AP1 and the second active pattern AP2. The plurality of gate electrodes 120 may intersect the first active pattern AP1 and the second active pattern AP2. The plurality of gate electrodes 120 may surround the first sheet patterns SP1 and the second sheet patterns SP2. Each of the plurality of gate electrodes 120 may include a long side extending in the third direction D3 and a short side extending in the second direction D2.

For example, as illustrated in FIGS. 2 and 5, an upper surface 120US of each of the plurality of gate electrodes 120 may be a concavely curved surface recessed toward an upper surface of the first active pattern AP1. In another example, the upper surface 120US of each of the plurality of gate electrodes 120 may be a flat surface.

Each of the plurality of gate electrodes 120 may include at least one of, e.g., titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), or combinations thereof.

Each of the plurality of gate electrodes 120 may include a conductive metal oxide, a conductive metal oxynitride, and the like. In this regard, the conductive metal oxide and the conductive metal oxynitride may include oxidized products of the above-mentioned materials.

Each of the plurality of gate electrodes 120 may be disposed on each of both opposing sides of a first source/drain pattern 150 to be described later. Although not shown, each of the plurality of gate electrodes 120 may be disposed on each of both opposing sides of a second source/drain pattern 250.

For example, each of the gate electrodes 120 respectively disposed on both opposing sides of the first source/drain pattern 150 or on both opposing sides of the second source/drain pattern 250 may be a normal gate electrode used as a gate of a transistor. In another example, the gate electrode 120 disposed on one side of the first source/drain pattern 150 or on one side of the second source/drain pattern 250 may be used as a gate of the transistor, while the gate electrode 120 disposed on the other side of the first source/drain pattern 150 or on the other side of the second source/drain pattern 250 may be a dummy gate electrode.

A plurality of gate spacers 140 may be disposed on a sidewall of each of the plurality of gate electrodes 120. The plurality of gate spacers 140 may not contact the plurality of gate electrodes 120. A gate insulating film 130 may be disposed between the gate spacer 140 and the sidewall of the gate electrode 120. Each of the plurality of gate spacers 140 may extend (e.g., lengthwise) in the third direction D3. Each of the plurality of gate spacers 140 may include, e.g., at least one of silicon nitride (SiN), silicon oxynitride (SiON), silicon oxide ($SiO_2$), silicon oxycarbonitride (SiOCN), silicon boron nitride (SiBN), silicon oxyboronitride (SiOBN), silicon oxycarbide (SiOC), or combinations thereof.

The gate insulating film 130 may be disposed between the gate electrodes 120 and the upper surface of the field insulating film 105, between the gate electrodes 120 and the upper surface of the first lower pattern BP1, between the gate electrodes 120 and the upper surface of the second lower pattern BP2, between the gate electrodes 120 and the first sheet patterns SP1, and between the gate electrodes 120 and the second sheet patterns SP2. The gate insulating film 130 may be formed between the gate electrodes 120 and the gate spacers 140. Furthermore, the gate insulating film 130 may be formed between the first source/drain pattern 150 and the gate electrodes 120.

For example, the gate insulating film 130 may include silicon oxide, silicon oxynitride, silicon nitride, or a high dielectric constant (high-k) material having a higher dielectric constant than that of silicon oxide. The high dielectric constant (high-k) material may include at least one of, e.g., boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate. However, the present disclosure is not limited thereto.

The gate insulating film 130 is illustrated as being embodied as a single film. However, this is only for convenience of illustration, e.g., the gate insulating film 130 may be embodied as a stack of a plurality of films.

The semiconductor device according to some embodiments may include an NC (negative capacitance) FET using a negative capacitor. For example, the gate insulating film 130 may include a ferroelectric material film having ferroelectric properties and a paraelectric material film having paraelectric properties.

The ferroelectric material film may have negative capacitance, and the paraelectric material film may have positive capacitance. For example, when two or more capacitors are connected in series to each other, and capacitance of each of the capacitors has a positive value, a total capacitance is smaller than capacitance of each individual capacitor. On the contrary, when at least one of capacitances of two or more capacitors connected in series to each other has a negative value, a total capacitance may have a positive value and be greater than an absolute value of each individual capacitance.

When the ferroelectric material film with negative capacitance and the paraelectric material film with positive capacitance are connected in series to each other, a total capacitance value of the ferroelectric material film and the paraelectric material film connected in series to each other may be increased. Using the increase in the total capacitance value, a transistor including the ferroelectric material film may have a subthreshold swing (SS) lower than about 60 mV/decade at room temperature.

The ferroelectric material film may have ferroelectric properties. The ferroelectric material film may include, e.g., at least one of hafnium oxide, hafnium zirconium oxide, barium strontium titanium oxide, barium titanium oxide, and lead zirconium titanium oxide. In this connection, in one example, hafnium zirconium oxide may refer to a material obtain by doping hafnium oxide with zirconium (Zr). In another example, hafnium zirconium oxide may refer to a compound of hafnium (Hf), zirconium (Zr), and oxygen (O).

The ferroelectric material film may further contain dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and tin (Sn). A type of the dopant contained in the ferroelectric material film may vary depending on a type of the ferroelectric material included in the ferroelectric material film.

When the ferroelectric material film includes hafnium oxide, the dopant contained in the ferroelectric material film may include, e.g., at least one of gadolinium (Gd), silicon (Si), zirconium (Zr), aluminum (Al), and yttrium (Y).

When the dopant is aluminum (Al), the ferroelectric material film may contain about 3 at % to about 8 at % (atomic %) of aluminum. In this context, a content of the dopant may be a content of aluminum based on a sum of hafnium and aluminum.

When the dopant is silicon (Si), the ferroelectric material film may contain about 2 at % to about 10 at % of silicon. When the dopant is yttrium (Y), the ferroelectric material film may contain about 2 at % to about 10 at % yttrium. When the dopant is gadolinium (Gd), the ferroelectric material film may contain about 1 at % to about 7 at % gadolinium. When the dopant is zirconium (Zr), the ferroelectric material film may contain about 50 at % to about 80 at % zirconium.

The paraelectric material film may have paraelectric properties. The paraelectric material film may include, e.g., at least one of silicon oxide and metal oxide having a high dielectric constant. For example, the metal oxide contained in the paraelectric material film may include at least one of hafnium oxide, zirconium oxide and aluminum oxide.

The ferroelectric material film and the paraelectric material film may include the same material. The ferroelectric material film may have ferroelectric properties, but the paraelectric material film may not have the ferroelectric properties. For example, when each of the ferroelectric material film and the paraelectric material film includes hafnium oxide, a crystal structure of hafnium oxide contained in the ferroelectric material film is different from a crystal structure of hafnium oxide contained in the paraelectric material film.

The ferroelectric material film may have a thickness sized to exhibit ferroelectric properties. For example, the thickness of the ferroelectric material film may be, e.g., in a range of about 0.5 nm to about 10 nm. Because a critical thickness exhibiting the ferroelectric properties may be vary based on a type of the ferroelectric material, the thickness of the ferroelectric material film may vary depending on the type of the ferroelectric material.

In one example, the gate insulating film 130 may include one ferroelectric material film. In another example, the gate insulating film 130 may include a plurality of ferroelectric material films spaced apart from each other. The gate insulating film 130 may have a multilayer structure in which a plurality of ferroelectric material films and a plurality of paraelectric material films are alternately stacked on top of each other.

Each of a plurality of gate capping films 145 may be disposed on an upper surface 120US of each of the plurality of gate electrodes 120 and an upper surface of each of the plurality of gate spacers 140. Each of the plurality of the first gate capping films 145 may include, e.g., at least one of silicon nitride (SiN), silicon oxynitride (SiON), silicon oxide ($SiO_2$), silicon carbonitride (SiCN), silicon oxycarbonitride (SiOCN), or combinations thereof.

In some embodiments, an upper surface 145US of each of the plurality of gate capping films 145 may be coplanar with a fifth surface ASS_a of the active cutting structure ASS (FIG. 2) to be described later. Furthermore, the upper surface 145US of each of the plurality of gate capping films 145 may be coplanar with a third surface GSS_a of the gate cutting structure GSS (FIG. 5) to be described later. The upper surface 145US of each of the plurality of gate capping films 145 may be coplanar with an upper surface of the gate contact 180 (FIG. 2) to be described later, an upper surface of the first source/drain contact 170 to be described later, an upper surface of the second source/drain contact 270 to be described later, and an upper surface of a first interlayer insulating film 190.

The first source/drain pattern 150 may be disposed on the substrate 100. The first source/drain pattern 150 may be formed on the first lower pattern BP1. The first source/drain pattern 150 is connected to the first lower pattern BP1. A bottom surface of the first source/drain pattern 150 is in contact (e.g., direct contact) with the first lower pattern BP1. The first source/drain pattern 150 may be connected to the plurality of first sheet patterns SP1. A sidewall of the first source/drain pattern 150 contacts (e.g., directly contacts) the plurality of first sheet patterns SP1.

The first source/drain pattern 150 may be disposed on a side surface of each of the plurality of gate electrodes 120.

The first source/drain pattern 150 may be disposed between adjacent ones of the plurality of gate electrodes 120.

For example, as illustrated in FIG. 2, the first source/drain pattern 150 may be disposed on each of both opposing sides of each of the plurality of gate electrodes 120. In another example, the first source/drain pattern 150 may be disposed on only one side of each of the plurality of gate electrodes 120 and may not be disposed on the other side of each of the plurality of gate electrodes 120.

The first source/drain pattern 150 may include an epitaxial pattern. The first source/drain pattern 150 may include a semiconductor material. The first source/drain pattern 150 may be included in a source/drain of a transistor using the first sheet pattern SP1 as a channel area.

The first source/drain pattern 150 may be connected to a portion of the first active pattern AP1 used as a channel area. For example, the first source/drain pattern 150 may be connected to the first sheet pattern SP1.

In some embodiments, a sidewall of the first source/drain pattern 150 may have a wavy shape. For example, a portion of the sidewall of the first source/drain pattern 150 facing the first sheet pattern SP1 may be concave, and a portion of the sidewall of the first source/drain pattern 150 facing the gate electrode 120 may be convex. In another example, the portion of the sidewall of the first source/drain pattern 150 facing the first sheet pattern SP1 may be convex, and the portion of the sidewall of the first source/drain pattern 150 facing the gate electrode 120 may be concave.

The second source/drain pattern 250 may be disposed on the substrate 100. The second source/drain pattern 250 may be formed on the second lower pattern BP2. The second source/drain pattern 250 is connected to the second lower pattern BP2. A bottom surface of the second source/drain pattern 250 contacts (e.g., directly contacts) the second lower pattern BP2. The second source/drain pattern 250 may be connected to the plurality of second sheet patterns SP2. A sidewall of the second source/drain pattern 250 contacts (e.g., directly contacts) the plurality of second sheet patterns SP2.

The second source/drain pattern 250 may be disposed on a side surface of each of the plurality of gate electrodes 120. The second source/drain pattern 250 may be disposed between adjacent ones of the plurality of gate electrodes 120.

For example, the second source/drain pattern 250 may be disposed on each of both opposing sides of the plurality of gate electrodes 120. In another example, the second source/drain pattern 250 may be disposed on only one side of each of the plurality of gate electrodes 120 and may not be disposed on the other side of each of the plurality of gate electrodes 120.

The second source/drain pattern 250 may include an epitaxial pattern. The second source/drain pattern 250 may include a semiconductor material. The second source/drain pattern 250 may be included in a source/drain of a transistor using the second active pattern AP2 as a channel area.

The second source/drain pattern 250 may be connected to a portion of the second active pattern AP2*a* used as a channel area. For example, the second source/drain pattern 250 may be connected to the second sheet pattern SP2.

An etch stop film 160 may extend along the upper surface of the field insulating film 105, the sidewalls of the plurality of gate spacers 140, and a profile of the first source/drain pattern 150, and a profile of the second source/drain pattern 250. The etch stop film 160 may be disposed on the upper surface of the first source/drain pattern 150, the sidewall of the first source/drain pattern 150, the upper surface of the second source/drain pattern 250, and the sidewall of the second source/drain pattern 250, and the sidewalls of the plurality of gate spacers 140. In some embodiments, the etch stop film 160 is not disposed on the sidewall of the gate capping film 145. That is, the gate capping film 145 may be disposed on an upper surface of the etch stop film 160. Furthermore, a side wall of the etch stop film 160 may be connected to an outer sidewall of the gate capping film 145. Unlike what is illustrated, the etch stop film 160 may be disposed on the sidewall of the gate capping film 145.

The etch stop film 160 may include a material having an etch selectivity with respect to a material of the first interlayer insulating film 190 to be described later. The etch stop film 160 may include a nitride-based insulating material. For example, the etch stop film 160 may include at least one of silicon nitride (SiN), silicon oxynitride (SiON), silicon oxycarbonitride (SiOCN), silicon boron nitride (SiBN), silicon oxyboronitride (SiOBN), or combinations thereof.

The first interlayer insulating film 190 is disposed on the etch stop film 160. The first interlayer insulating film 190 may be formed on the field insulating film 105. The first interlayer insulating film 190 may be disposed on the first source/drain pattern 150 and the second source/drain pattern 250. The first interlayer insulating film 190 may not cover the upper surface 145US of the gate capping film 145. For example, the upper surface of the first interlayer insulating film 190 may be coplanar with the upper surface 145US of the gate capping film 145.

The first interlayer insulating film 190 may include, e.g., at least one of silicon oxide, silicon nitride, silicon oxynitride, or a low dielectric constant (low-k) material. The low dielectric constant (low-k) material may include, e.g., fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), TOSZ (Tonen SilaZen), FSG (fluoride silicate glass), polyimide nanofoams, e.g., polypropylene oxide, CDO (carbon doped silicon oxide), OSG (organo silicate glass), SiLK, amorphous fluorinated carbon, silica aerogels, silica xerogels, mesoporous silica, or combinations thereof.

The first source/drain contact 170 may be disposed on the first source/drain pattern 150 disposed on the first lower pattern BP1 of the first active pattern AP1. The second source/drain contact 270 may be disposed on the second source/drain pattern 250 disposed on the second lower pattern BP2 of the second active pattern AP2. The first source/drain contact 170 may be connected to the first source/drain pattern 150. The second source/drain contact 270 may be connected to the second source/drain pattern 250.

The gate contact 180 may contact some of the plurality of gate electrodes 120. The gate contact 180 may overlap each of some of the plurality of gate electrodes 120.

The first source/drain contact 170 may extend through the etch stop film 160 so as to be connected to the first source/drain pattern 150. The first source/drain contact 170 may be disposed on the first source/drain pattern 150.

The first source/drain contact 170 may be disposed in the first interlayer insulating film 190. The first source/drain contact 170 may be surrounded with the first interlayer insulating film 190.

A first contact silicide layer 155 may be disposed between the first source/drain contact 170 and the first source/drain pattern 150. For example, the first contact silicide layer 155 may be formed along a profile of an interface between the first source/drain pattern 150 and the first source/drain contact 170. The first contact silicide layer 155 may include, e.g., a metal silicide material.

The first interlayer insulating film 190 may not cover an upper surface of the first source/drain contact 170. For example, the upper surface of the first source/drain contact 170 may not protrude upwardly beyond the upper surface 145US of the gate capping film 145. The upper surface of the first source/drain contact 170 may be coplanar with the upper surface 145US of the gate capping film 145. Unlike what is illustrated, in another example, the upper surface of the first source/drain contact 170 may protrude upwardly beyond the upper surface 145US of the gate capping film 145.

Furthermore, the upper surface of the first source/drain contact 170 may be coplanar with an upper surface of the gate contact 180. The upper surface of the first source/drain contact 170 may be coplanar with an upper surface VCT_a of the via contact VCT. In some embodiments, the first source/drain contact 170 may include a first source/drain barrier film 170BL and a first source/drain filling film 170FL disposed on the first source/drain barrier film 170BL.

A bottom surface of the first source/drain contact 170 is illustrated as having a flat shape. However, the present disclosure is not limited thereto, e.g., the bottom surface of the first source/drain contact 170 may have a wavy shape.

The first source/drain barrier film 170BL may include, e.g., at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), or a two-dimensional (2D) material. In the semiconductor device according to some embodiments, the 2D material may be a metallic material and/or a semiconductor material. The two-dimensional material (2D material) may include a two-dimensional allotrope or a two-dimensional compound. For example, the two-dimensional material (2D material) may include at least one of graphene, molybdenum disulfide ($MoS_2$), molybdenum diselenide ($MoSe_2$), tungsten diselenide ($WSe_2$), or tungsten disulfide ($WS_2$).

The first source/drain filling film 170FL may include, e.g., at least one of aluminum (Al), tungsten (W), cobalt (Co), ruthenium (Ru), silver (Ag), gold (Au), manganese (Mn) or molybdenum (Mo).

The first source/drain contact 170 is illustrated as including a plurality of conductive films. However, the present disclosure is not limited thereto, e.g., the first source/drain contact 170 may be embodied as a single film.

The second source/drain contact 270 may extend through the etch stop film 160 so as to be connected to the second source/drain pattern 250. The second source/drain contact 270 may be disposed on the second source/drain pattern 250. The second source/drain contact 270 may be disposed in the first interlayer insulating film 190. The second source/drain contact 270 may be surrounded with the first interlayer insulating film 190.

The second contact silicide layer 255 may be disposed between the second source/drain contact 270 and the second source/drain pattern 250. For example, the second contact silicide layer 255 may be formed along a profile of an interface between the second source/drain pattern 250 and the second source/drain contact 270. The second contact silicide layer 255 may include, e.g., a metal silicide material.

The first interlayer insulating film 190 may not cover an upper surface of the second source/drain contact 270. For example, the upper surface of the second source/drain contact 270 may not protrude upwardly beyond the upper surface 145US of the gate capping film 145. For example, the upper surface of the second source/drain contact 270 may be coplanar with the upper surface 145US of the gate capping film 145. In another example, the upper surface of the second source/drain contact 270 may protrude upwardly beyond the upper surface 145US of the gate capping film 145.

Furthermore, an upper surface of the second source/drain contact 270 may be coplanar with the upper surface of the gate contact 180. The upper surface of the second source/drain contact 270 may be coplanar with the upper surface VCT_a of the via contact VCT.

In some embodiments, the second source/drain contact 270 may include a second source/drain barrier film 270BL and a second source/drain filling film 270FL disposed on the second source/drain barrier film 270BL.

A bottom surface of the second source/drain contact 270 is illustrated as having a flat shape. However, the present disclosure is not limited thereto, e.g., the bottom surface of the second source/drain contact 270 may have a wavy shape.

A material included in the second source/drain barrier film 270BL may be the same as the material included in the first source/drain barrier film 170BL. The material included in the second source/drain filling film 270FL may be the same as the material included in the first source/drain filling film 170FL.

The second source/drain contact 270 is illustrated as including a plurality of conductive films. However, the present disclosure is not limited thereto, e.g., the second source/drain contact 270 may be embodied as a single film.

The gate contact 180 may be disposed on the gate electrode 120. The gate contact 180 may extend through the gate capping film 145 so as to be connected to the gate electrode 120.

For example, the upper surface of the gate contact 180 may be coplanar with the upper surface 145US of the gate capping film 145. In another example, the upper surface of the gate contact 180 may protrude upwardly beyond the upper surface 145US of the gate capping film 145.

The gate contact 180 may include a gate barrier film 180BL and a gate filling film 180FL disposed on the gate barrier film 180BL. A material included in the gate barrier film 180BL and a material included in the gate filling film 180FL may be respectively the same as the material included in the first source/drain barrier film 170BL, and the material included in the first source/drain filling film 170FL.

The gate contact 180 is illustrated as including a plurality of conductive films. However, the present disclosure is not limited thereto, e.g., the gate contact 180 may be embodied as a single film.

The gate cutting structure GSS may be interposed between the first active pattern AP1 and the second active pattern AP2. The gate cutting structure GSS may cut, e.g., extend through an entire thickness of, at least some of the gate electrodes 120. For example, in a plan view, the gate cutting structure GSS may have an island shape (e.g., to cut a single gate electrode 120) or a line shape (e.g., to cut at least two or more gate electrodes 120).

The gate cutting structure GSS may extend through the gate capping film 145, the gate electrode 120, the field insulating film 105, and the substrate 100 in the first direction D1. The gate cutting structure GSS may include the third surface GSS_a and a fourth surface GSS_b opposite to each other in the first direction D1.

The third surface GSS_a of the gate cutting structure GSS may be coplanar with the upper surface 145US of the gate capping film 145. Based on the first surface 100*a* of the substrate 100, the third surface GSS_a of the gate cutting structure GSS may be positioned at a vertical level higher than a vertical level of the upper surface 120US of the gate electrode 120. The third surface GSS_a of the gate cutting structure GSS may be coplanar with the upper surface of the gate contact 180, the upper surface of the first source/drain contact 170, the upper surface of the second source/drain contact 270, and the upper surface of the first interlayer insulating film 190. Furthermore, the third surface GSS_a of the gate cutting structure GSS may be coplanar with the fifth surface ASS_a of the active cutting structure ASS to be described later. The third surface GSS_a of the gate cutting structure GSS may be coplanar with the upper surface VCT_a of the via contact VCT as described later.

The fourth surface GSS_b of the gate cutting structure GSS may be coplanar with the second surface 100*b* of the substrate 100. Furthermore, the fourth surface GSS_b of the gate cutting structure GSS may be coplanar with a sixth surface ASS_b of the active cutting structure ASS to be described later. The fourth surface GSS_b of the gate cutting structure GSS may be coplanar with the lower surface VCT_b of the via contact VCT.

In some embodiments, the gate cutting structure GSS may include a material having an etch selectivity with respect to the material of the substrate 100. The gate cutting structure GSS may be used as an etch stop film in a formation process of the substrate 100.

The gate cutting structure GSS may include an insulating material. For example, the gate cutting structure GSS may include silicon nitride (SiN), silicon oxide ($SiO_2$), silicon oxynitride (SiON), silicon oxycarbonitride (SiOCN), or combinations thereof. For example, the gate cutting structure GSS may be embodied as a single film.

The active cutting structure ASS may extend in parallel with the gate electrodes 120. The active cutting structure ASS may entirely overlap each of some of the gate electrodes 120, and may cut each of some of the gate electrodes 120. Furthermore, the active cutting structure ASS may cut, e.g., extend through an entire thickness of, the first active pattern AP1 and the second active pattern AP2. The active cutting structure ASS may extend in an elongated manner (e.g., lengthwise) in the third direction D3. The active cutting structure ASS may be spaced apart from the gate electrodes 120 in the second direction D2.

The active cutting structure ASS may extend through the first lower pattern BP1 and the plurality of first sheet patterns SP1 in the first direction D1. Although not shown, the active cutting structure ASS may extend, e.g., continuously, through the second lower pattern BP2 and the plurality of second sheet patterns SP2 in the first direction D1. Furthermore, the active cutting structure ASS may extend, e.g., continuously, through the field insulating film 105 and the substrate 100. The active cutting structure ASS may be interposed between adjacent first source/drain patterns 150. Although not shown, the active cutting structure ASS may be interposed between adjacent second source/drain patterns 250.

The active cutting structure ASS may include the fifth surface ASS_a and the sixth surface ASS_b opposite to each other in the first direction D1. The fifth surface ASS_a of the active cutting structure ASS may be coplanar with the upper surface 145US of the gate capping film 145. Based on the first surface 100*a* of the substrate 100, the fifth surface ASS_a of the active cutting structure ASS may be positioned at a vertical level higher than a vertical level of the upper surface 120US of the gate electrode 120. Furthermore, the fifth surface ASS_a of the active cutting structure ASS may be coplanar with the upper surface of the gate contact 180, the upper surface of the first source/drain contact 170, the upper surface of the second source/drain contact 270, and the upper surface of the first interlayer insulating film 190. The fifth surface ASS_a of the active cutting structure ASS may be coplanar with the upper surface VCT_a of the via contact VCT described later, and may be coplanar with the third surface GSS_a of the gate cutting structure GSS.

The sixth surface ASS_b of the active cutting structure ASS may be coplanar with the second surface 100*b* of the substrate 100. Furthermore, the sixth surface ASS_b of the active cutting structure ASS may be coplanar with the fourth surface GSS_b of the gate cutting structure GSS. The sixth surface ASS_b of the active cutting structure ASS may be coplanar with the lower surface VCT_b of the via contact VCT.

In some embodiments, the active cutting structure ASS may include a material having an etch selectivity with respect to a material of the substrate 100. The active cutting structure ASS may be used as an etch stop film during the formation of the substrate 100.

The active cutting structure ASS may include an insulating material. For example, the active cutting structure ASS may include silicon nitride (SiN), silicon oxide ($SiO_2$), silicon oxynitride (SiON), silicon oxycarbonitride (SiOCN), or combinations thereof. In one embodiment, the active cutting structure ASS may be embodied as a single film.

In some embodiments, the gate cutting structure GSS and the active cutting structure ASS may be formed in the same process. Therefore, a stack structure of the gate cutting structure GSS and a stack structure of the active cutting structure ASS may be the same as each other. For example, when the gate cutting structure GSS is embodied as a single film, the active cutting structure ASS may be embodied as a single film. In another example, when the gate cutting structure GSS is composed of multiple films, the active cutting structure ASS may be composed of multiple films.

The semiconductor device according to some embodiments may further include a lower insulating film 102. The lower insulating film 102 may be disposed on the second surface 100*b* of the substrate 100. The lower insulating film 102 may contact the second surface 100*b* of the substrate 100.

The lower insulating film 102 may include, e.g., at least one of silicon oxide, silicon nitride, silicon oxynitride, or a low dielectric constant (low-k) material. The low dielectric constant (low-k) material may include, e.g., fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), TOSZ (Tonen SilaZen), FSG (fluoride silicate glass), polyimide nanofoams, e.g., polypropylene oxide, CDO (carbon doped silicon oxide), OSG (organo silicate glass), SiLK, amorphous fluorinated carbon, silica aerogels, silica xerogels, mesoporous silica, or combinations thereof.

The power rail PR may be disposed between the first active pattern AP1 and the second active pattern AP2. The power rail PR may be disposed in the lower insulating film 102. The lower insulating film 102 may surround the power rail PR. The power rail PR may extend in an elongate manner (e.g., lengthwise) in the second direction D2.

The power rail PR is disposed on the second surface 100*b* of the substrate 100. The power rail PR is disposed in the lower insulating film 102. The power rail PR may contact (e.g., directly contact) the lower surface VCT_b of the via contact VCT. The power rail PR may contact (e.g., directly contact) the lower surface VCT_b of the second portion VCT_2 of the via contact VCT. The power rail PR may be electrically connected to the via contact VCT.

In some embodiments, the power rail PR may be connected to the first source/drain pattern 150. For example, the power rail PR may be connected to the first source/drain pattern 150 via the via contact VCT, a first via plug 195, and the first source/drain contact 170. A voltage may be applied to the first source/drain pattern 150 via the power rail PR.

In some embodiments, the power rail PR may include a power rail barrier film PR_BL and a power rail filling film PR_FL disposed on the power rail barrier film PR_BL. A material included in the power rail barrier film PR_BL and a material included in the power rail filling film PR_FL may be respectively the same as the material included in the first source/drain barrier film 170BL and the material included in the first source/drain filling film 170FL. The power rail PR is illustrated as including a plurality of conductive films. However, the present disclosure is not limited thereto, e.g., the power rail PR may be embodied as a single film.

The via contact VCT may be disposed on the power rail PR. The via contact VCT may extend, e.g., continuously, through the first interlayer insulating film 190, the etch stop film 160, the field insulating film 105, and the substrate 100 so as to contact the power rail PR. The lower surface VCT_b of the via contact VCT may contact an upper surface of the power rail PR.

The first interlayer insulating film 190 may not cover the upper surface VCT_a of the via contact VCT. For example, the upper surface VCT_a of the via contact VCT may be coplanar with the upper surface of the first interlayer insulating film 190. Furthermore, the upper surface VCT_a of the via contact VCT may be coplanar with the upper surface of the first source/drain contact 170 and the upper surface of the second source/drain contact 270. Furthermore, the upper surface VCT_a of the via contact VCT may be coplanar with the upper surface of the gate contact 180 and the upper surface 145US of the gate capping film 145. Furthermore, the upper surface VCT_a of the via contact VCT may be coplanar with the third surface GSS_a of the gate cutting structure GSS and the fifth surface ASS_a of the active cutting structure ASS.

The lower surface VCT_b of the via contact VCT may be opposite to the upper surface VCT_a of the via contact VCT in the first direction D1. The lower surface VCT_b of the via contact VCT may be coplanar with the fourth surface GSS_b of the gate cutting structure GSS, the sixth surface ASS_b of the active cutting structure ASS, and the second surface 100*b* of the substrate 100.

In some embodiments, the via contact VCT may include a first portion VCT_1 and a second portion VCT_2. The first portion VCT_1 of the via contact VCT may be disposed on the first surface 100*a* of the substrate 100. The second portion VCT_2 of the via contact VCT may be disposed in (e.g., inside or within) the substrate 100. The first portion VCT_1 of the via contact VCT may be disposed on top of (e.g., directly on) the second portion VCT_2 of the via contact VCT.

The first portion VCT_1 of the via contact VCT may extend through the first interlayer insulating film 190, the etch stop film 160, and the field insulating film 105. An upper surface of the first portion VCT_1 of the via contact VCT may be the upper surface VCT_a of the via contact VCT.

The second portion VCT_2 of the via contact VCT may extend through the substrate 100. An upper surface of the second portion VCT_2 of the via contact VCT may be coplanar with the first surface 100*a* of the substrate 100. A lower surface of the second portion VCT_2 of the via contact VCT may be the lower surface VCT_b of the via contact VCT.

In some embodiments, a lower end of the via contact VCT may be connected to the power rail PR, and an upper end thereof may be connected to the first source/drain pattern 150. The lower end of the via contact VCT may directly contact the power rail PR. The upper end of the via contact VCT may not directly contact the first source/drain pattern 150. The upper end of the via contact VCT may be connected to the first source/drain pattern 150 via the first source/drain contact 170 and the first via plug 195.

In some embodiments, a width of the first portion VCT_1 of the via contact VCT may gradually increase as the first portion VCT_1 extends away from the first surface 100*a* of the substrate 100. That is, the first portion VCT_1 of the via contact VCT has a maximum width at the upper surface VCT_a of the via contact VCT. A width of the second portion VCT_2 of the via contact VCT may gradually increase as the second portion VCT_2 of the via contact VCT extends away from the first surface 100*a* of the substrate 100. That is, the second portion VCT_2 of the via contact VCT has a maximum width at the lower surface VCT_b of the via contact VCT.

In other words, the via contact VCT has a minimum width at a boundary point (i.e., interface) between the first portion VCT_1 and the second portion VCT_2 of the via contact VCT. Furthermore, the width of the via contact VCT may gradually decrease and then increase as the via contact VCT extends away from the second surface 100*b* of the substrate 100.

The via contact VCT may include a conductive material. For example, the via contact VCT may include at least one of aluminum (Al), tungsten (W), cobalt (Co), ruthenium (Ru), silver (Ag), gold (Au), manganese (Mn), copper (Cu), or molybdenum (Mo).

An upper stop film 191 may be disposed on the first interlayer insulating film 190, the gate capping film 145, the first source/drain contact 170, the second source/drain contact 270, the via contact VCT, and the gate contact 180. A second interlayer insulating film 192 may be disposed on the upper stop film 191.

The upper stop film 191 may include a material having an etch selectivity with respect to a material of the second interlayer insulating film 192. The upper stop film 191 may include, e.g., at least one of silicon nitride (SiN), silicon oxynitride (SiON), silicon oxycarbonitride (SiOCN), silicon boron nitride (SiBN), silicon oxyboronitride (SiOBN), silicon oxycarbide (SiOC), aluminum oxide (AlO), aluminum nitride (AlN), aluminum oxycarbide (AlOC), or combinations thereof. The upper stop film 191 is illustrated as a single film, but may be omitted. The second interlayer insulating film 192 may include, e.g., at least one of silicon oxide, silicon nitride, silicon carbonitride, silicon oxynitride, or a low dielectric constant material.

The first via plug 195 may be disposed in the second interlayer insulating film 192. The first via plug 195 may extend through the upper stop film 191 so as to contact the first source/drain contact 170 and the via contact VCT.

A portion of the first via plug 195 may cover an entirety of each of the upper surface of the first source/drain contact 170 and the upper surface VCT_a of the via contact VCT. That is, the first source/drain contact 170 and the via contact VCT may be connected to one (e.g., a single and same) first via plug 195.

The first via plug 195 may include a first via barrier film 195BL and a first via filling film 195FL. The first via barrier film 195BL may extend along a sidewall and a bottom surface of the first via filling film 195FL. The first via barrier film 195BL may include, e.g., at least one of tantalum (Ta), tantalum nitride (TaN), titanium (Ti), titanium nitride (TiN), titanium silicon nitride (TiSiN), nickel (Ni), nickel boron (NiB), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), or a two-dimensional material (2D material). The first via filling film 195FL may include, e.g., at least one of aluminum (Al), tungsten (W), cobalt (Co), ruthenium (Ru), copper (Cu), silver (Ag), gold (Au), manganese (Mn) or molybdenum (Mo).

A second via plug 295 may be disposed in the second interlayer insulating film 192. The second via plug 295 may extend through the upper stop film 191 so as to be connected to the second source/drain contact 270. A portion of the second via plug 295 may cover an entirety of an upper surface of the second source/drain contact 270.

The second via plug 295 may include a second via barrier film 295BL and a second via filling film 295FL. The second via barrier film 295BL may extend along a sidewall and a bottom surface of the second via filling film 295FL. A material included in the second via barrier film 295BL may be the same as the material included in the first via barrier film 195BL. A material included in the second via filling film 295FL may be the same as the material included in the first via filling film 195FL.

Hereinafter, a semiconductor device according to some further embodiments will be described with reference to FIG. 6A to FIG. 18. For the convenience of description, differences thereof from the descriptions set forth above with reference to FIG. 1 to FIG. 5 will be set forth below.

Figure 6A:
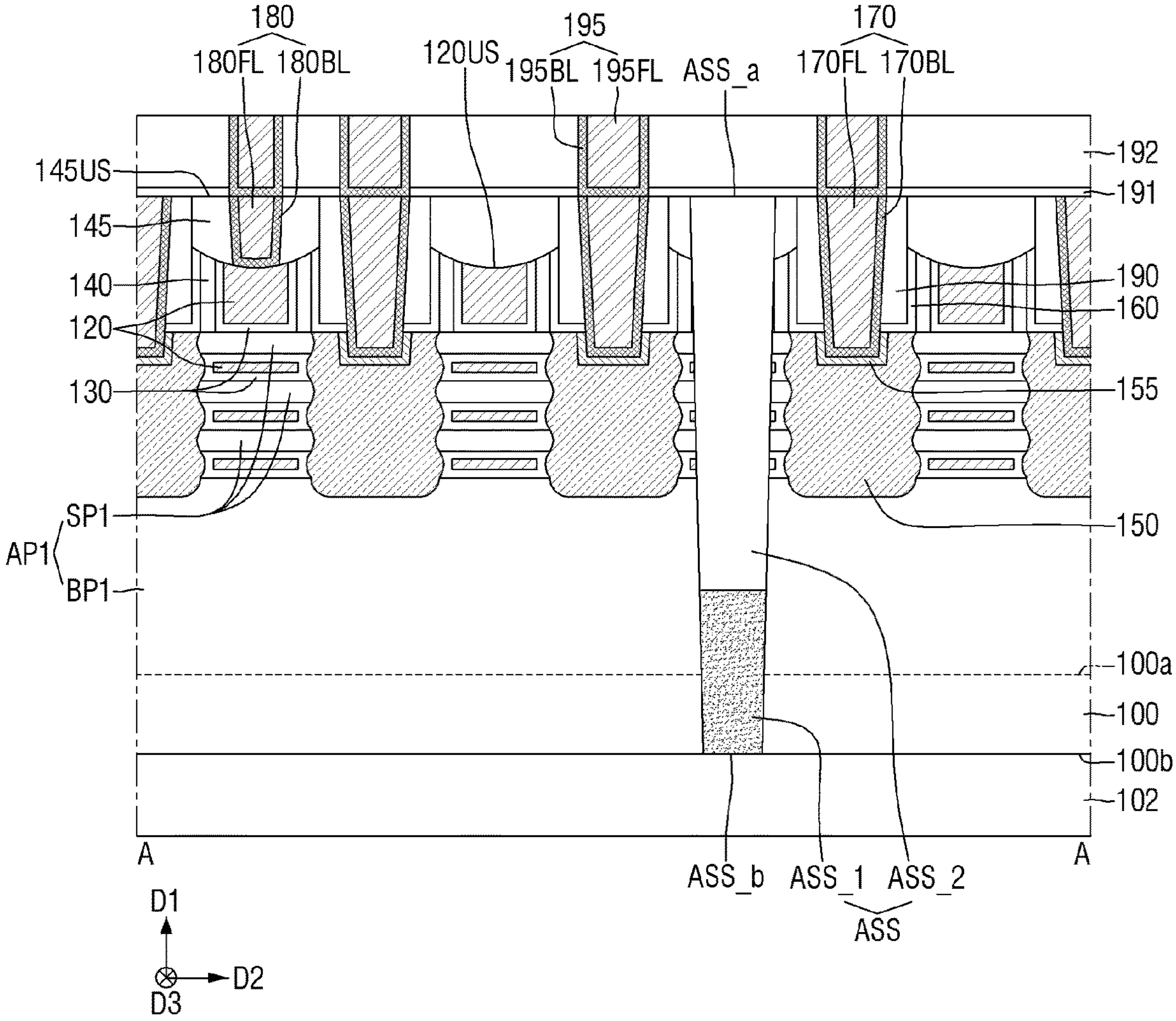
FIG. 6A to FIG. 6C are diagrams of a semiconductor device according to some further embodiments.
Figure 6B:
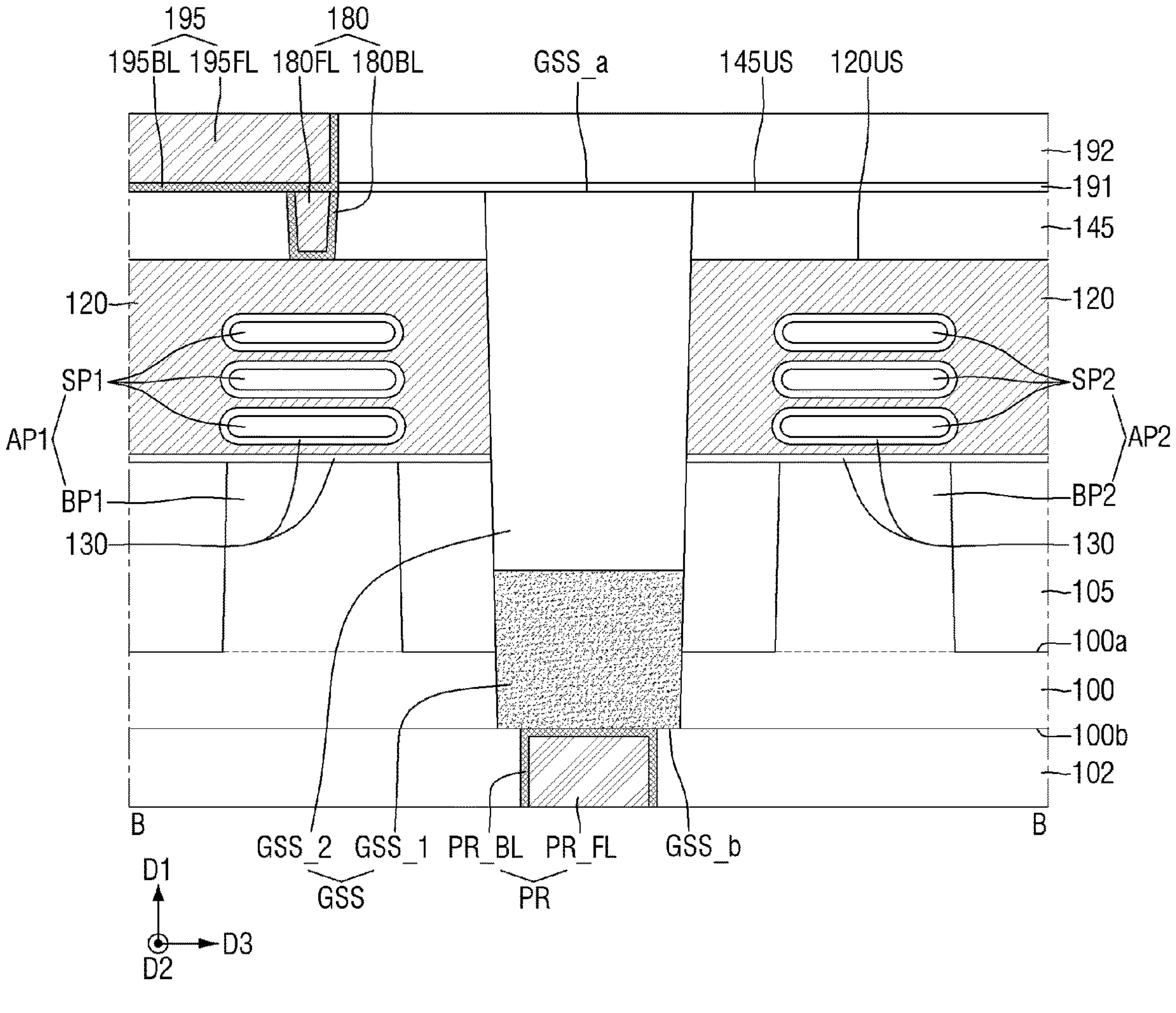
Figure 6C:
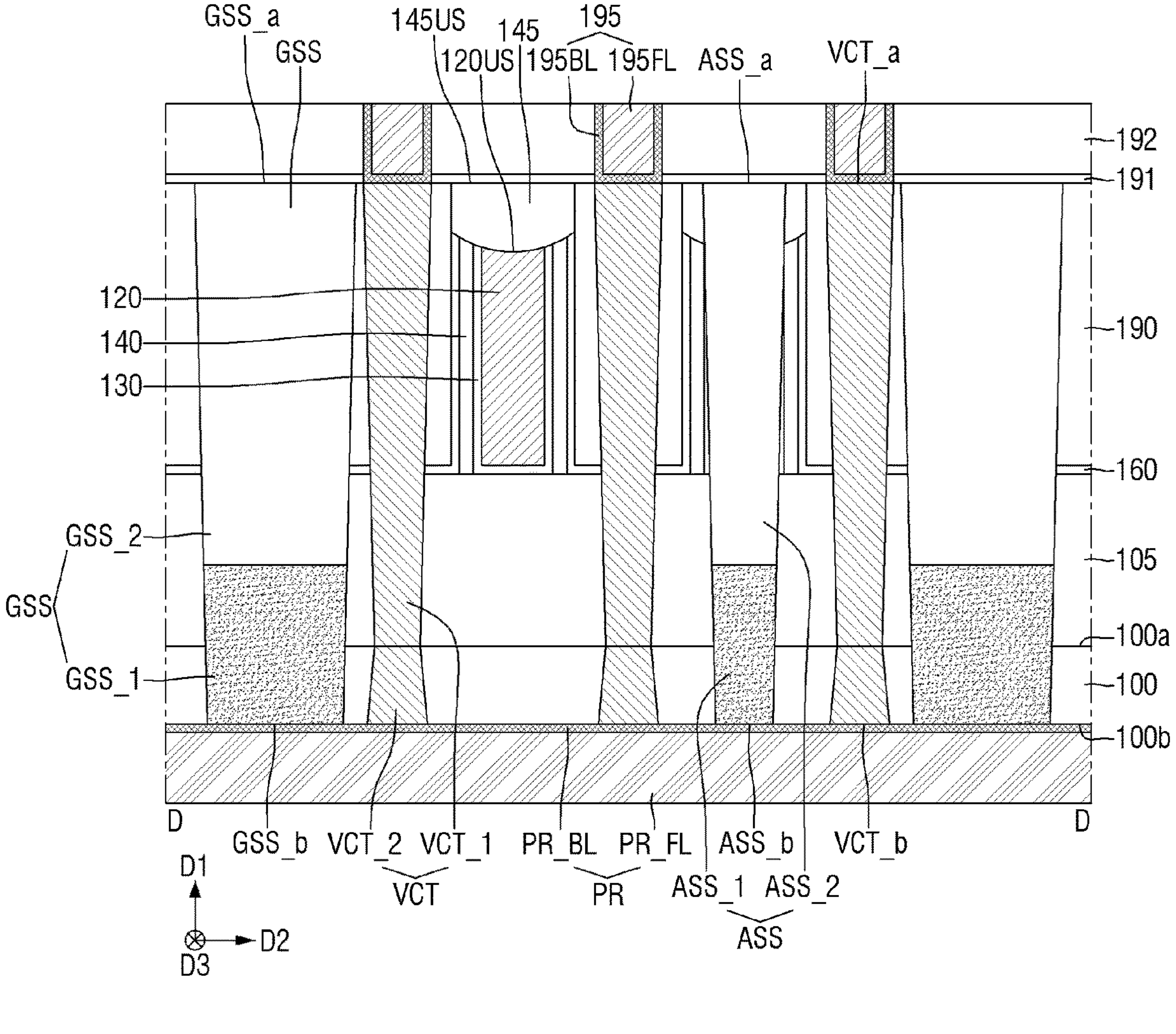

FIG. 6A to FIG. 6C are diagrams for illustrating a semiconductor device according to some further embodiments. For reference, FIG. 6A corresponds to a cross-sectional view along line A-A in FIG. 1. FIG. 6B corresponds to a cross-sectional view along line B-B in FIG. 1. FIG. 6C corresponds to a cross-sectional view along line D-D of FIG. 1.

Referring to FIG. 6A to FIG. 6C, each of the gate cutting structure GSS and the active cutting structure ASS may be composed of multiple films.

For example, in FIG. 6B and FIG. 6C, the gate cutting structure GSS may include a first gate sub-film GSS_1 and a second gate sub-film GSS_2. The second gate sub-film GSS_2 may be disposed on the first gate sub-film GSS_1. The first gate sub-film GSS_1 may have a solid columnar shape.

For example, an interface between the first gate sub-film GSS_1 and the second gate sub-film GSS_2 may be flat. Based on the second surface 100*b* of the substrate 100, an interface between the first gate sub-film GSS_1 and the second gate sub-film GSS_2 may be positioned at a vertical level lower than a vertical level of an upper surface of the first lower pattern BP1. Based on the second surface 100*b* of the substrate 100, the interface between the first gate sub-film GSS_1 and the second gate sub-film GSS_2 may be positioned at a vertical level higher than a vertical level of the first surface 100*a* of the substrate 100. However, the technical idea of the present disclosure is not limited thereto. In another example, based on the second surface 100*b* of the substrate 100, the interface between the first gate sub-film GSS_1 and the second gate sub-film GSS_2 may be disposed at a higher level than that of each of the upper surface of the field insulating film 105 and the upper surface of the first lower pattern BP1 or may be positioned at a vertical level lower than a vertical level of the first surface 100*a* of the substrate 100.

In FIG. 6A and FIG. 6C, the active cutting structure ASS may include a first active sub-film ASS_1 and a second active sub-film ASS_2. The second active sub-film ASS_2 may be disposed on the first active sub-film ASS_1. The first active sub-film ASS_1 may have a solid column shape.

In some embodiments, an interface between the first active sub-film ASS_1 and the second active sub-film ASS_2 may be flat. Based on the second surface 100*b* of the substrate 100, the interface between the first active sub-film ASS_1 and the second active sub-film ASS_2 may be positioned at a lower level than that of the upper surface of the first lower pattern BP1. Based on the second surface 100*b* of the substrate 100, the interface between the first active sub-film ASS_1 and the second active sub-film ASS_2 may be positioned at a vertical level higher than a vertical level of the first surface 100*a* of the substrate 100. However, the technical idea of the present disclosure is not limited thereto. In another example, based on the second surface 100*b* of the substrate 100, the interface between the first active sub-film ASS_1 and the second active sub-film ASS_2 may be positioned at a higher level than that of each of the upper surface of field insulating film 105 and the upper surface of the first lower pattern BP1 or may be positioned at a vertical level lower than a vertical level of the first surface 100*a* of the substrate 100.

In some embodiments, the first gate sub-film GSS_1 and the first active sub-film ASS_1 may be formed in the same process. Accordingly, the interface between the first gate sub-film GSS_1 and the second gate sub-film GSS_2 may be positioned at the same vertical level as that of the interface between the first active sub-film ASS_1 and the second active sub-film ASS_2. Furthermore, a height of the first gate sub-film GSS_1 in the first direction D1 may be the same as a height of the first active sub-film ASS_1 in the first direction D1.

In some embodiments, each of the first gate sub-film GSS_1 and the first active sub-film ASS_1 may be used as an etch stop film. Each of the first gate sub-film GSS_1 and the first active sub-film ASS_1 may be made of a material having an etching selectivity with respect to the material of the substrate 100.

For example, in a process of forming the gate cutting structure GSS, the substrate 100 and the first gate sub-film GSS_1 may be removed via a chemical mechanical polishing (CMP) process. When the first gate sub-film GSS_1 is exposed while the CMP process is carried out, the CMP process may be stopped. Similarly, in a process of forming the active cutting structure ASS, the substrate 100 and the first active sub-film ASS_1 may be removed via the CMP process. When the first active sub-film ASS_1 is exposed while the CMP process is carried out, the CMP process may be stopped.

The first gate sub-film GSS_1 and the second gate sub-film GSS_2 may be made of different materials. The first active sub-film ASS_1 and the second active sub-film ASS_2 may made of different materials. The first gate sub-film GSS_1 and the first active sub-film ASS_1 may include the same material as each other. The second gate sub-film GSS_2 and the second active sub-film ASS_2 may include the same material as each other.

For example, each of the first gate sub-film GSS_1 and the first active sub-film ASS_1 may include a nitride-based insulating material. Each of the second gate sub-film GSS_2 and the second active sub-film ASS_2 may include an oxide-based insulating material. In another example, each of the first gate sub-film GSS_1 and the first active sub-film ASS_1 may include an oxide-based insulating material, while each of the second gate sub-film GSS_2 and the second active sub-film ASS_2 may include a nitride-based insulating material.

Figure 7A:
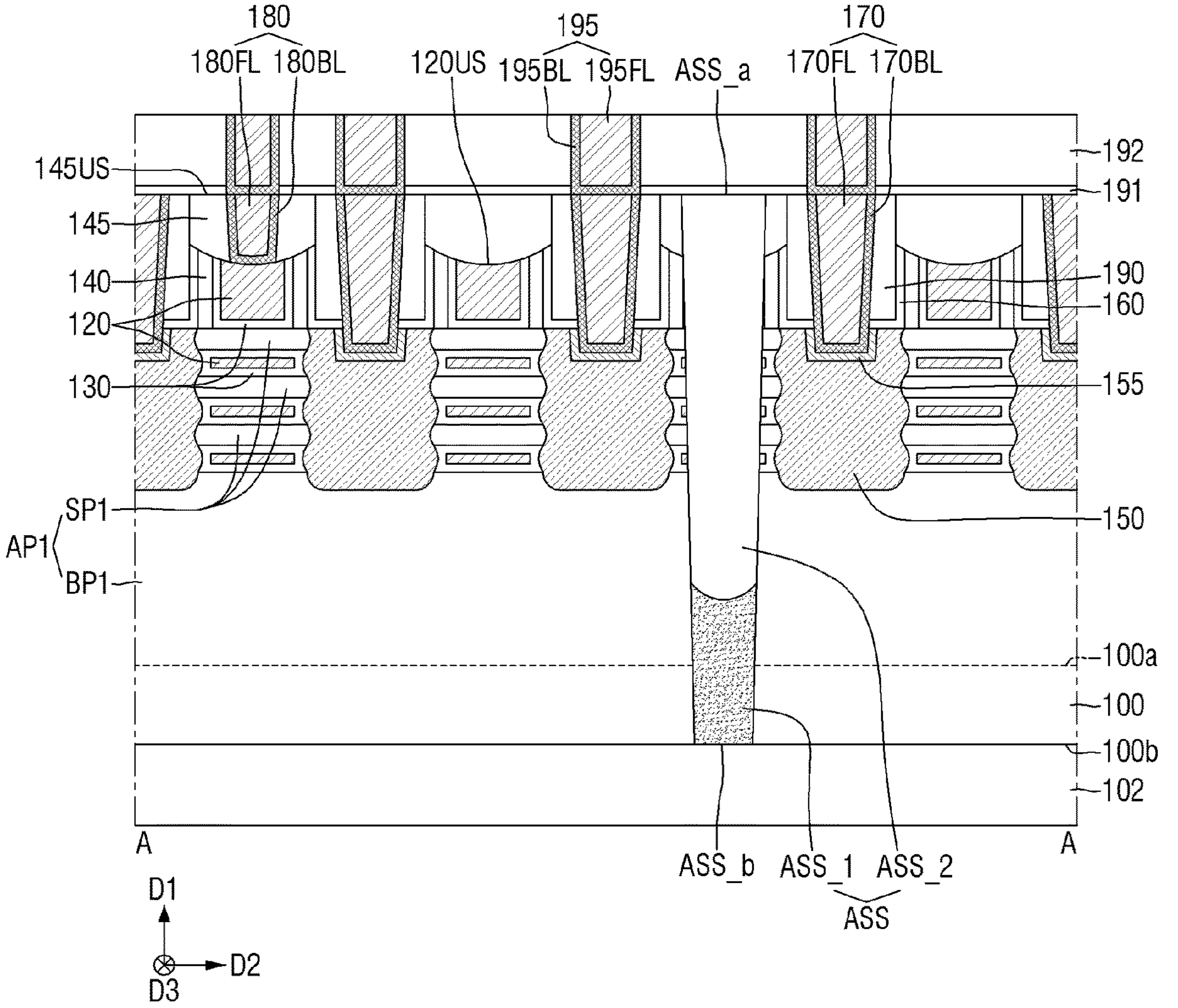
FIG. 7A to FIG. 7C are diagrams of a semiconductor device according to some still further embodiments.
Figure 7B:
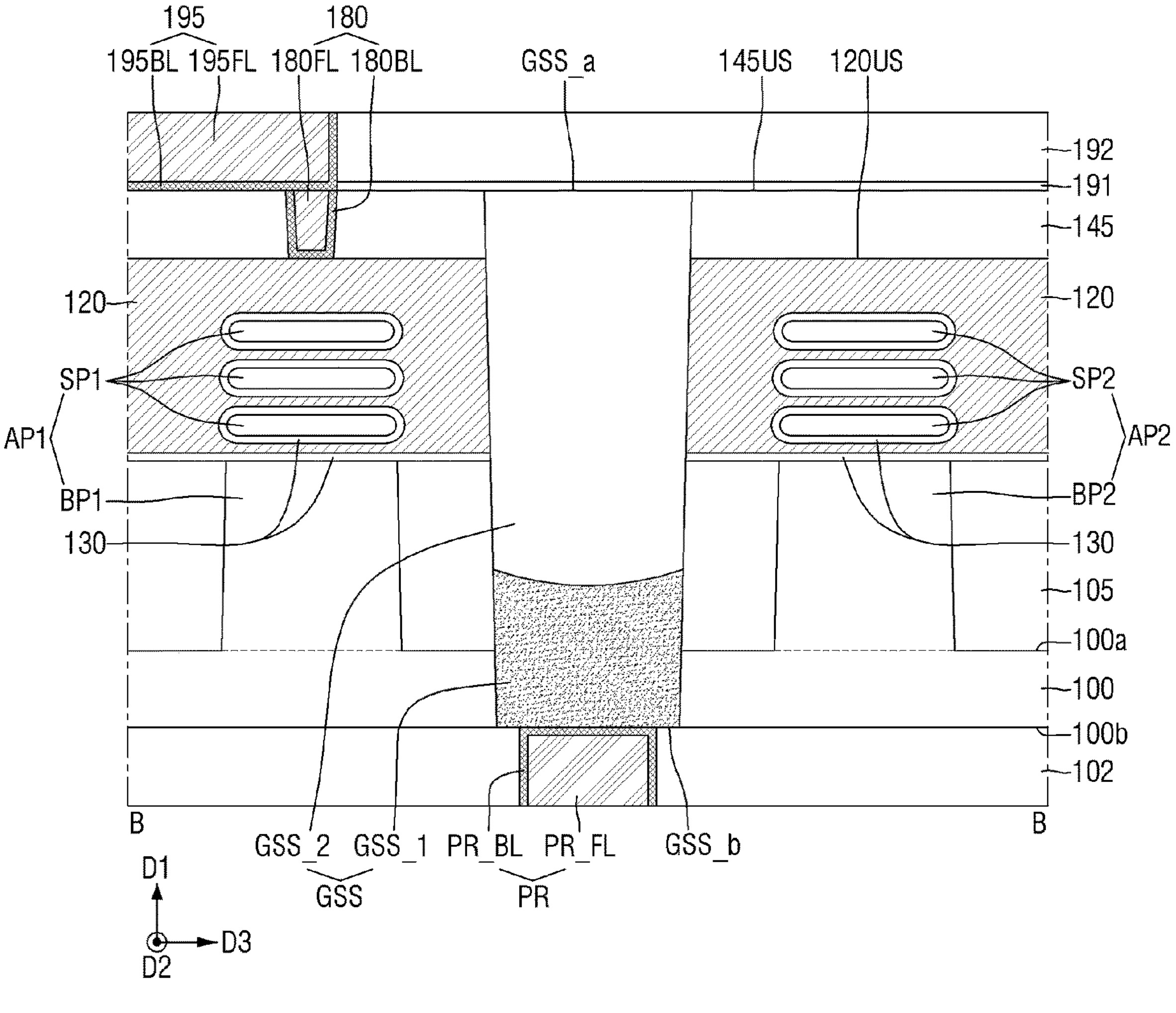
Figure 7C:
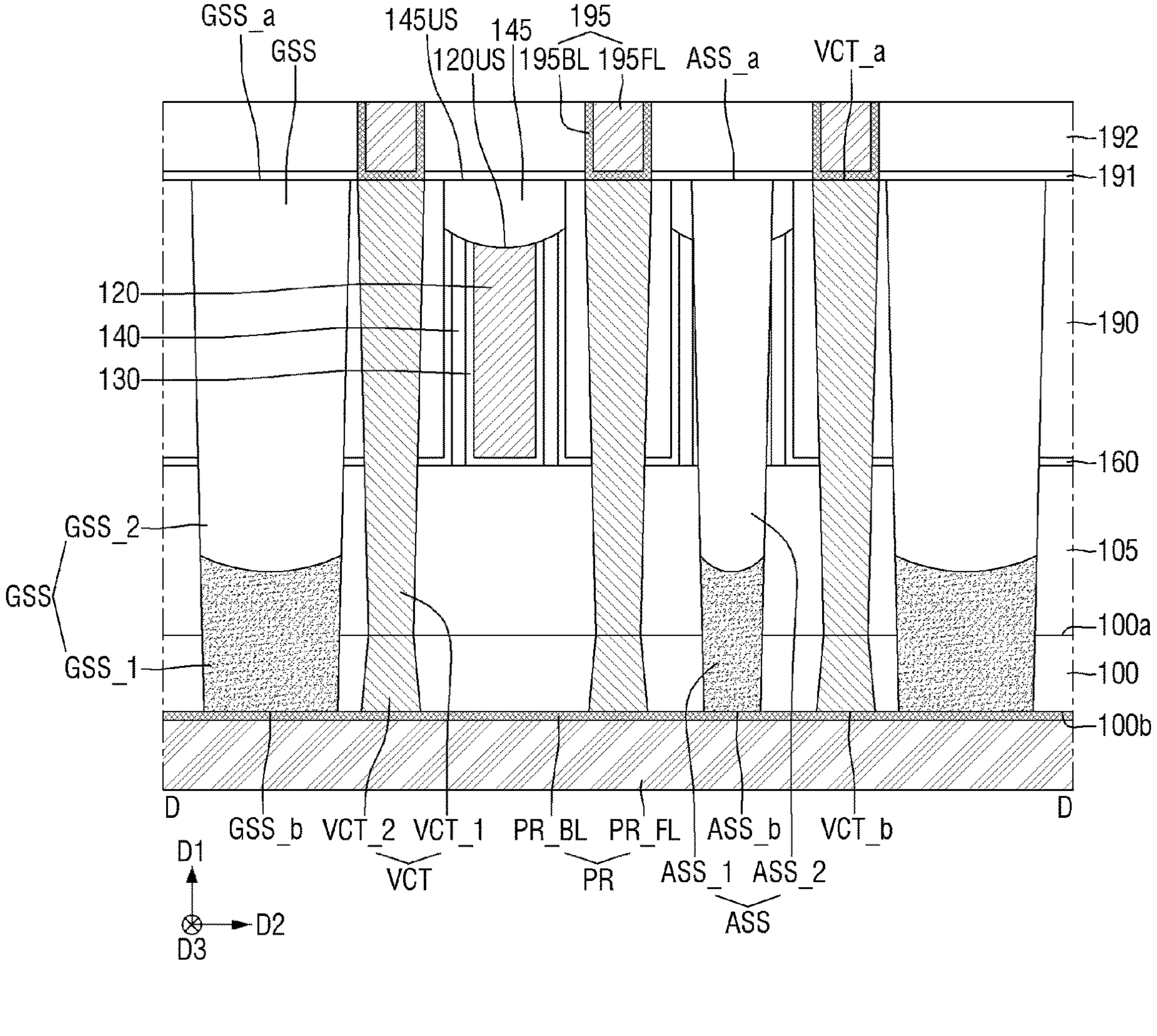

FIG. 7A to FIG. 7C are diagrams for illustrating a semiconductor device according to some still further embodiments. For reference, FIG. 7A corresponds to a cross-sectional view along line A-A in FIG. 1. FIG. 7B corresponds to a cross-sectional view along line B-B in FIG. 1. FIG. 7C corresponds to a cross-sectional view along line D-D of FIG. 1. For the convenience of description, descriptions duplicate with those as set forth above with reference to FIG. 6A to FIG. 6C are omitted.

Referring to FIG. 7A to FIG. 7C, each of the gate cutting structure GSS and the active cutting structure ASS may be composed of multiple films. The gate cutting structure GSS may include the first gate sub-film GSS_1 and the second gate sub-film GSS_2. The active cutting structure ASS may include the first active sub-film ASS_1 and the second active sub-film ASS_2.

An interface between the first gate sub-film GSS_1 and the second gate sub-film GSS_2 may be a curved surface. The interface between the first gate sub-film GSS_1 and the second gate sub-film GSS_2 may be convex toward the first surface 100*a* of the substrate 100. An interface between the first active sub-film ASS_1 and the second active sub-film ASS_2 may be a curved surface. The interface between the first active sub-film ASS_1 and the second active sub-film ASS_2 may be convex toward the first surface 100*a*.

In some embodiments, an angle defined between the sidewall of the gate cutting structure GSS and the interface between the first gate sub-film GSS_1 and the second gate sub-film GSS_2 at a point where the sidewall of the gate cutting structure GSS and the interface between the first gate sub-film GSS_1 and the second gate sub-film GSS_2 meet each other may be smaller than an angle defined between the sidewall of the active cutting structure ASS and the interface between the first active sub-film ASS_1 and the second active sub-film the interface of ASS_2 at a point where the sidewall of the active cutting structure ASS and the interface between the first active sub-film ASS_1 and the second active sub-film ASS_2 meet each other. This may be because a width of the gate cutting structure GSS is smaller than a width of the active cutting structure ASS.

Figure 8A:
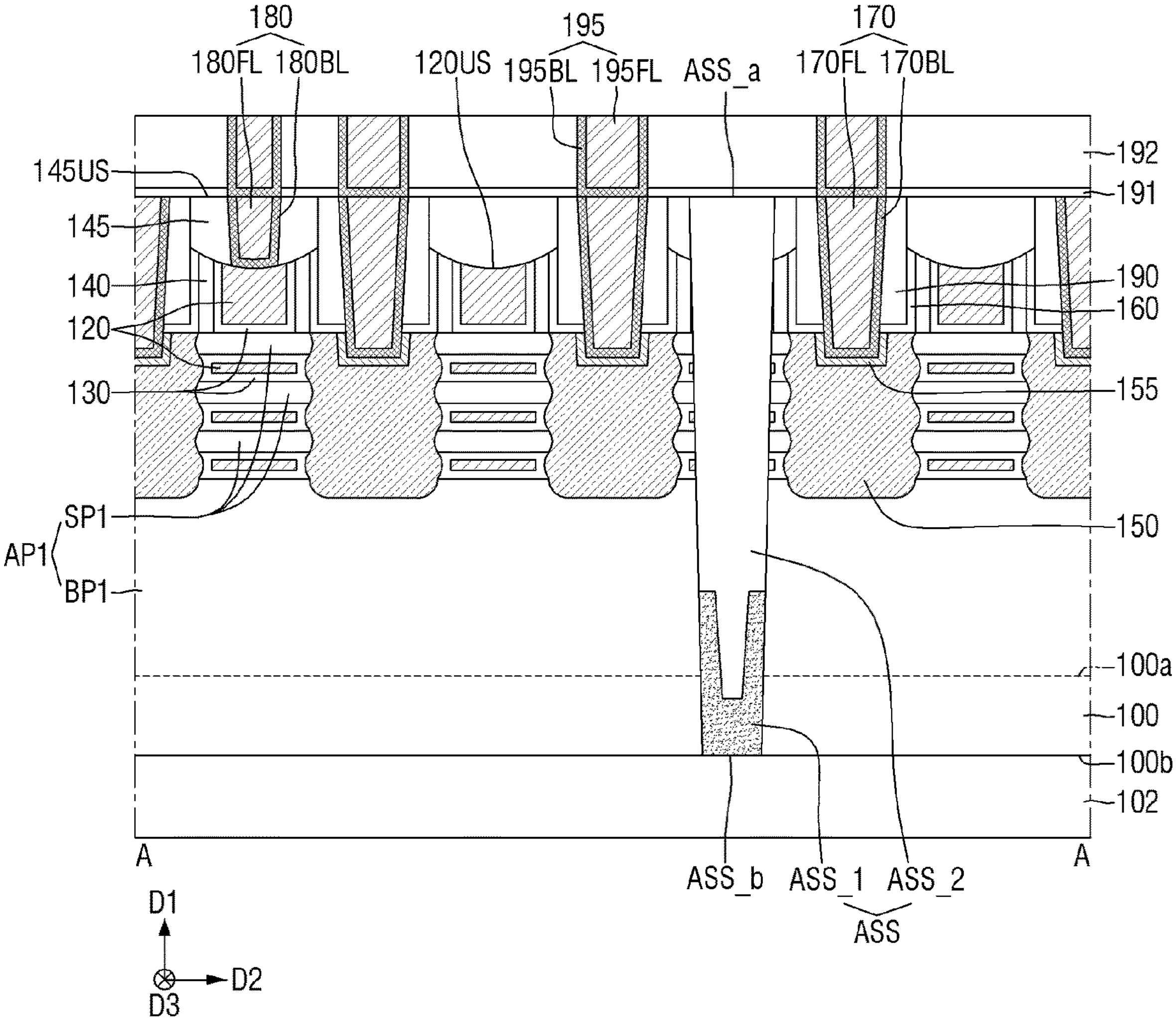
FIG. 8A to FIG. 8C are diagrams of a semiconductor device according to some still yet further embodiments.
Figure 8B:
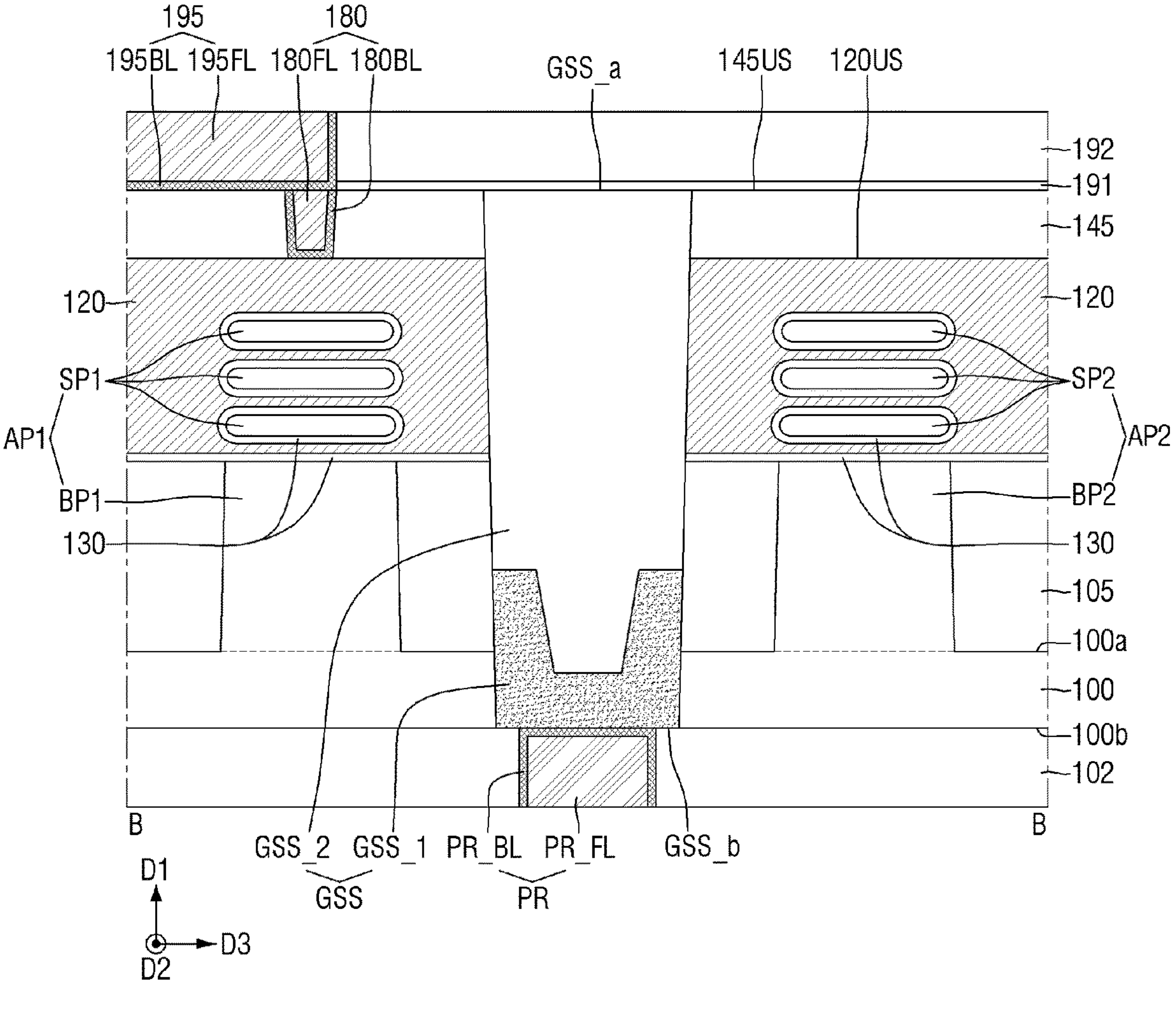
Figure 8C:
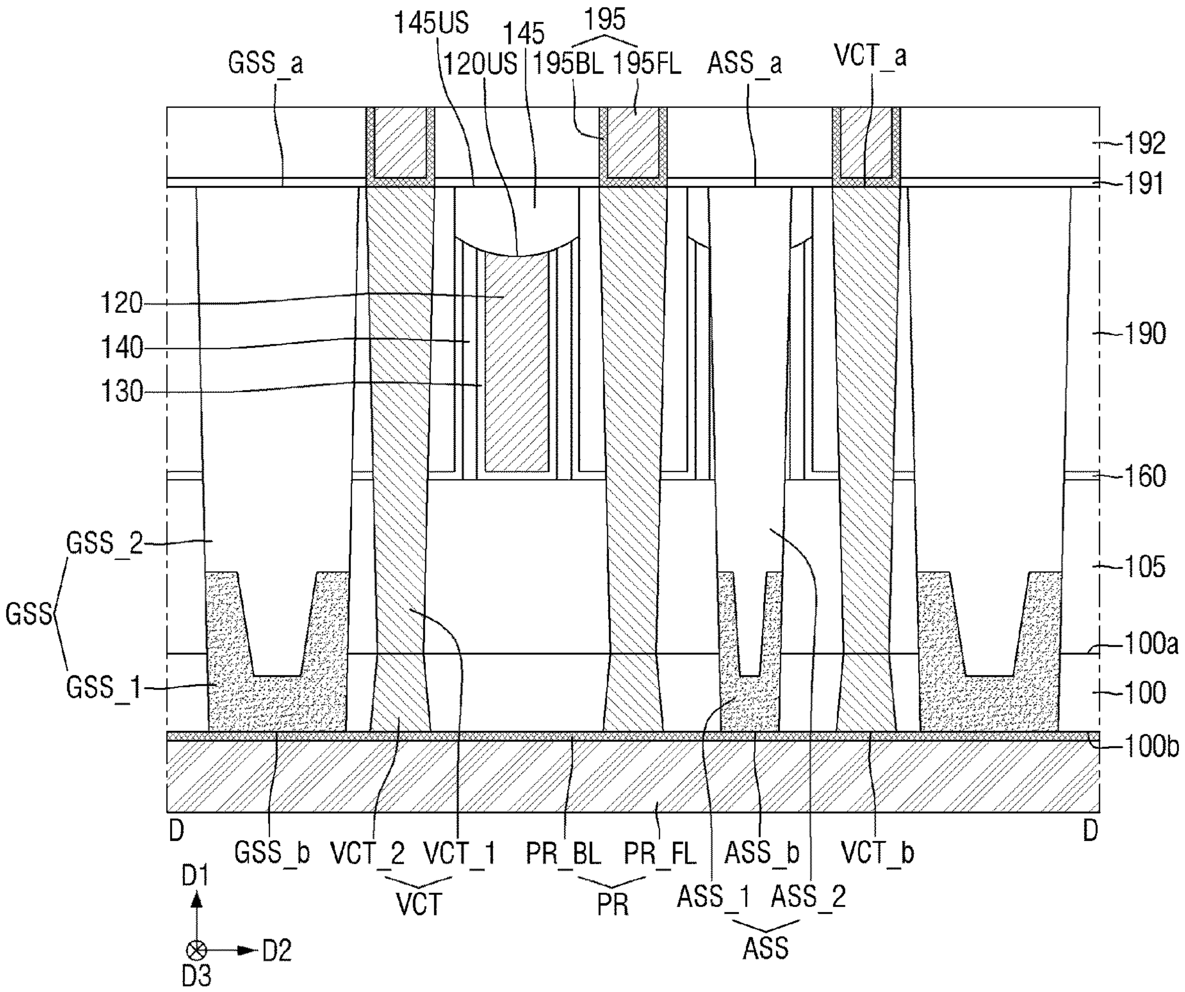

FIG. 8A to FIG. 8C are diagrams for illustrating a semiconductor device according to some still yet further embodiments. For reference, FIG. 8A corresponds to a cross-sectional view along line A-A of FIG. 1. FIG. 8B corresponds to a cross-sectional view along line B-B of FIG. 1. FIG. 8C corresponds to a cross-sectional view along line D-D of FIG. 1. For the convenience of description, descriptions duplicate with those as set forth above with reference to FIG. 6A to FIG. 6C are omitted.

Referring to FIG. 8A to FIG. 8C, each of the gate cutting structure GSS and the active cutting structure ASS may be composed of multiple films. The gate cutting structure GSS may include the first gate sub-film GSS_1 and the second gate sub-film GSS_2. The active cutting structure ASS may include the first active sub-film ASS_1 and the second active sub-film ASS_2. Each of the first gate sub-film GSS_1 and the first active sub-film ASS_1 may have a cup shape.

For example, in a cross-sectional view, each of the first gate sub-film GSS_1 and the first active sub-film ASS_1 may have a 'U' shape. Each of the first gate sub-film GSS_1 and the first active sub-film ASS_1 may include a horizontal portion extending in the second direction D2 and the third direction D3 and a vertical portion extending in the first direction D1, e.g., the vertical portion may extend from an edge of the horizontal portion to define an empty space over a center of the horizontal portion. The horizontal portion may constitute a bottom portion of the cup shape. In a cross-sectional view, as illustrated in FIG. 8A, the vertical portion may include left and right vertical portions spaced apart from each other in the second direction D2 and/or the third direction D3. In some embodiments, each of inner sidewalls of the left and right vertical portions facing each other may have an inclination with respect to the first surface 100*a* of the substrate 100.

In some embodiments, in a cross-sectional view, each of the second gate sub-film GSS_2 and the second active sub-film ASS_2 may have a 'T' shape. The second gate sub-film GSS_2 may fill an inner space defined by the cup shape of the first gate sub-film GSS_1 and extend on and above the cup shape of the first gate sub-film GSS_1. The second active sub-film ASS_2 may fill an inner space defined by the cup shape of the first active sub-film ASS_1 and extend on and above the cup shape of the active sub-film ASS_1.

Figure 9A:
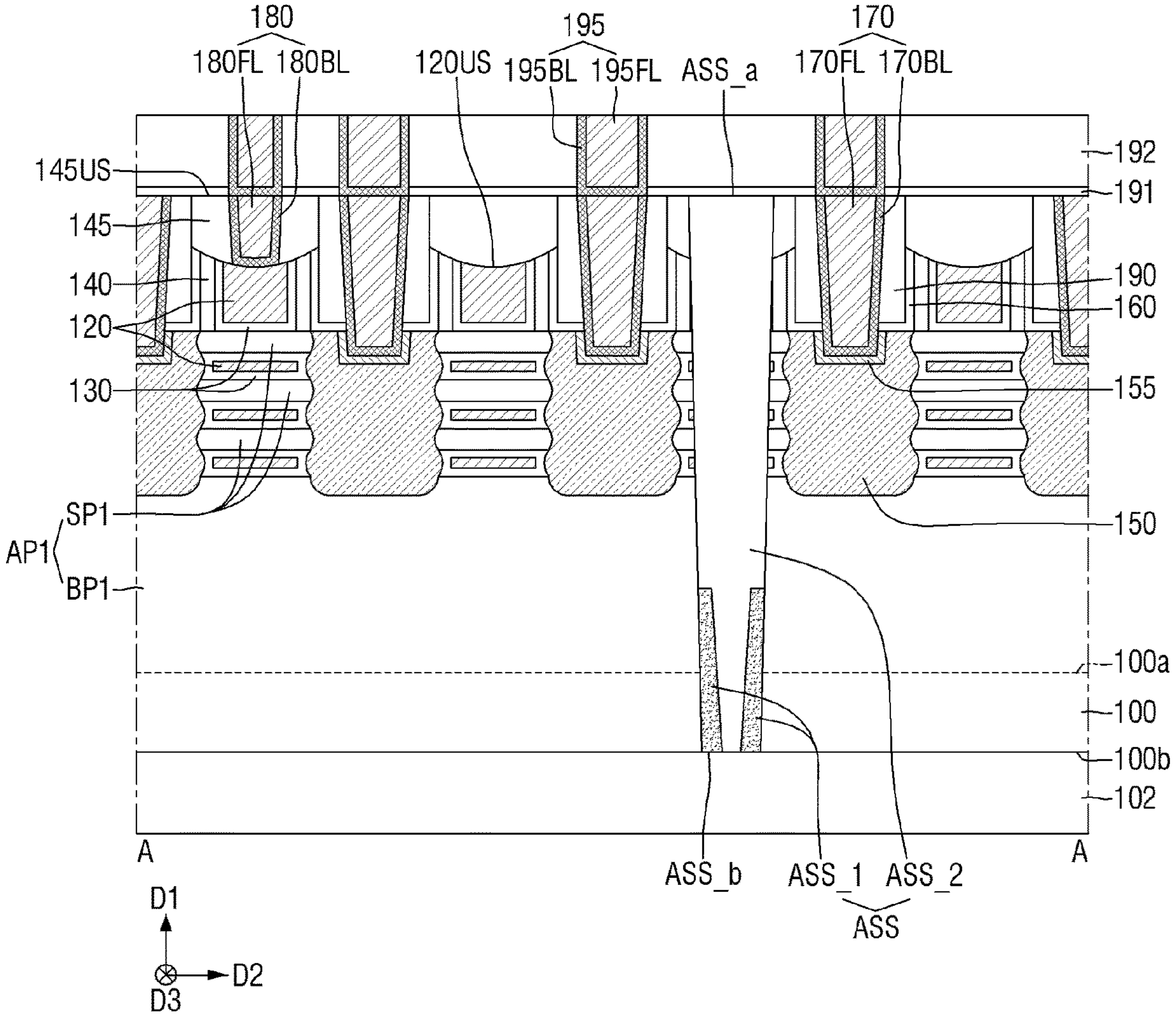
FIG. 9A to FIG. 9C are diagrams of a semiconductor device according to some still yet further embodiments.
Figure 9B:
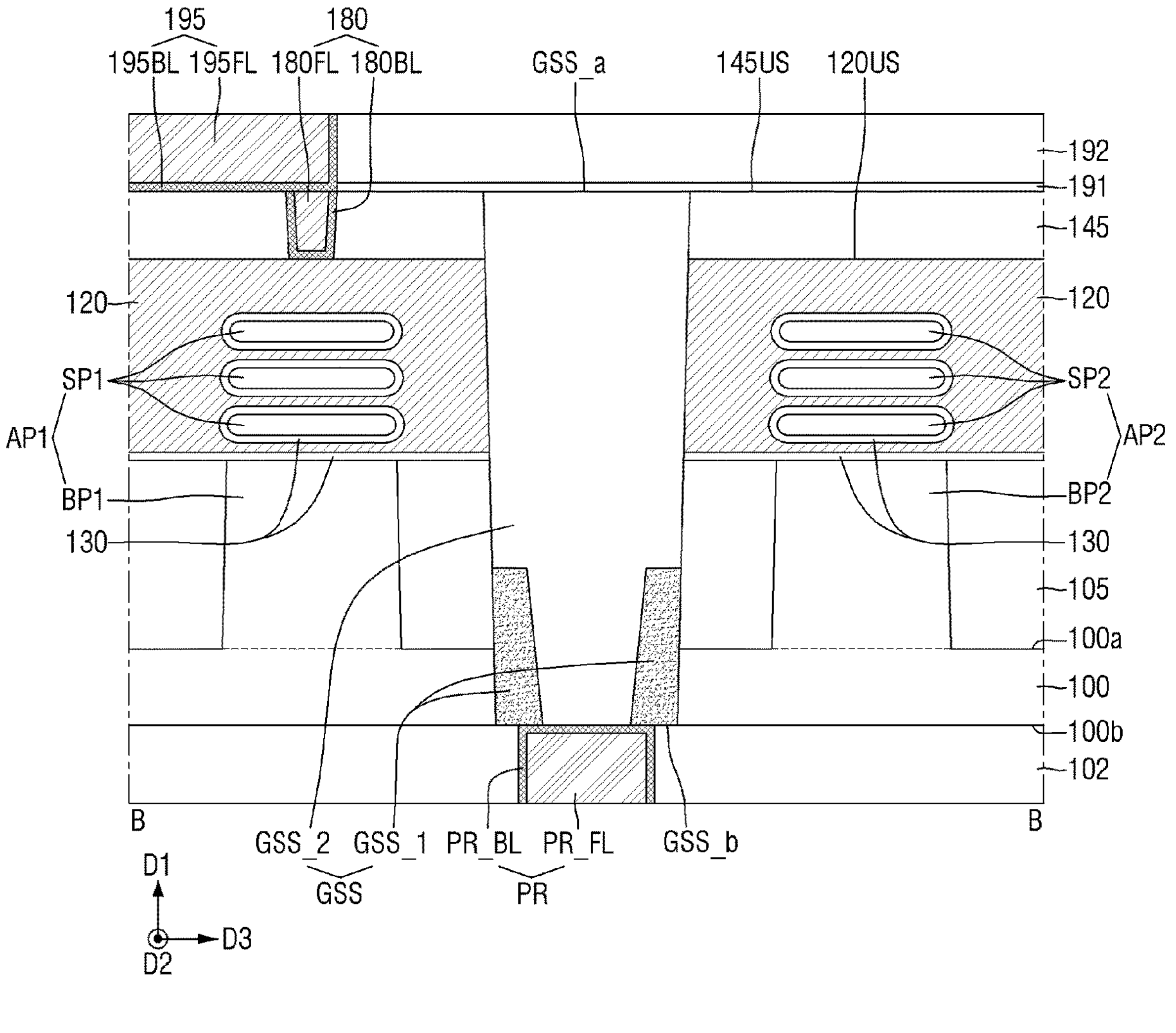
Figure 9C:
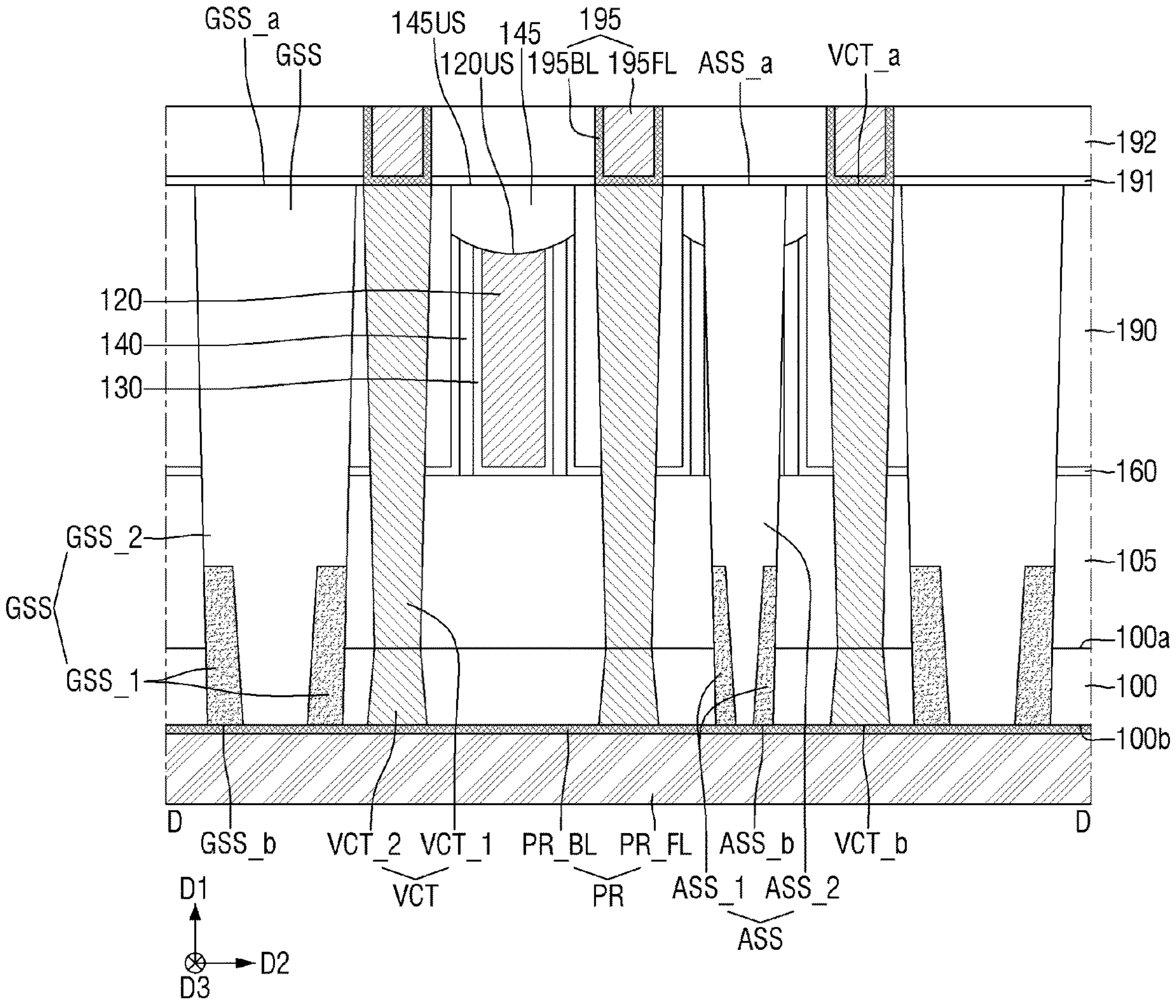

FIG. 9A to FIG. 9C are diagrams for illustrating a semiconductor device according to some still yet further embodiments. For reference, FIG. 9A corresponds to a cross-sectional view along line A-A in FIG. 1. FIG. 9B corresponds to a cross-sectional view along line B-B of FIG. 1. FIG. 9C corresponds to a cross-sectional view along line D-D of FIG. 1. For the convenience of description, descriptions duplicate with those as set forth above with reference to FIG. 6A to FIG. 6C are omitted.

Referring to FIG. 9A to FIG. 9C, each of the gate cutting structure GSS and the active cutting structure ASS may be composed of multiple films. The gate cutting structure GSS may include the first gate sub-film GSS_1 and the second gate sub-film GSS_2. The active cutting structure ASS may include the first active sub-film ASS_1 and the second active sub-film ASS_2.

Each of the first gate sub-film GSS_1 and the first active sub-film ASS_1 may have a hollow column shape, e.g., a structure including only the vertical portion of FIGS. 8A-8C without the horizontal portion. Each of the second gate sub-film GSS_2 and the second active sub-film ASS_2 may fill an inner space defined in each hollow columnar shape.

Accordingly, at least a portion of the second gate sub-film GSS_2 may contact the power rail PR and/or the lower insulating film 102. At least a portion of the second active sub-film ASS_2 may contact the power rail PR and/or the lower insulating film 102.

In the process of forming the gate cutting structure GSS, the substrate 100 and the first gate sub-film GSS_1 may be removed via the CMP process. When the first gate sub-film GSS_1 is excessively etched during the CMP process, the second gate sub-film GSS_2 may be exposed. Similarly, in the process of forming the active cutting structure ASS, the substrate 100 and the first active sub-film ASS_1 may be removed via the CMP process. When the first active sub-film ASS_1 is excessively etched during the CMP process, the second active sub-film ASS_2 may be exposed.

Figure 10A:
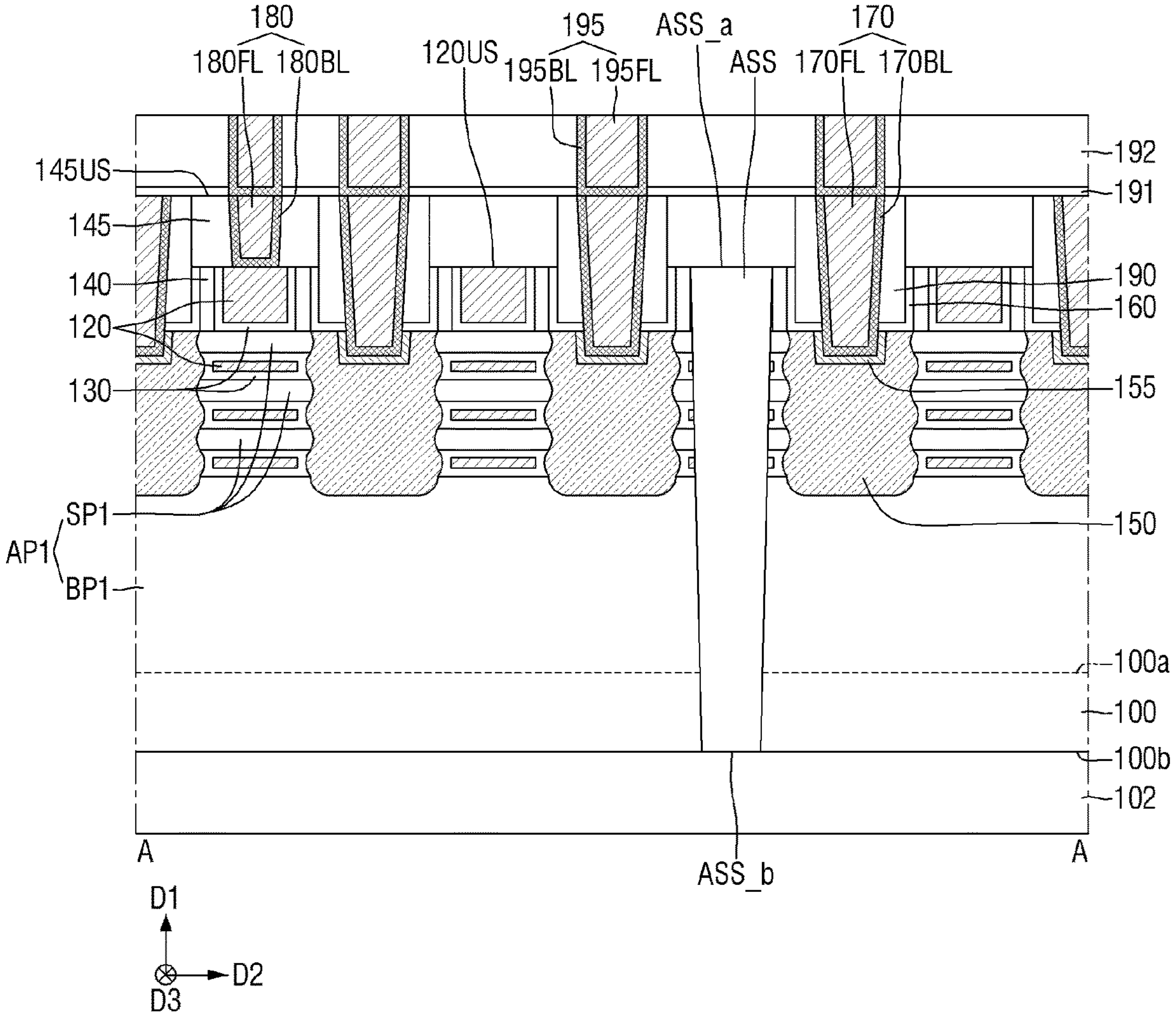
FIG. 10A to FIG. 10C are diagrams of a semiconductor device according to some still yet further embodiments.
Figure 10B:
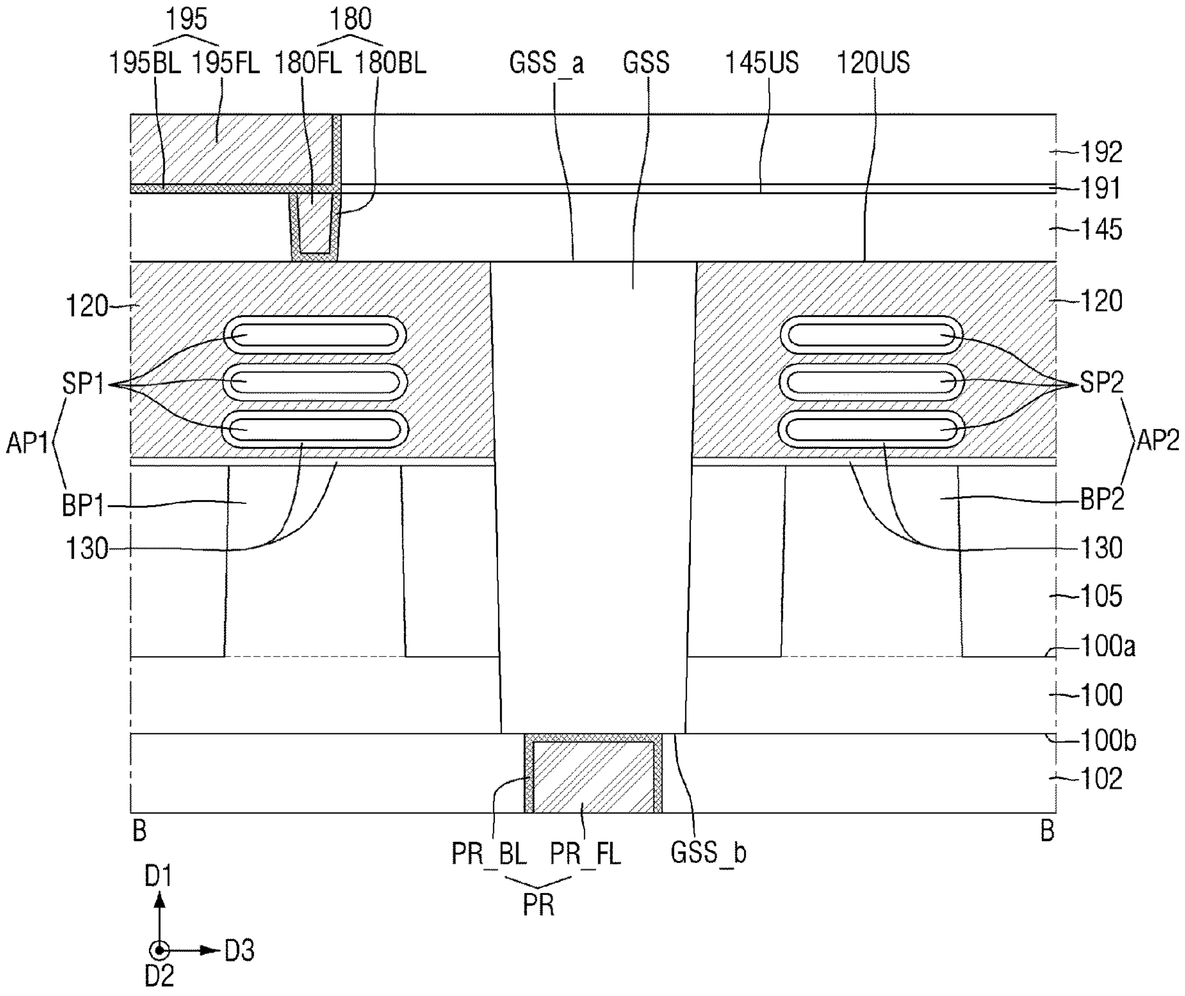
Figure 10C:
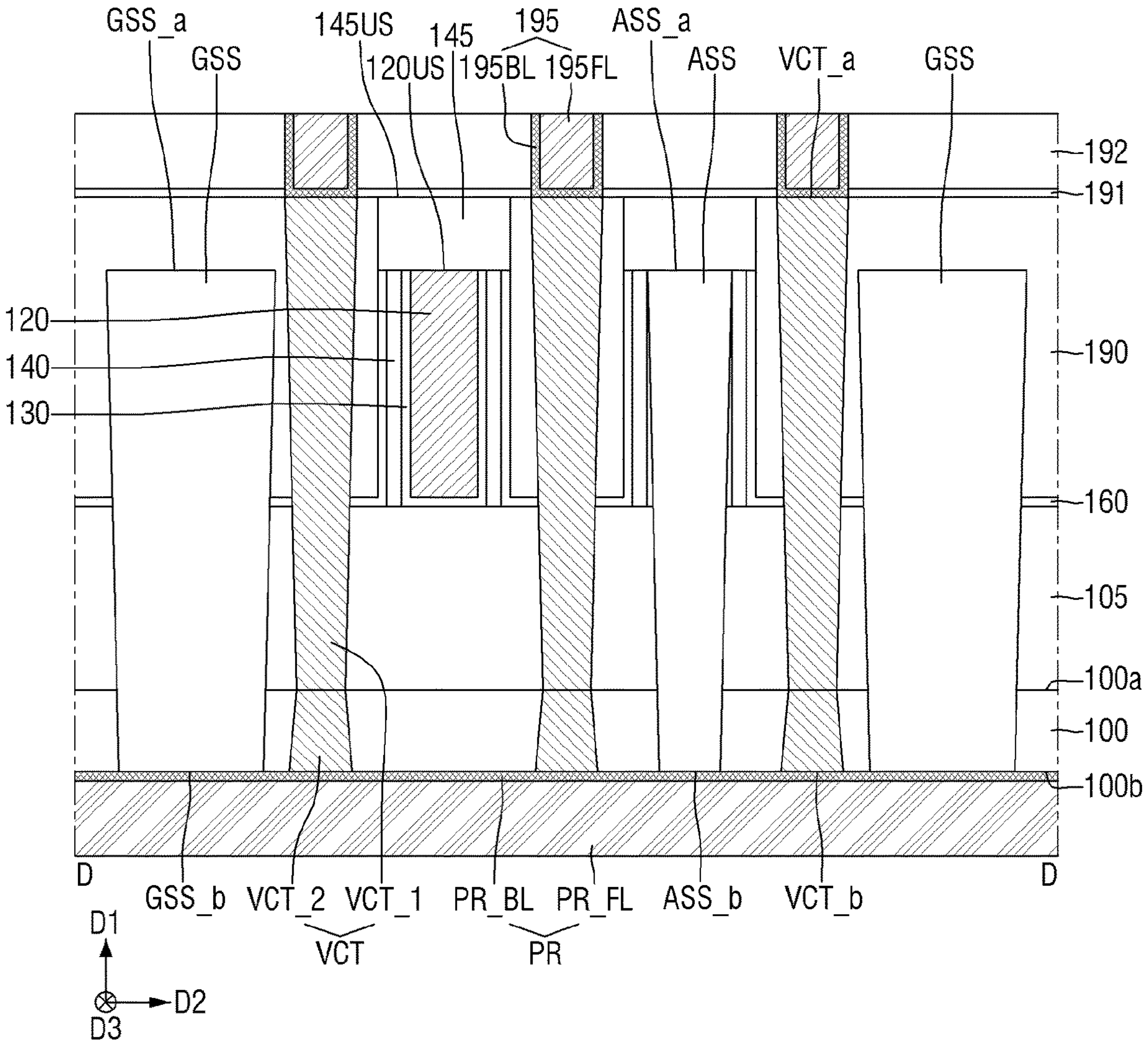

FIG. 10A to FIG. 10C are diagrams for illustrating a semiconductor device according to some still yet further embodiments. FIG. 10A corresponds to a cross-sectional view along line A-A in FIG. 1. FIG. 10B corresponds to a cross-sectional view along line B-B in FIG. 1. FIG. 10C corresponds to a cross-sectional view along line D-D in FIG. 1.

Referring to FIG. 10A to FIG. 10C, the upper surface 120US of each of the gate electrodes 120 may be flat.

The third surface GSS_a of the gate cutting structure GSS may be coplanar with the upper surface 120US of each of the gate electrodes 120. The fifth surface ASS_a of the active cutting structure ASS may be coplanar with the upper surface 120US of each of the gate electrodes 120.

After the gate electrode 120 has been formed but before the gate capping film 145 is formed, the gate cutting structure GSS and the active cutting structure ASS may be formed. In this case, the third surface GSS_a of the gate cutting structure GSS may be coplanar with the upper surface 120US of each of the gate electrodes 120, and the fifth surface ASS_a of the active cutting structure ASS may be coplanar with the upper surface 120US of each of the gate electrodes 120.

Thereafter, the gate capping film 145 may be formed. The gate capping film 145 may be made of the same material as that of the first interlayer insulating film 190. In this case, the first interlayer insulating film 190 may entirely cover the gate cutting structure GSS. The gate capping film 145 may cover the third surface GSS_a of the gate cutting structure GSS. Similarly, the first interlayer insulating film 190 may entirely cover the active cutting structure ASS. The gate capping film 145 may cover the fifth surface ASS_a of the active cutting structure ASS.

Based on the first surface 100*a* of the substrate 100, each of the third surface GSS_a of the gate cutting structure GSS and the fifth surface ASS_a of the active cutting structure ASS may be positioned at a vertical level lower than a vertical level of the upper surface 145US of the gate capping film 145. Based on the first surface 100*a* of the substrate 100, each of the third surface GSS_a of the gate cutting structure GSS and the fifth surface ASS_a of the active cutting structure ASS may be positioned at a vertical level lower than a vertical level of each of the upper surface of the first interlayer insulating film 190, the upper surface of the first source/drain contact 170, the upper surface of the second source/drain contact 270, the upper surface of the gate contact 180, and the upper surface VCT_a of the via contact VCT.

Figure 11:
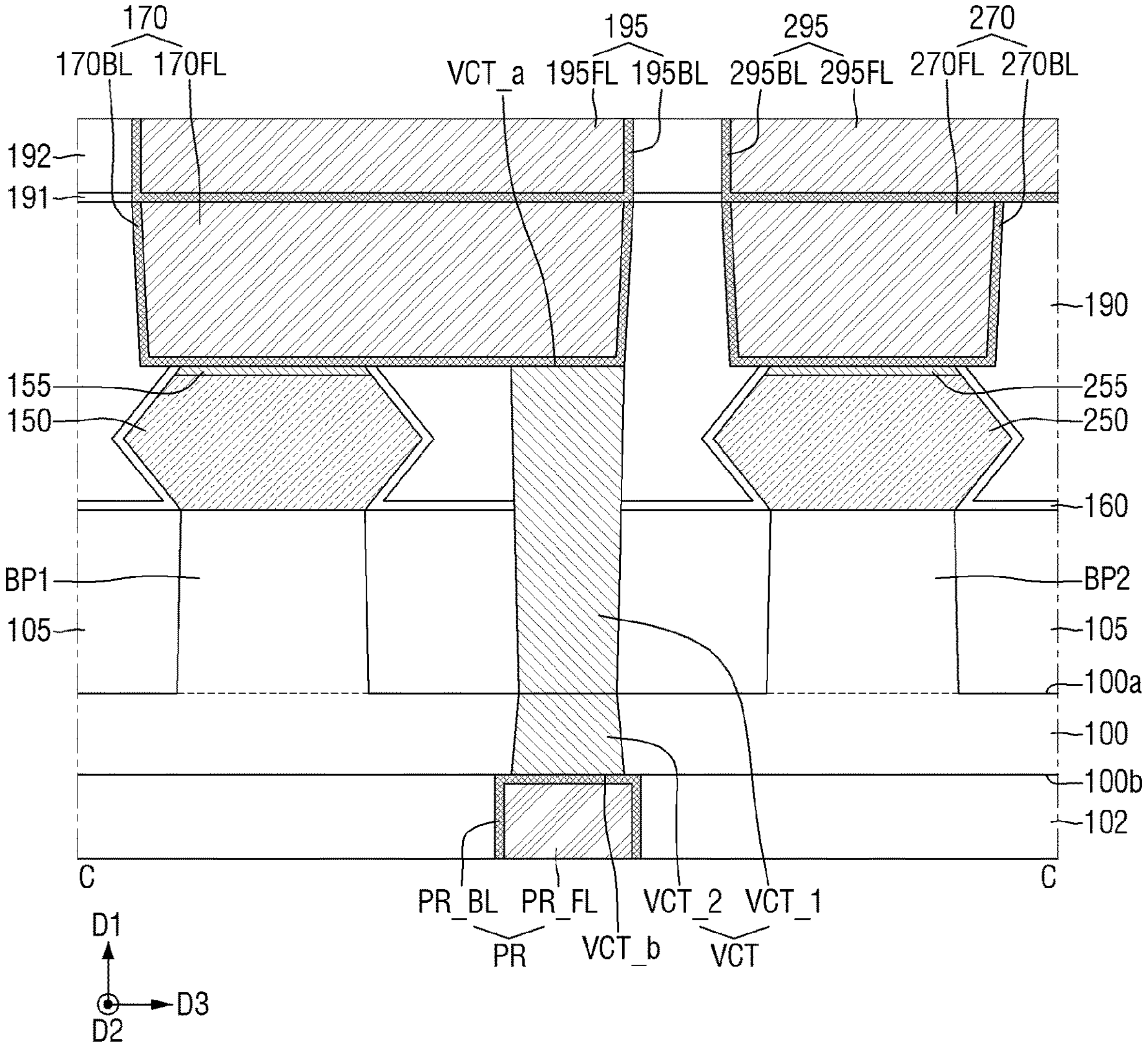
FIG. 11 and FIG. 12 are diagrams of semiconductor devices according to some still yet further embodiments, respectively.
Figure 12:
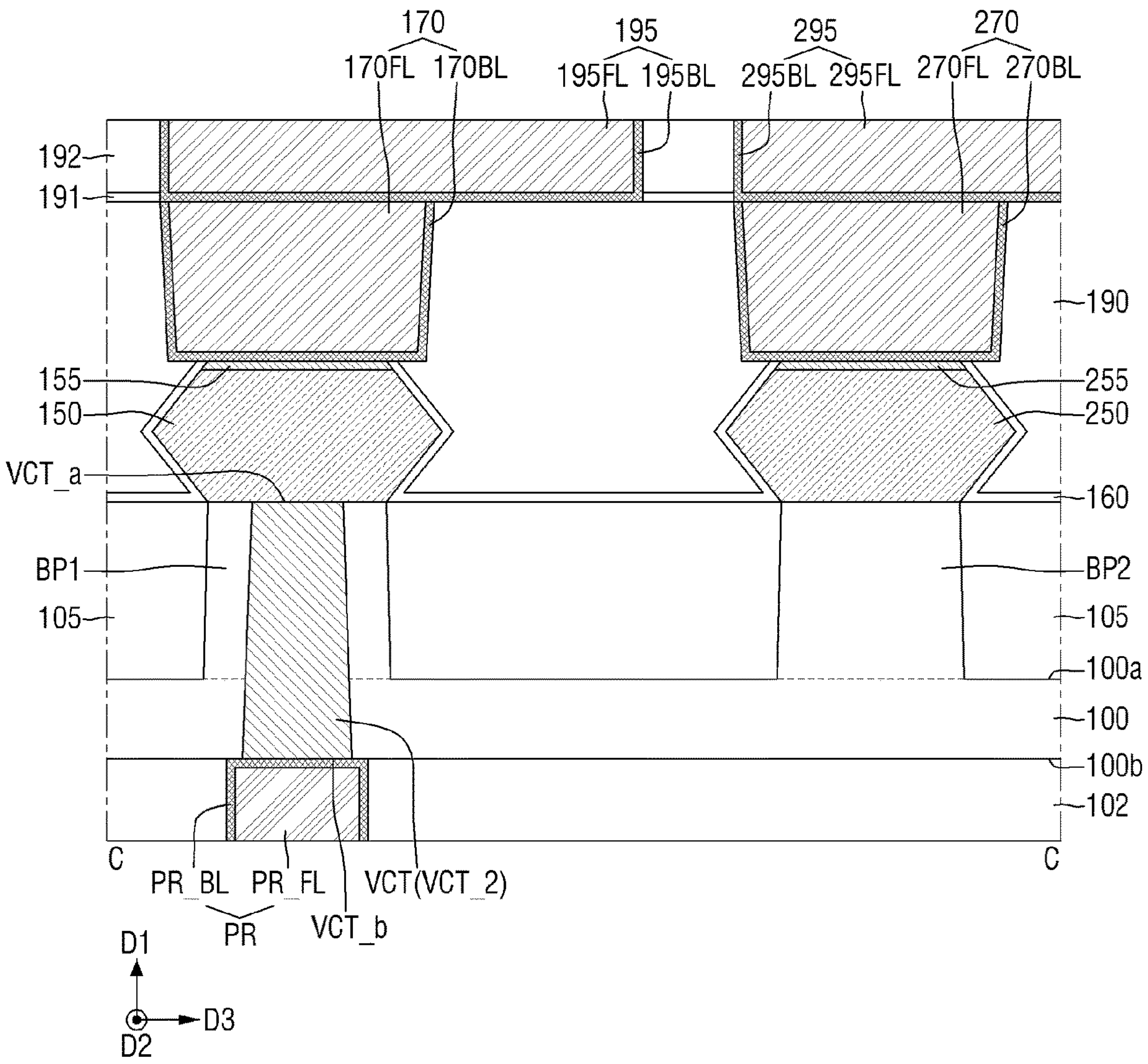

FIG. 11 and FIG. 12 are diagrams for illustrating semiconductor devices according to some still yet further embodiments, respectively. FIGS. 11 and 12 correspond to cross-sectional views along line C-C of FIG. 1, respectively.

Referring to FIG. 11, the upper surface VCT_a of the via contact VCT may not be coplanar with the upper surface of the first source/drain contact 170. The upper surface VCT_a of the via contact VCT may contact the bottom surface of the first source/drain contact 170. The via contact VCT may not extend to the upper surface of the first interlayer insulating film 190. The upper surface VCT_a of the via contact VCT is positioned at a lower level than that of the upper surface of the first interlayer insulating film 190, e.g., the upper surface VCT_a of the via contact VCT may be coplanar with the upper surfaces of the contact silicide layers 155 and 175.

The via contact VCT does not overlap with the first source/drain contact 170 and the second source/drain contact 270 in the third direction D3. The first portion VCT_1 of the via contact VCT does not overlap with the first source/drain contact 170 and the second source/drain contact 270 in the third direction D3.

Referring to FIG. 12, the via contact VCT may contact the first source/drain pattern 150. The via contact VCT may extend through the substrate 100 and the first lower pattern BP1 in the first direction D1.

In this regard, the upper surface VCT_a of the via contact VCT may be the upper surface of the second portion VCT_2 of the via contact. The upper surface VCT_a of the via contact VCT may directly contact the bottom surface of the first source/drain pattern 150.

The via contact VCT may include only the second portion VCT_2. That is, the via contact VCT may extend from the second surface 100*b* of the substrate 100 and may not extend from the upper surface of the first interlayer insulating film 190. A width of the via contact VCT may gradually decrease as the via contact extends away from the second surface 100*b* of the substrate 100. That is, the width of the via contact VCT may have a minimum value at the upper surface VCT_a of the via contact VCT and a maximum value at the lower surface VCT_b of the via contact VCT. The lower surface VCT_b of the via contact VCT may be coplanar with the second surface 100*b* of the substrate 100, while the upper surface VCT_a of via contact VCT may be coplanar with the upper surface of the first lower pattern BP1.

Figure 13:
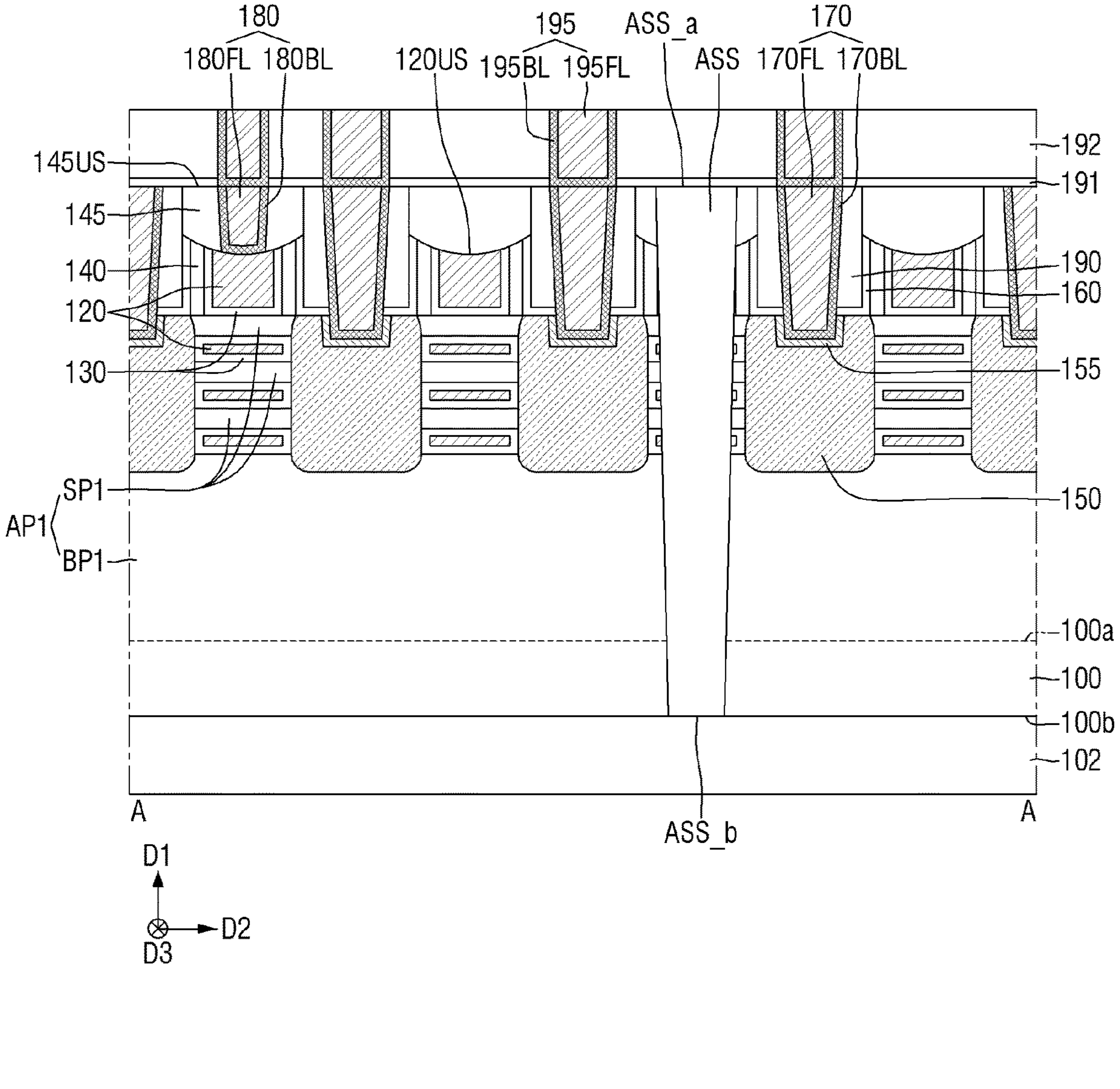
FIG. 13 and FIG. 14 are diagrams of semiconductor devices according to some still yet further embodiments, respectively.
Figure 14:
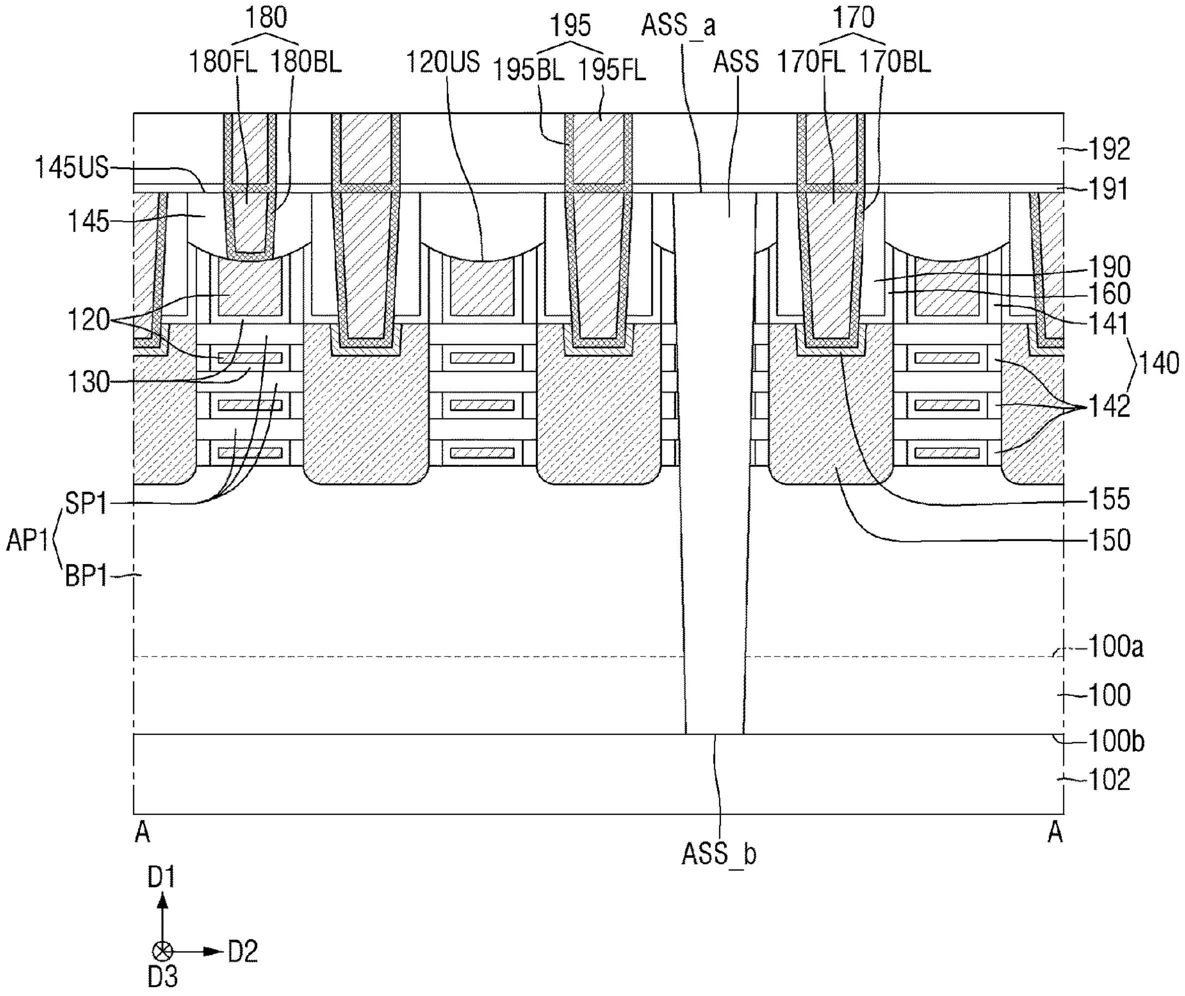

FIG. 13 and FIG. 14 are diagrams for illustrating semiconductor devices according to some still yet further embodiments, respectively. For reference, FIG. 13 and FIG. 14 correspond to cross-sectional views along line A-A of FIG. 1, respectively.

Referring to FIG. 13, the sidewall of the first source/drain pattern 150 may not have a wavy shape. Although not shown, the sidewall figure of the second source/drain pattern 250 may not have a wavy shape.

Referring to FIG. 14, the gate spacer 140 may include an outer spacer 141 and an inner spacer 142. The inner spacer 142 may be disposed between the first lower pattern BP1 and the bottommost first sheet pattern SP1 and between adjacent first sheet patterns SP1. Although not shown, the inner spacer 142 may be disposed between the second lower pattern BP2 and the bottommost second sheet pattern, and between adjacent second sheet patterns.

Figure 15:
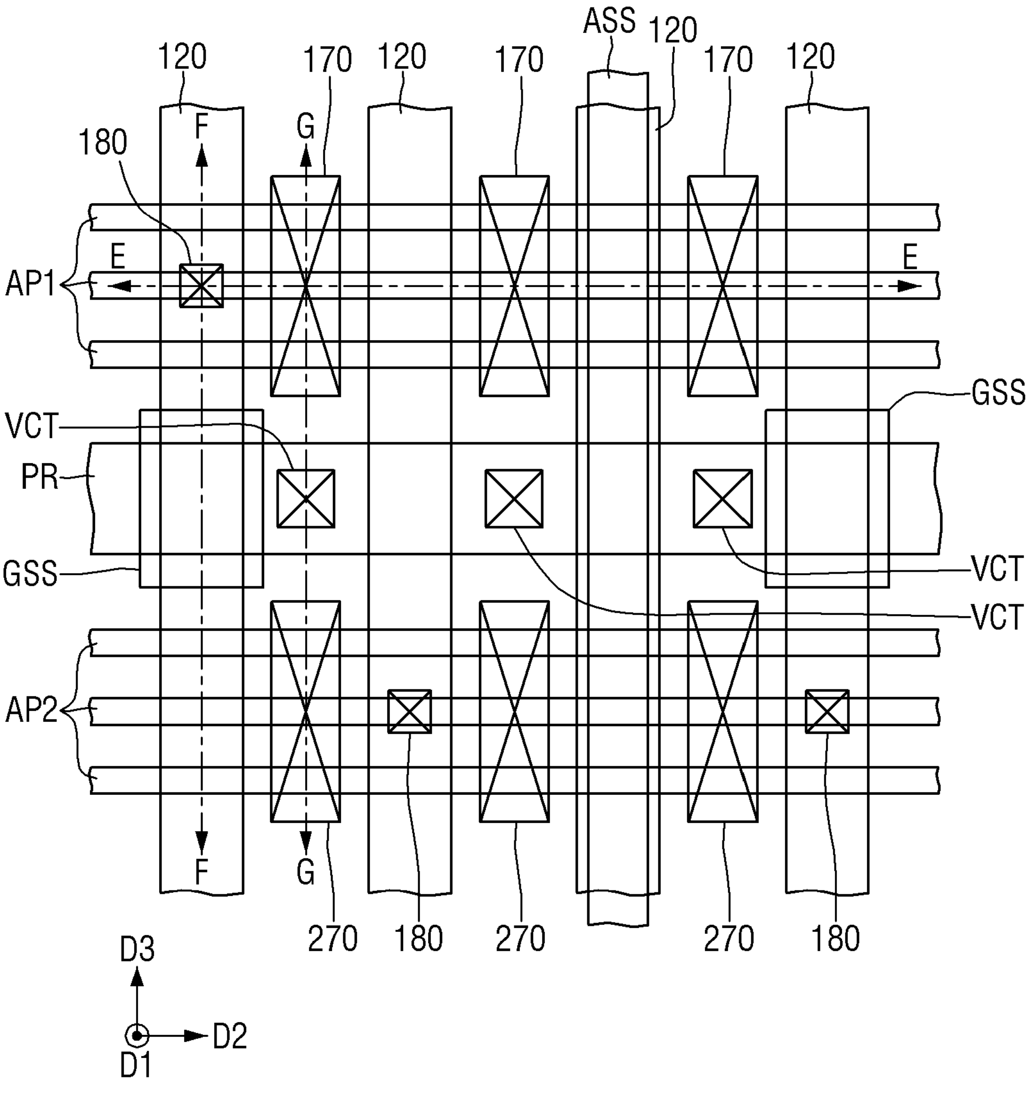
FIG. 15 to FIG. 18 are diagrams of a semiconductor device according to some still yet further embodiments.
Figure 16:
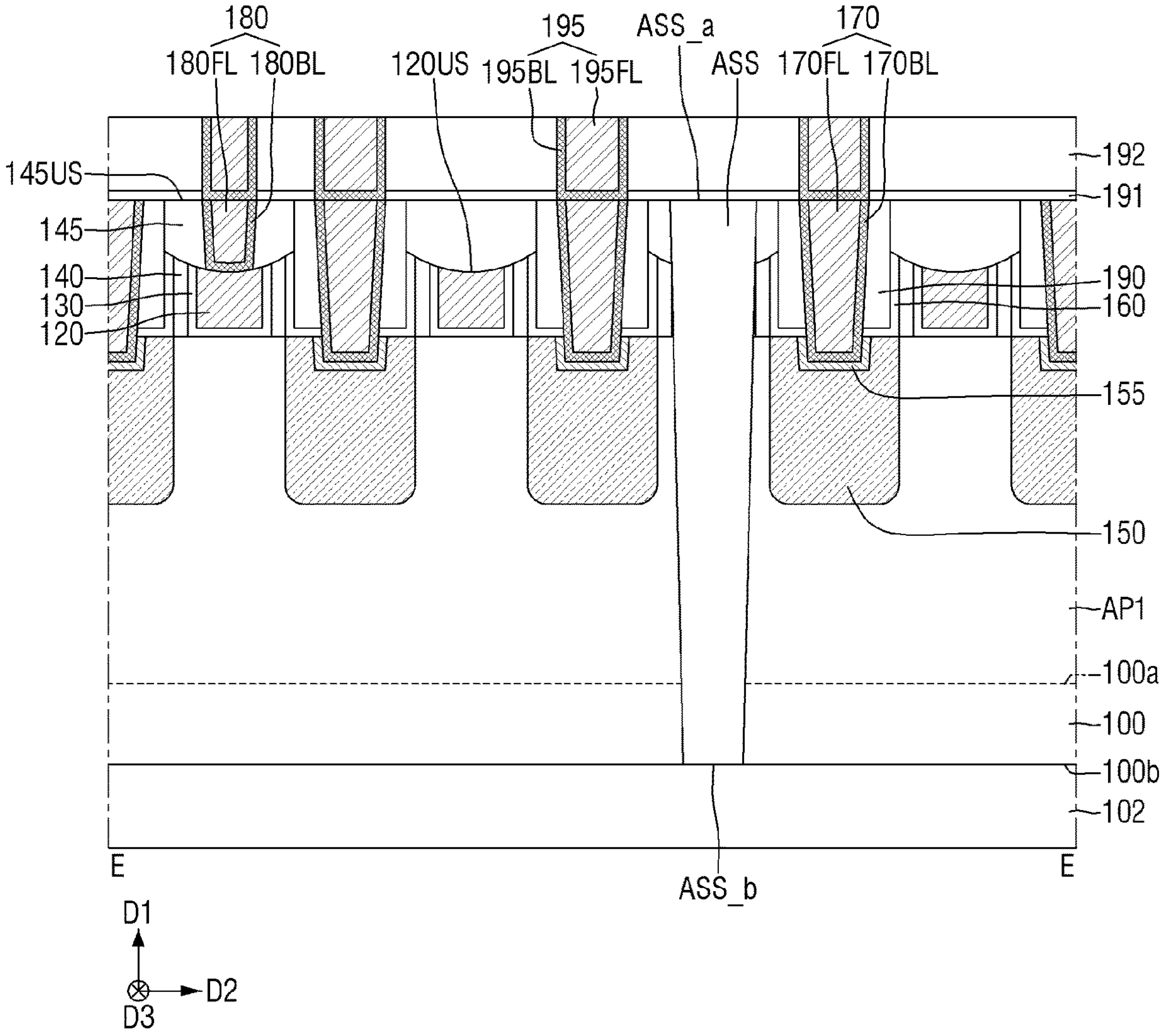
Figure 17:
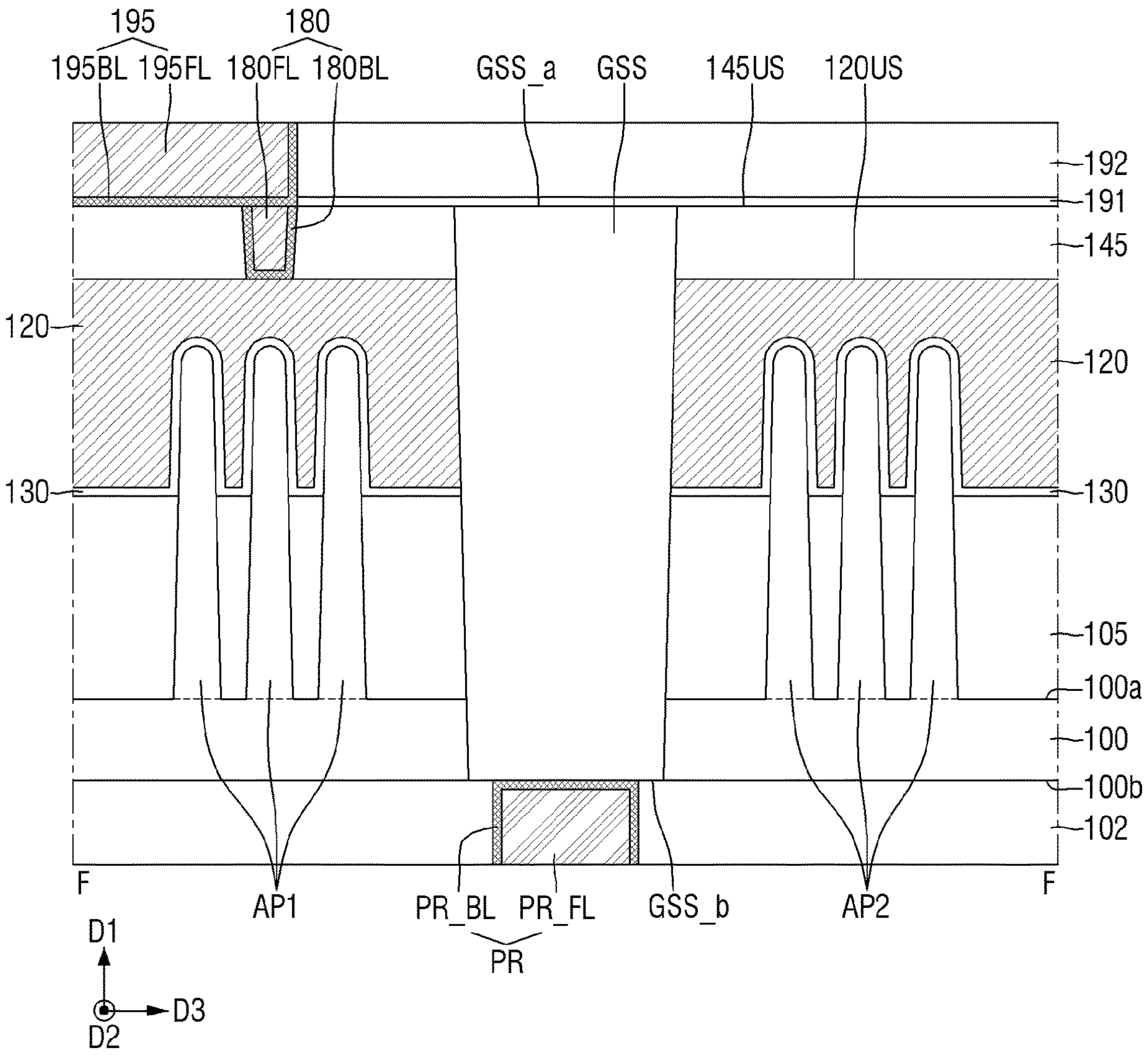
Figure 18:
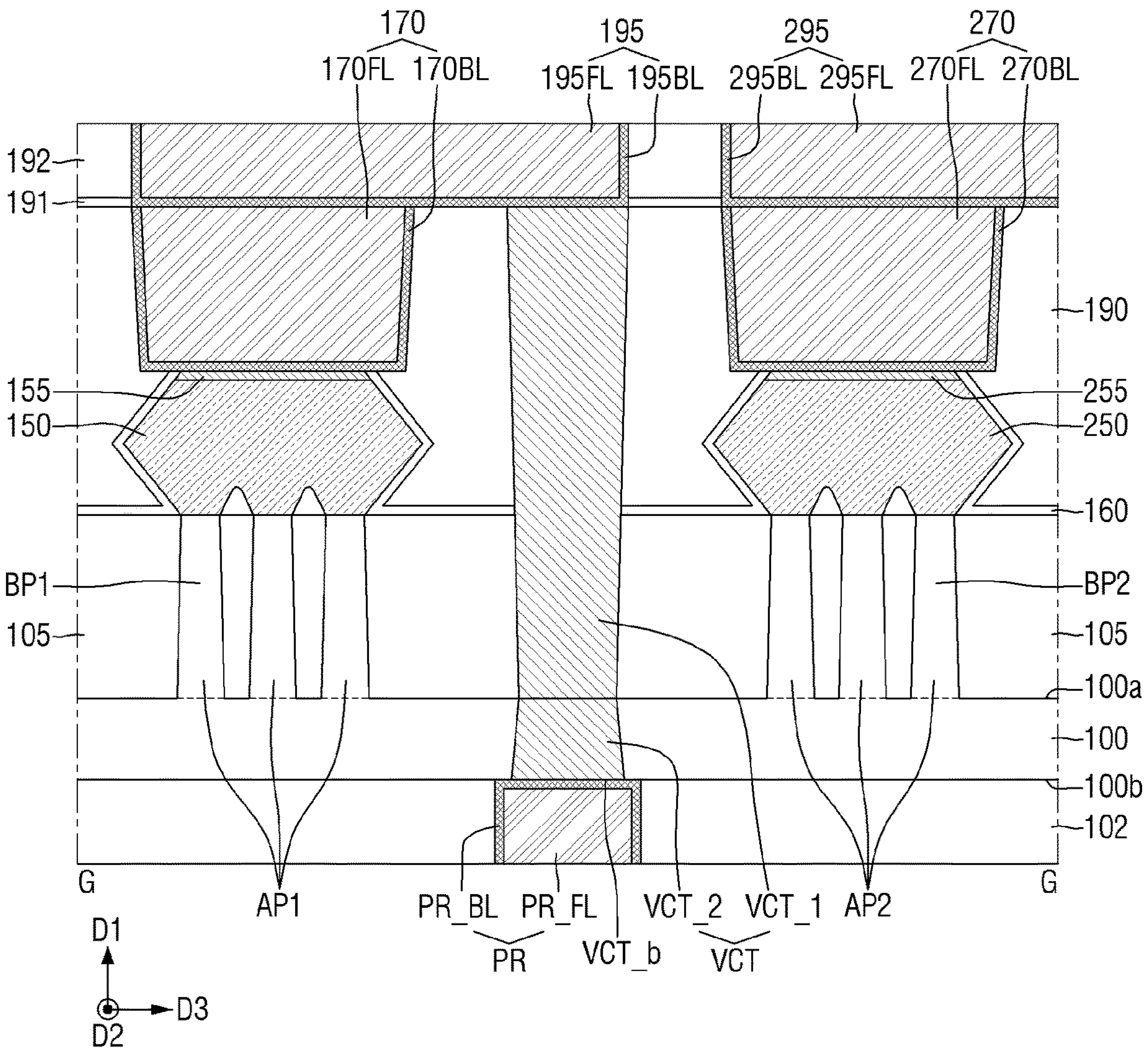

FIG. 15 to FIG. 18 are diagrams for illustrating a semiconductor device according to some still yet further embodiments. FIG. 15 is an illustrative layout diagram of a semiconductor device according to some embodiments. FIG. 16 is an illustrative cross-section along line E-E in FIG. 15. FIG. 17 is an illustrative cross-section along line F-F in FIG. 15. FIG. 18 is an illustrative cross-section along line G-G in FIG. 15.

Referring to FIG. 15 to FIG. 18, a semiconductor device according to some embodiments may be a fin-type transistor (FinFET). The semiconductor device according to some embodiments may not include sheet patterns.

In the semiconductor device according to some embodiments, each of the first active pattern AP1 and the second active pattern AP2 may be a fin-shaped pattern. Each of the first active pattern AP1 and the second active pattern AP2 may protrude from the substrate 100 in the first direction D1. Each of the first active pattern AP1 and the second active pattern AP2 may extend in the second direction D2.

The first active pattern AP1 may include at least one first active pattern. The first active patterns AP1 may be spaced apart from each other in the third direction D3. Although it is illustrated that the number of the first active patterns AP1 is three, any suitable number of first active patterns may be implemented. Similarly, the second active pattern AP2 may include at least one second active pattern. The second active patterns AP2 may be spaced apart from each other in the third direction D3. Although it is illustrated that the number of the second active patterns AP2 is three, any suitable number of second active patterns may be implemented.

A portion of the first active pattern AP1 interposed between the first source/drain patterns 150 may function as a channel of the fin-type transistor. Although not shown, a portion of the second active pattern AP2 interposed between the second source/drain patterns 250 may function as a channel of the fin-type transistor. The portion of the first active pattern AP1 interposed between the first source/drain patterns 150 and the portion of the second active pattern AP2 interposed between the second source/drain patterns 250 may be covered with the gate electrode 120.

Hereinafter, a method for manufacturing a semiconductor device according to some embodiments is described with reference to FIG. 19A to FIG. 26B.

FIG. 19A to FIG. 26B are diagrams of stages in a method for manufacturing a semiconductor device according to some embodiments. For reference, FIGS. 19A, 20A, 21A, 22A, 23A, 24A, 25A, 26A, and 27A correspond to cross-sectional views along line A-A of FIG. 1, respectively. FIGS. 19B, 20B, 21B, 22B, 23B, 24B, 25B, 26B, and 27B correspond to cross-sectional views along line B-B of FIG. 1, respectively.

Figure 19A:
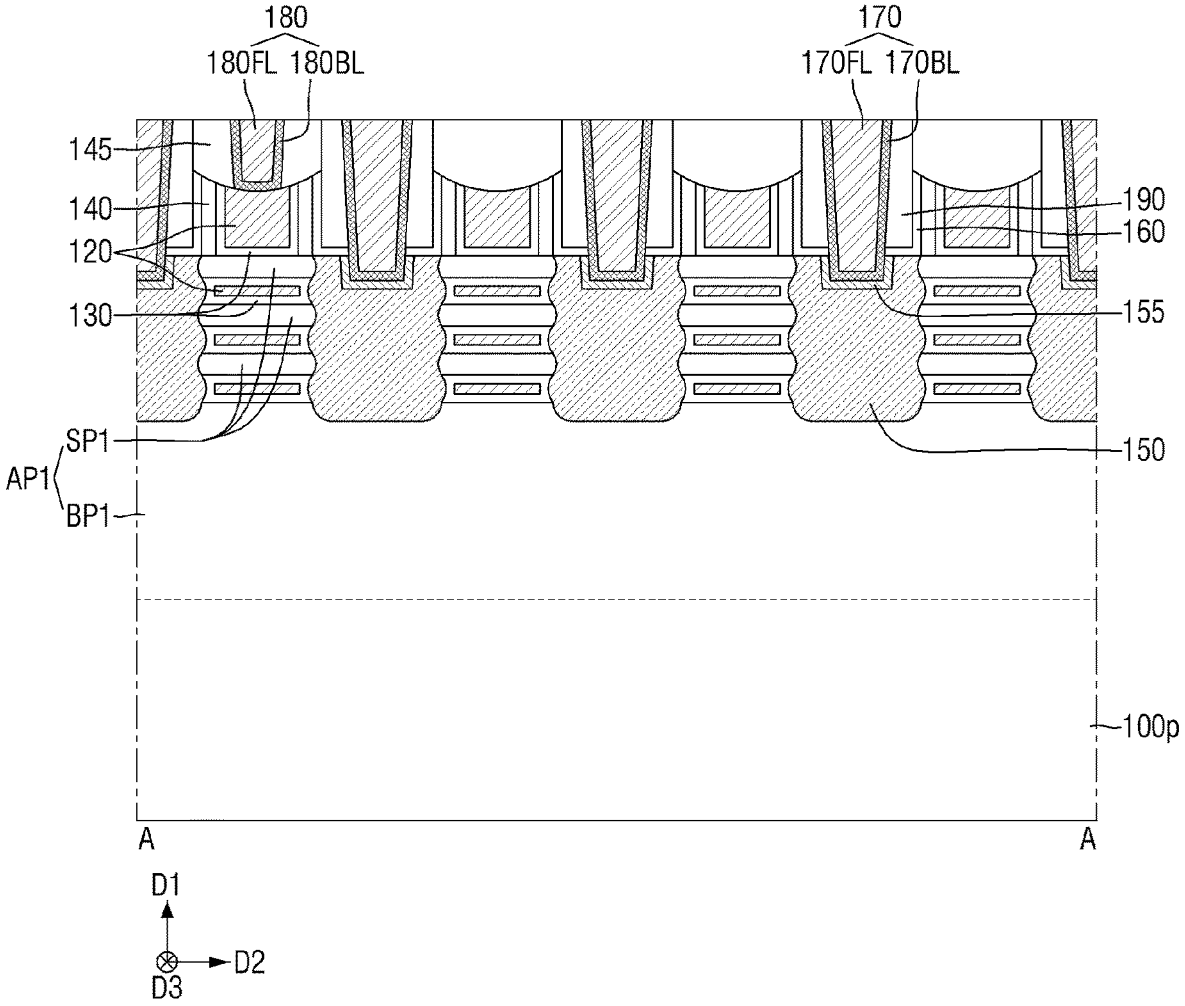
FIG. 19A to FIG. 26B are diagrams of stages in a method for manufacturing a semiconductor device according to some embodiments.
Figure 19B:
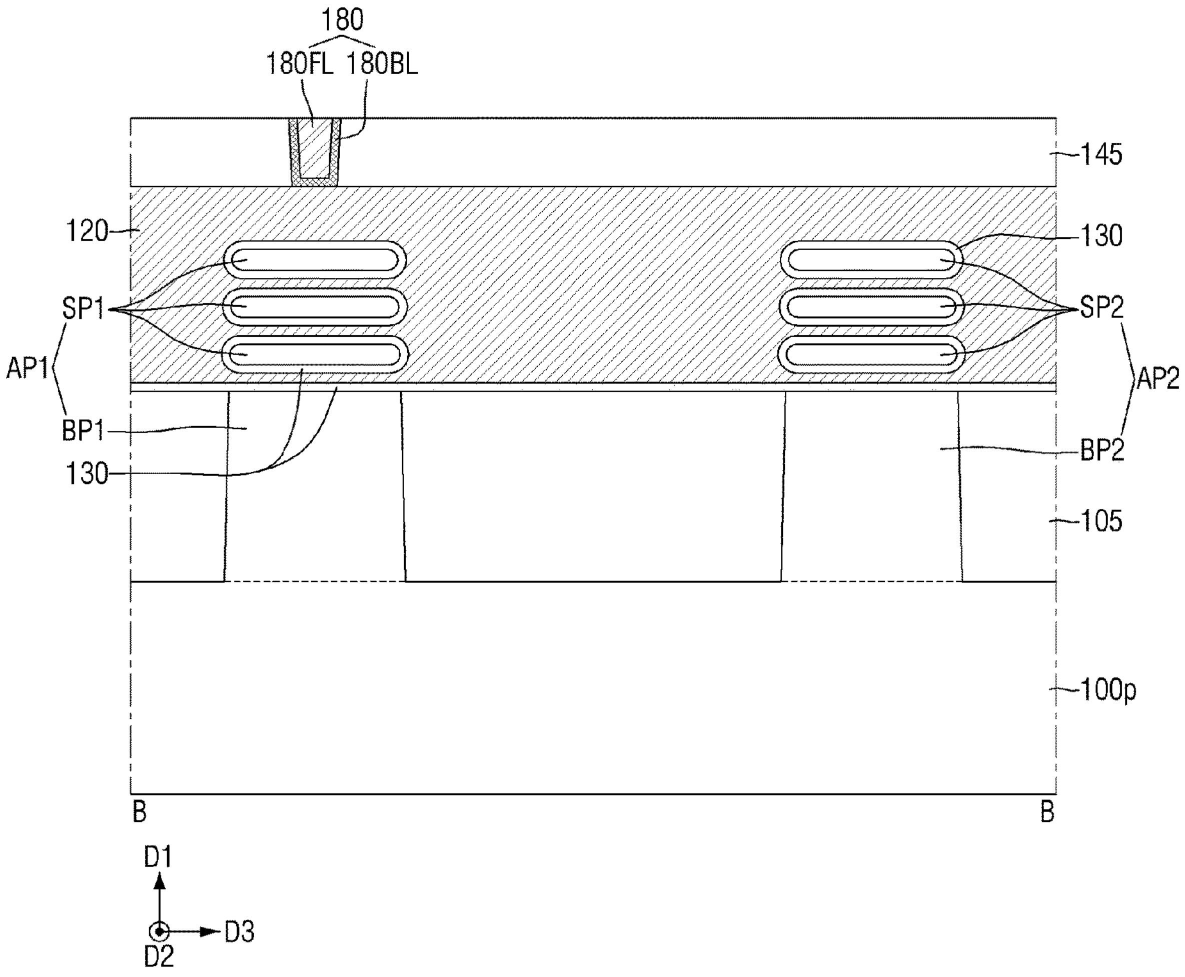

Referring to FIG. 19A and FIG. 19B, a pre-substrate 100*p* may be provided. The pre-substrate 100*p* may be made of bulk silicon or may be embodied as a SOI (silicon-on-insulator) substrate. Alternatively, the pre-substrate 100*p* may be a silicon substrate, or be made of a material other than silicon, e.g., silicon germanium, SGOI (silicon germanium on insulator), indium antimonide, lead telluride compound, indium arsenide, indium phosphide, gallium arsenide or gallium antimonide. However, the present disclosure is not limited thereto.

On the pre-substrate 100*p*, the first lower pattern BP1, the second lower pattern BP2, and the field insulating film 105 are formed. On the first lower pattern BP1, the plurality of first sheet patterns SP1 are formed. On the second lower pattern BP2, the plurality of second sheet patterns SP2 are formed.

The first source/drain pattern 150 is formed between adjacent ones of the plurality of first sheet patterns SP1. Although not shown, the second source/drain pattern 250 is formed between adjacent ones of the plurality of second sheet patterns SP2. In a process of forming the plurality of first sheet patterns SP1 and the plurality of second sheet patterns SP2, the sidewall of the first source/drain pattern 150 may have a wavy shape.

Subsequently, the gate electrode 120, the gate insulating film 130, the gate spacer 140, and the gate capping film 145 may be formed. The gate electrode 120 may be formed on the first lower pattern BP1 and the second lower pattern BP2. The gate electrode 120 may cover the first sheet patterns SP1 and the second sheet patterns SP2.

The gate insulating film 130 may be formed along the upper surface of the first lower pattern BP1, the upper surface of the second lower pattern BP2, and the upper surface of the field insulating film 105. The gate insulating film 130 may be formed between the gate electrode 120 and the first sheet patterns SP1. The gate insulating film 130 may be formed between the gate electrode 120 and the second sheet patterns SP2. The gate insulating film 130 may be formed along the sidewall and the bottom surface of the gate electrode 120 while being disposed on the first sheet pattern SP1 and the second sheet pattern SP2.

The gate spacer 140 may be formed on the sidewall of the gate electrode 120. The gate capping film 145 may be formed on the upper surface of the gate electrode 120. Subsequently, the etch stop film 160, the first interlayer insulating film 190, the first source/drain contact 170, the second source/drain contact 270, and the gate contact 180 may be formed.

Figure 20A:
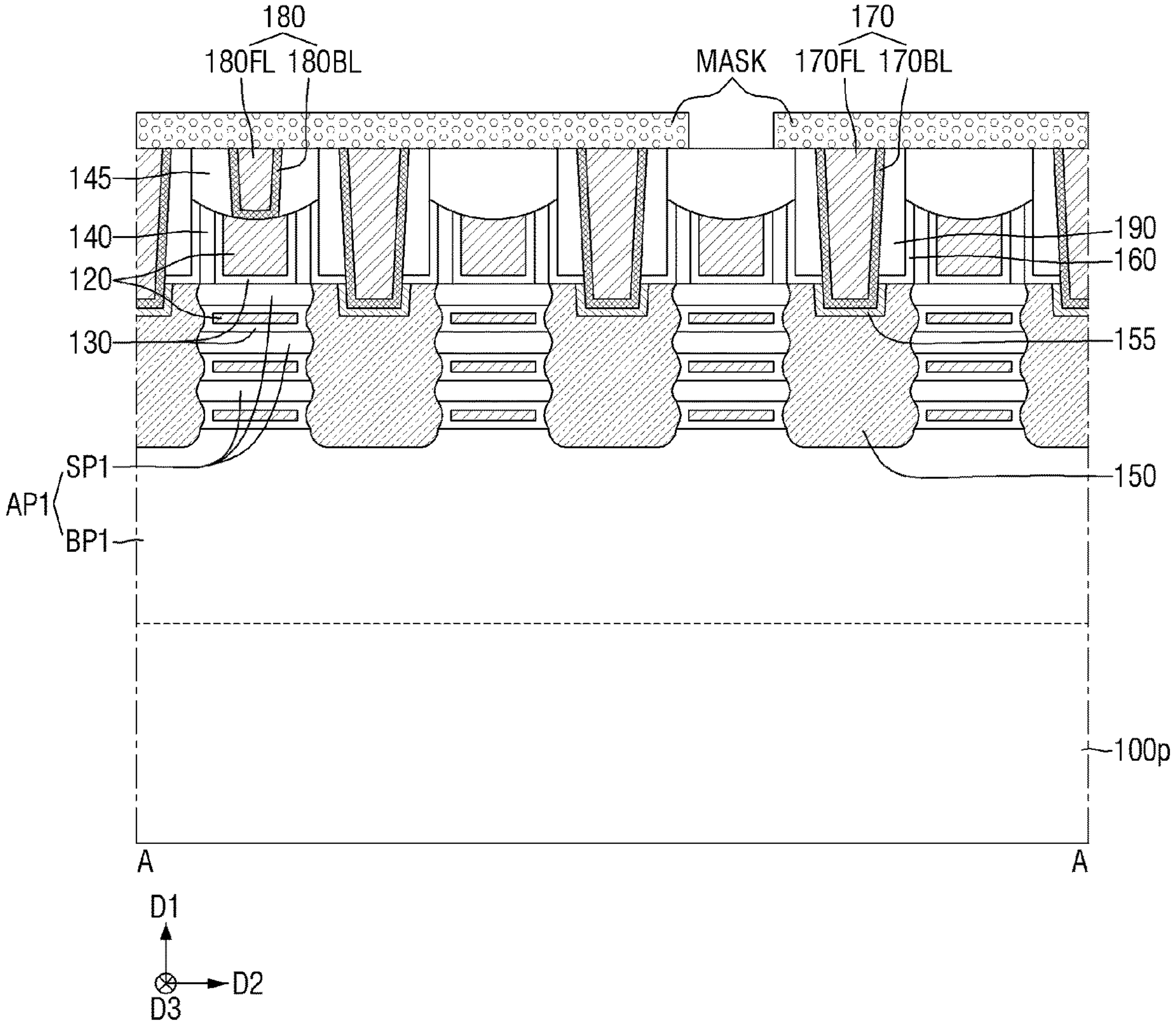
Figure 20B:
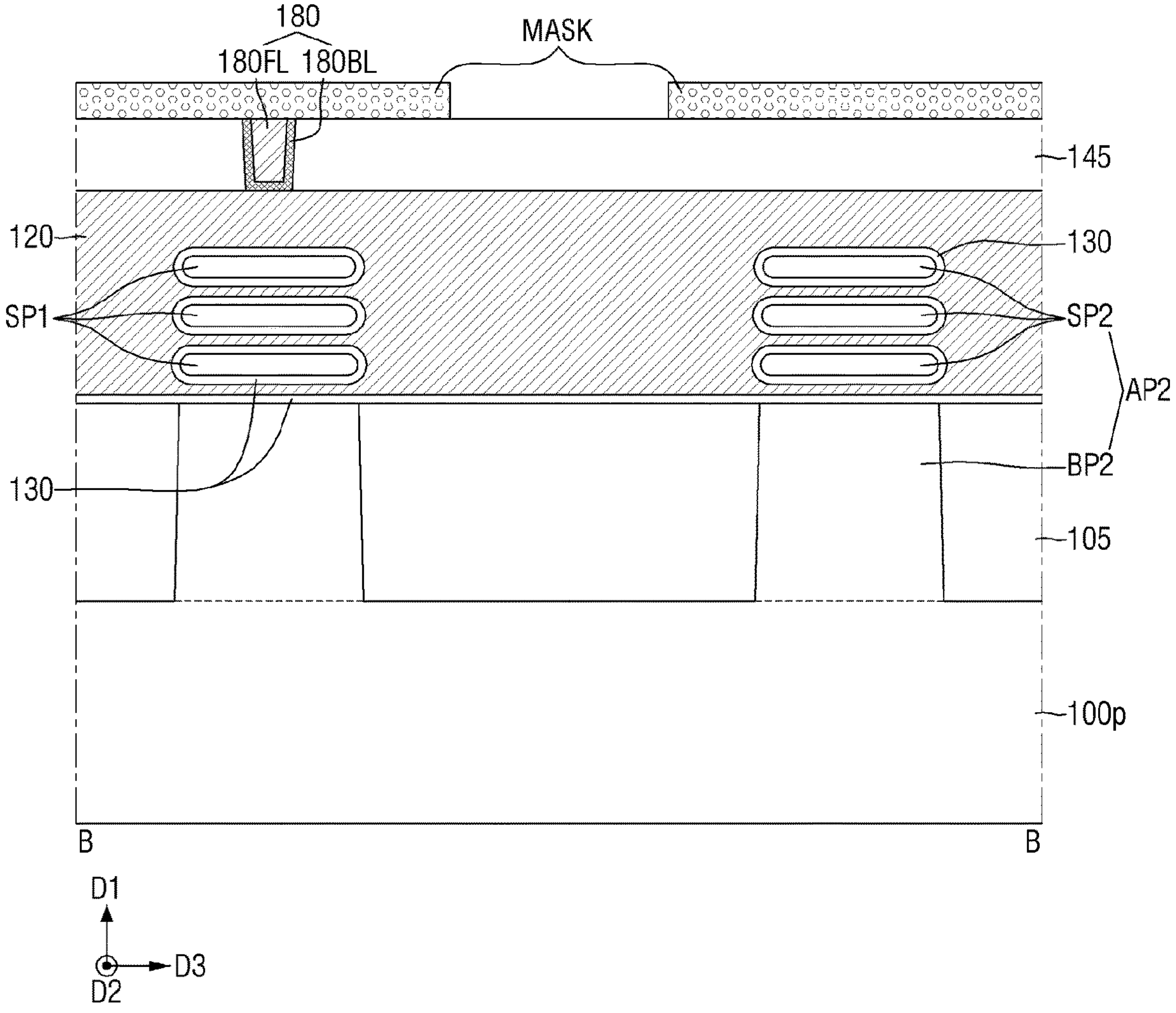

Referring to FIGS. 20A and 20B, a mask layer MASK may be formed on the upper surface of the gate capping film 145 and the upper surface of the first interlayer insulating film 190.

The mask layer MASK may have each opening defined therein that roughly defines a position of each of the gate cutting structure GSS and the active cutting structure ASS. For example, the mask film MASK may be embodied as at least one of a photoresist film, an ACL (amorphous carbon layer), an SOH (spin on hardmask), an SOC (spin on carbon), or a silicon nitride film.

Figure 21A:
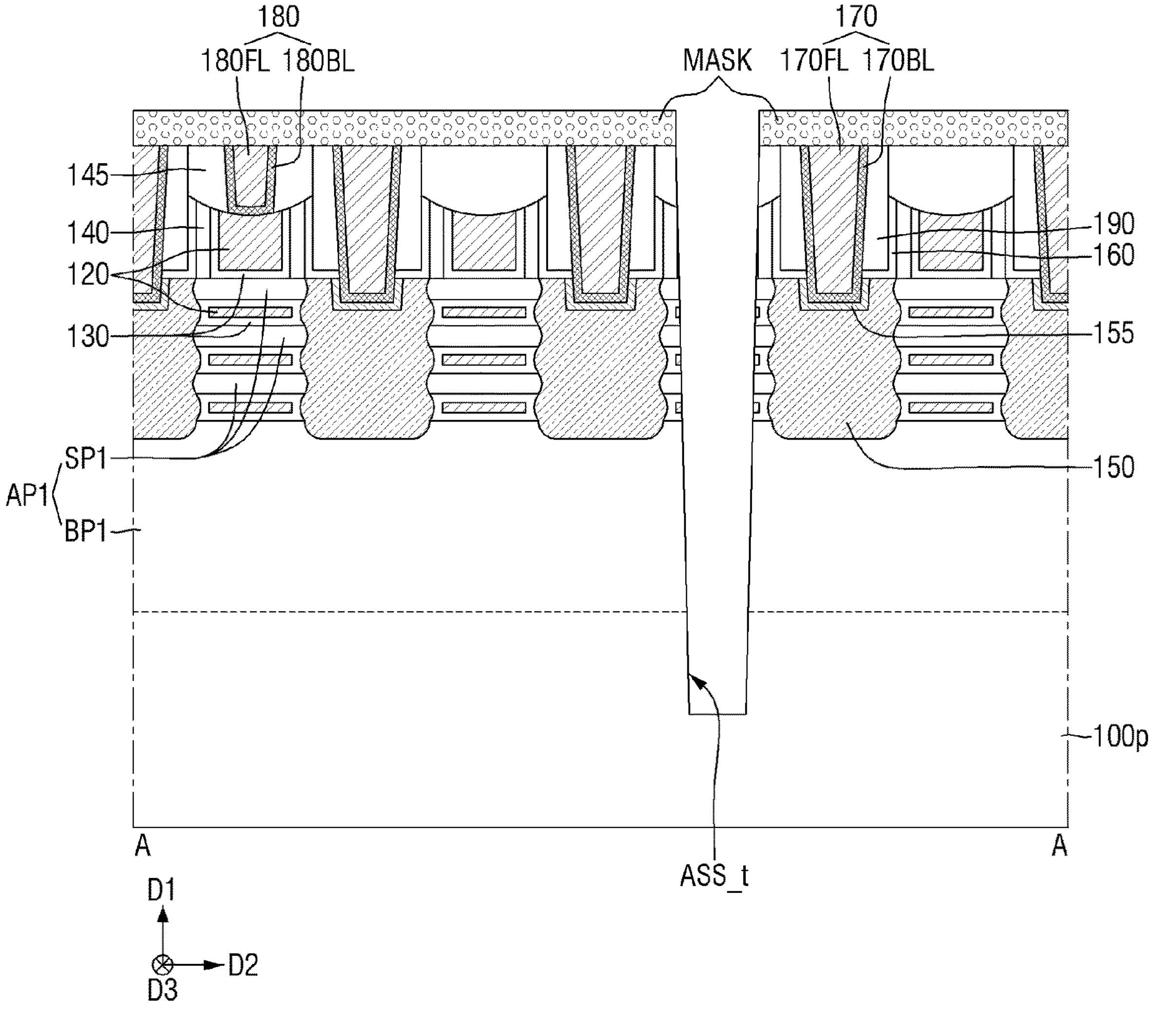
Figure 21B:
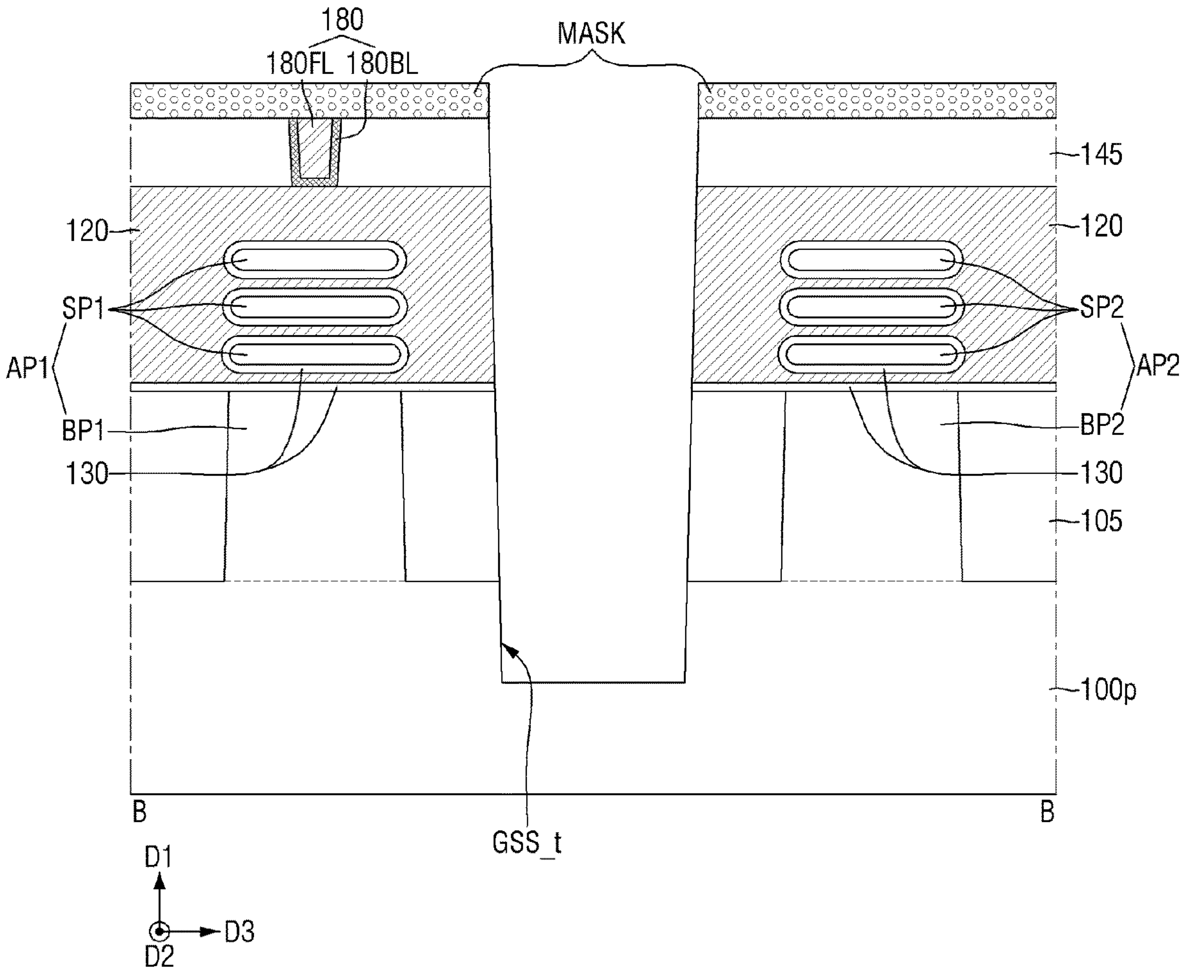

Referring to FIG. 21A and FIG. 21B, an active cutting trench ASS_t and a gate cutting trench GSS_t may be formed using the mask film MASK as an etch mask.

In FIG. 21A, the active cutting trench ASS_t may be formed between the first source/drain patterns 150. Although not shown, the active cutting trench ASS_t may be formed between the second source/drain patterns 250. The active cutting trench ASS_t may extend in an elongate manner in the third direction D3. The active cutting trench ASS_t may cut the first active pattern AP1 and the second active pattern AP2. For example, the active cutting trench ASS_t may cut the first lower pattern BP1, the first sheet patterns SP1, the second lower pattern BP2, and the second sheet patterns SP2. The active cutting trench ASS_t may extend through the gate capping film 145, the gate electrode 120, and the gate insulating film 130. The active cutting trench ASS_t may not extend through an entirety of the pre-substrate 100*p*.

In FIG. 21B, the gate cutting trench GSS_t may be formed between the first active pattern AP1 and the second active pattern AP2. The gate cutting trench GSS_t may extend through the gate capping film 145, the gate electrode 120, the gate insulating film 130, and the field insulating film 105. The gate cutting trench GSS_t may cut the gate electrode 120. The gate cutting trench GSS_t may not extend through an entirety of the pre-substrate 100*p*.

In some embodiments, the active cutting trench ASS_t and the gate cutting trench GSS_t may be formed in the same process. Accordingly, a depth of the active cutting trench ASS_t and a depth of the gate cutting trench GSS_t may be equal to each other.

Figure 22A:
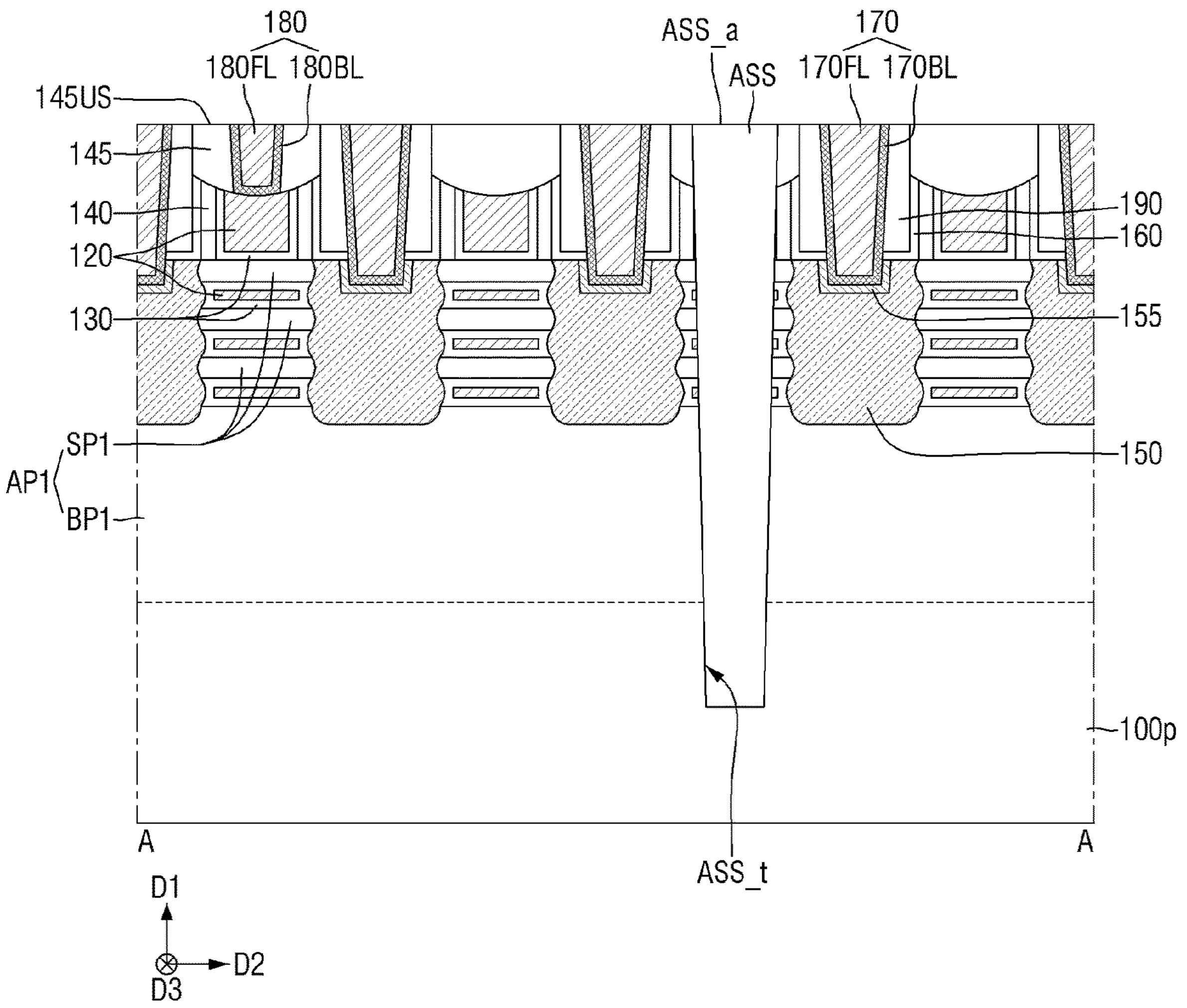
Figure 22B:
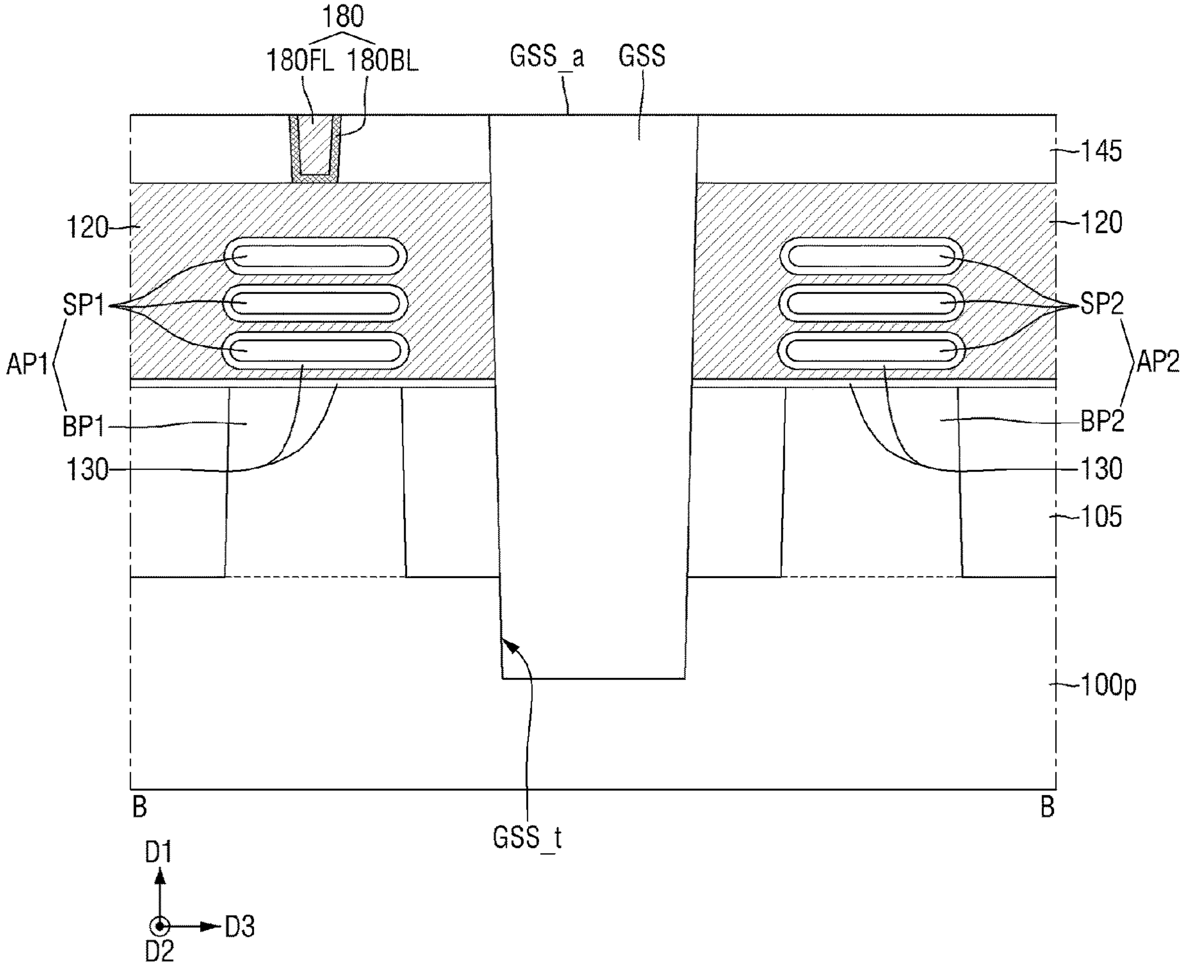

Referring to FIG. 22A and FIG. 22B, a pre-active cutting structure ASS_p and a pre-gate cutting structure GSS_p may be formed. The pre-active cutting structure ASS_p may fill the active cutting trench ASS_t. The pre-gate cutting structure GSS_p may fill the gate cutting trench GSS_t. Subsequently, the mask film MASK may be removed.

Each of the pre-active cutting structure ASS_p and the pre-gate cutting structure GSS_p may be formed as a single film. When each of the pre-active cutting structure ASS_p and the pre-gate cutting structure GSS_p is formed as the single film, each of the pre-active cutting structure ASS_p and the pre-gate cutting structure GSS_p may include at least one of silicon nitride (SiN), silicon oxide ($SiO_2$), silicon oxynitride (SiON), or silicon oxycarbonitride (SiOCN).

Unlike what is illustrated, each of the pre-active cutting structure ASS_p and the pre-gate cutting structure GSS_p may be formed as a stack of multiple films. In this regard, a lower portion of each of the active cutting trench ASS_t and the gate cutting trench GSS_t may include a material with an etch rate higher than that of the material of the pre-substrate 100*p*, while an upper portion of each of the active cutting trench ASS_t and the gate cutting trench GSS_t may include a material which can easily fill a gap.

Figure 23A:
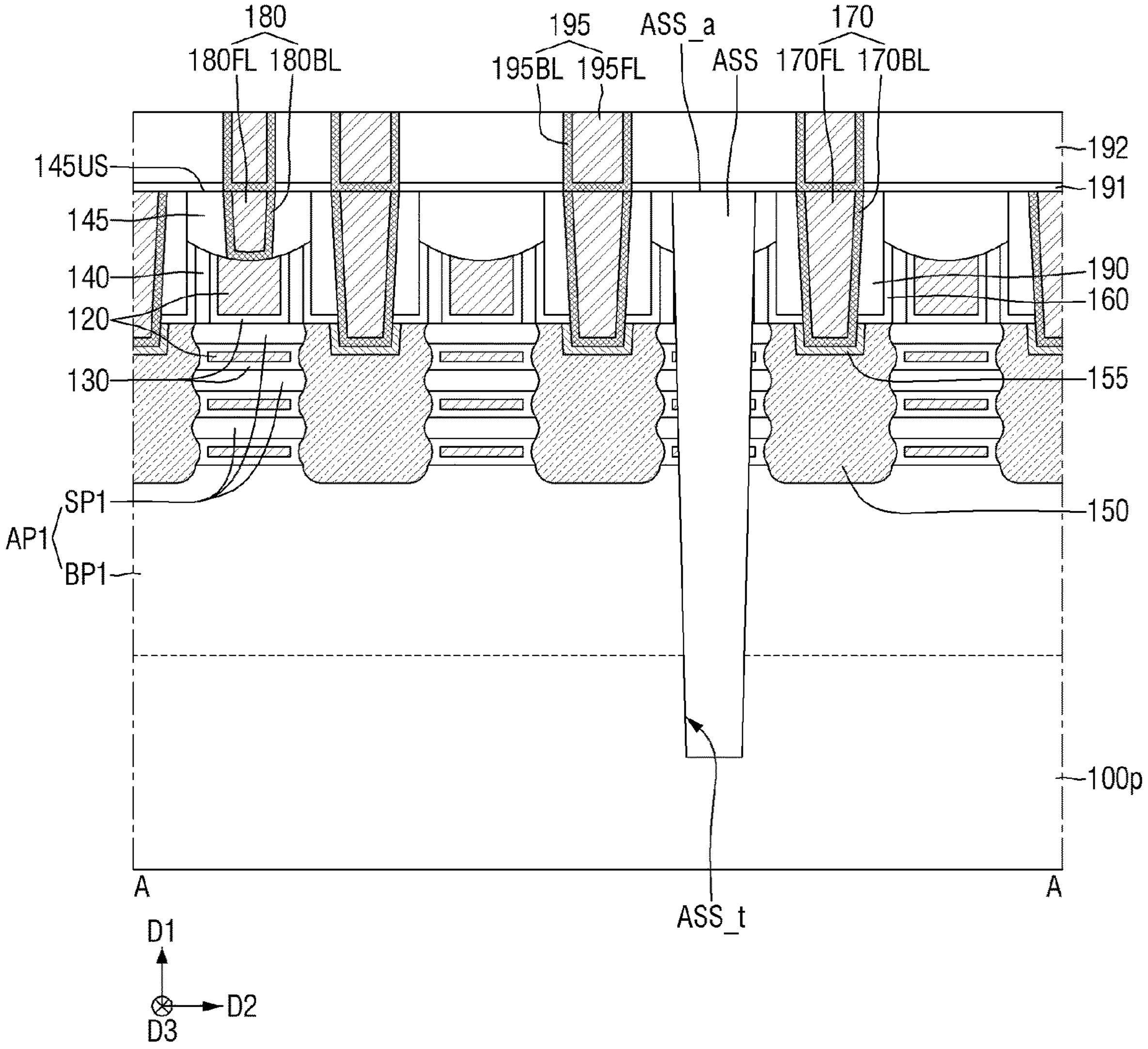
Figure 23B:
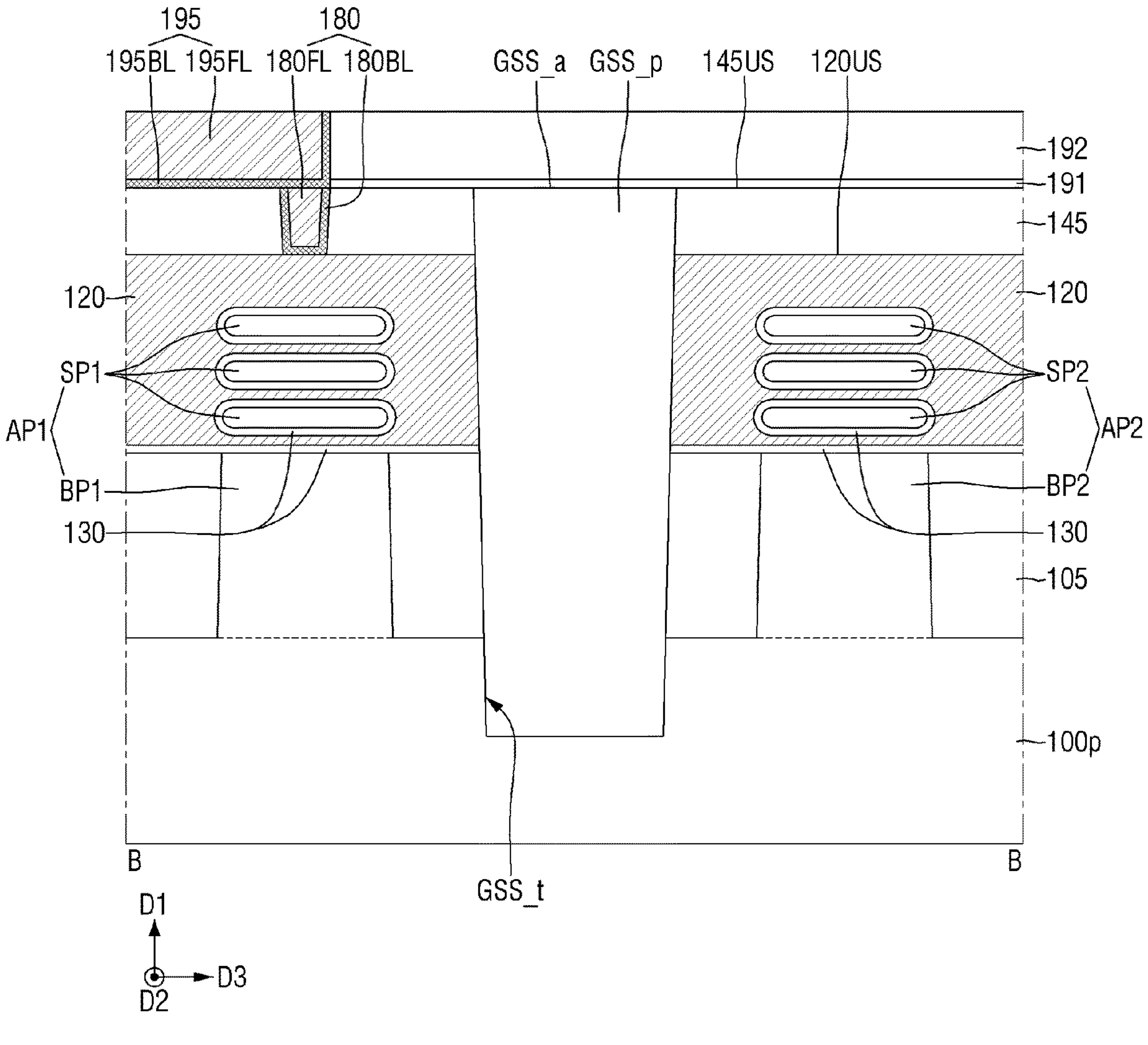

Referring to FIGS. 23A and 23B, the gate cutting structure GSS and the active cutting structure ASS may be formed, and then, the upper stop film 191 and the second interlayer insulating film 192 may be formed. Subsequently, the first via plug 195 may be formed in the second interlayer insulating film 192. Although not shown, the second via plug 295 may be formed in the second interlayer insulating film 192. The first via plug 195 may contact the gate contact 180 or the first source/drain contact 170.

Figure 24A:
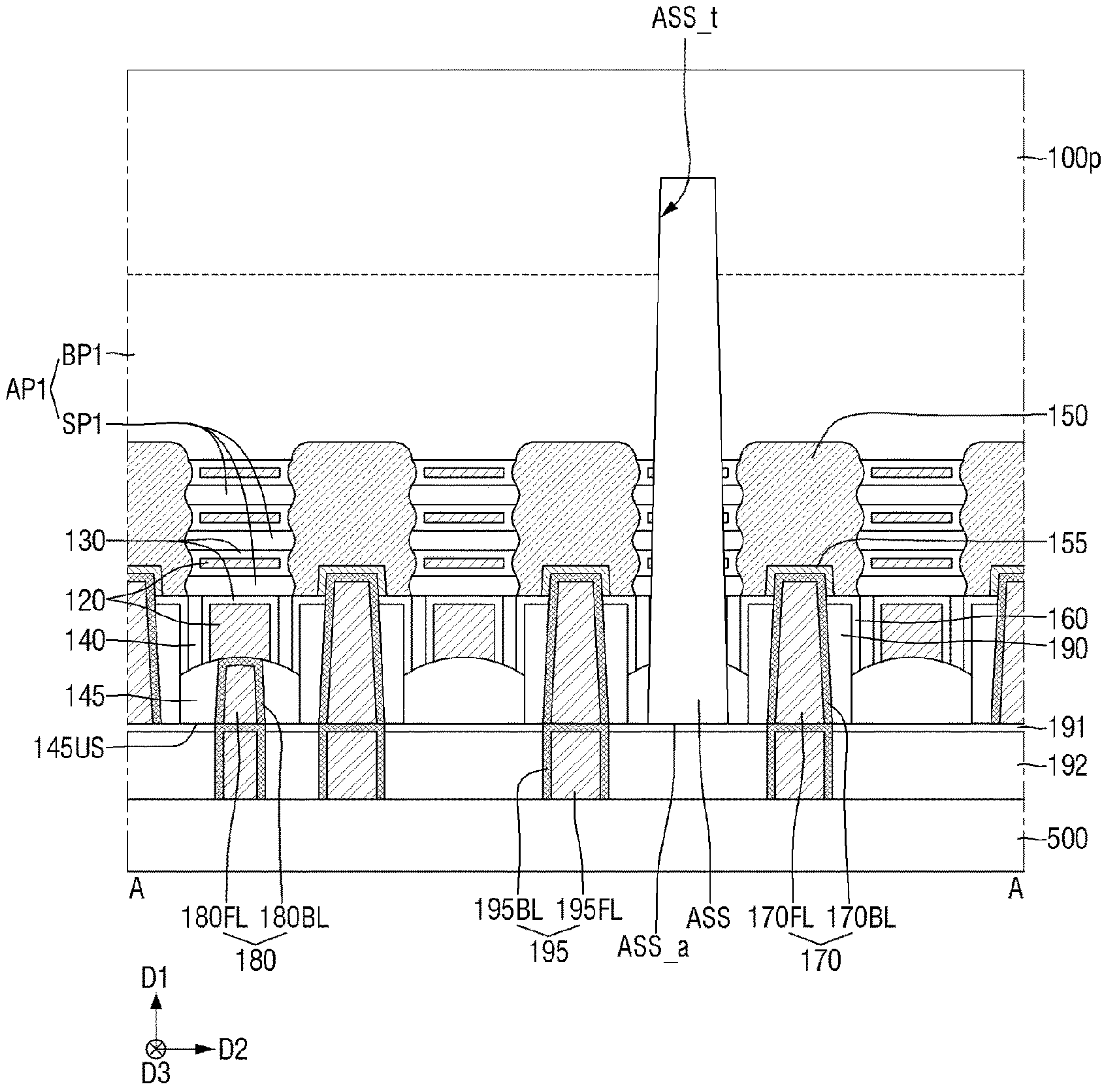
Figure 24B:
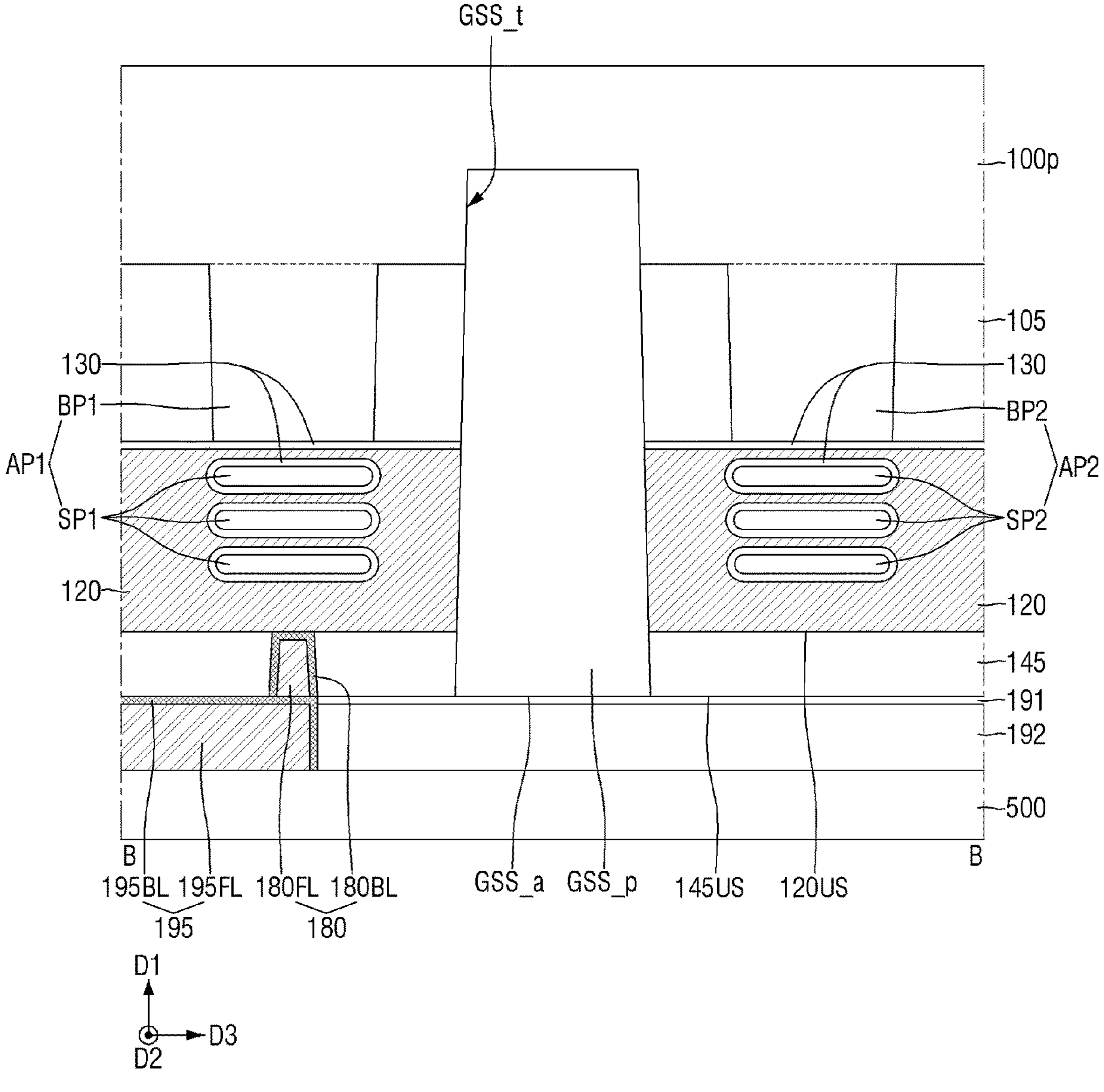

Referring to FIG. 24A and FIG. 24B, a glass substrate 500 may be formed on the second interlayer insulating film 192. After the glass substrate 500 has been formed, a resulting structure may be turned upside down.

Figure 25A:
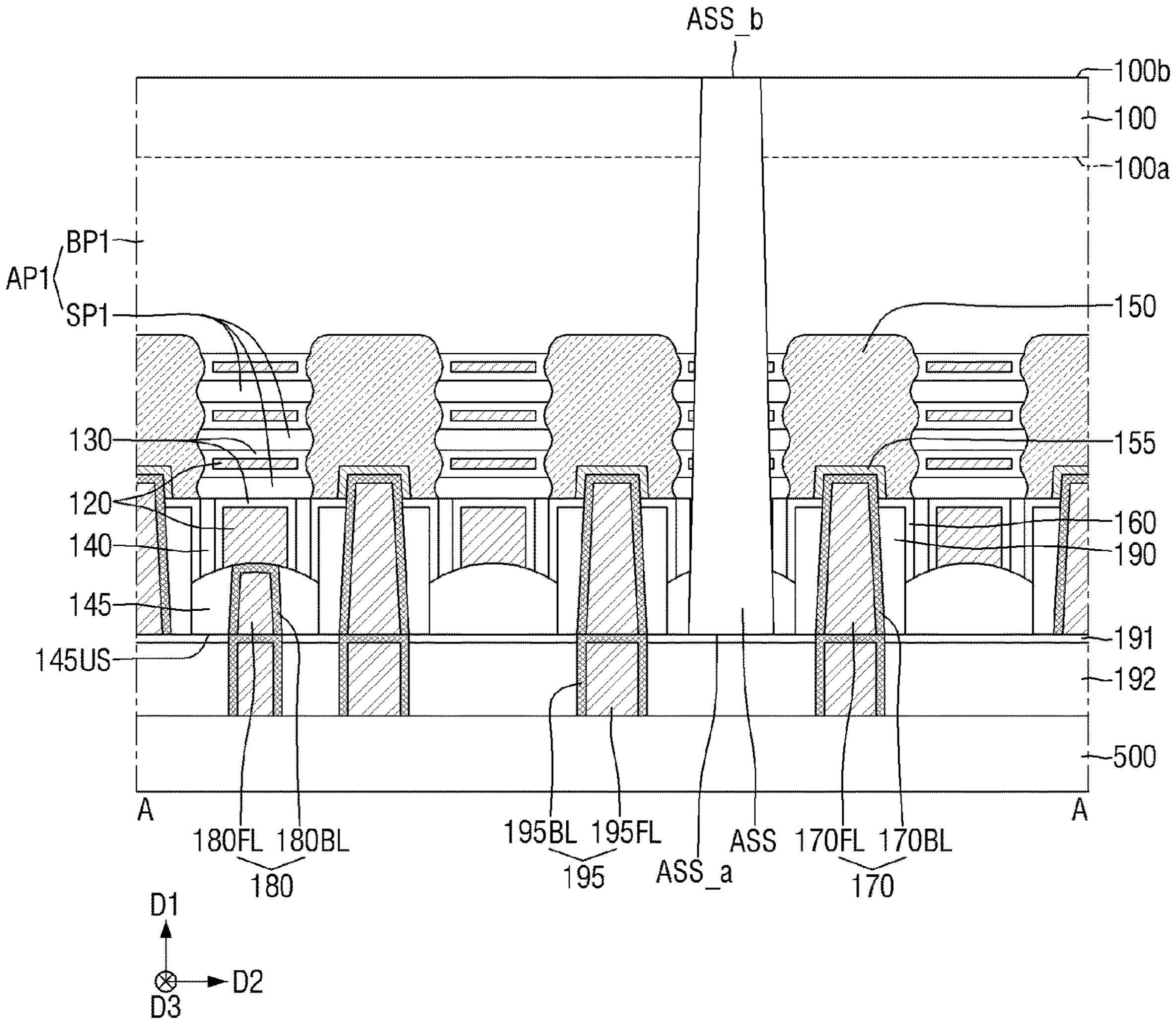
Figure 25B:
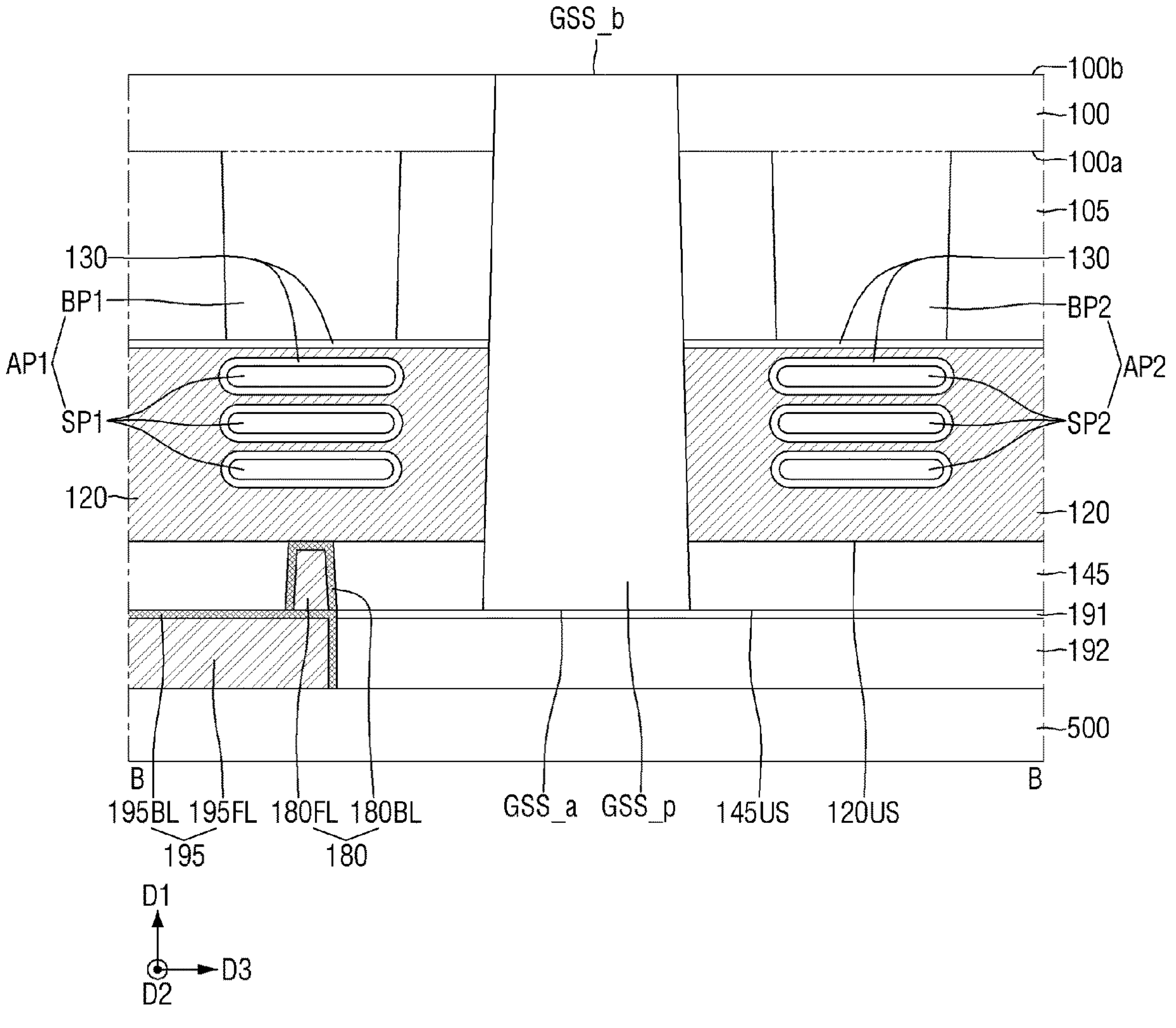

Referring to FIG. 25A and FIG. 25B, the pre-substrate 100*p*, the pre-active cutting structure ASS_p, and the pre-gate cutting structure GSS_p may be etched.

The pre-substrate 100*p*, the pre-active cutting structure ASS_p, and the pre-gate cutting structure GSS_p may be etched using the CMP process. As described above, a material of each of the pre-gate cutting structure GSS_p and the pre-active cutting structure ASS_p may have an etch selectivity with respect to the material of the pre-substrate 100*p*. That is, each of the pre-gate cutting structure GSS_p and the pre-active cutting structure ASS_p may be used as an etch stop film. When the pre-active cutting structure ASS_p and the pre-gate cutting structure GSS_p are exposed while the pre-substrate 100*p*, the pre-active cutting structure ASS_p, and the pre-gate cutting structure GSS_p are etched using the CMP process, the CMP process may be stopped.

The substrate 100 may be formed by etching the pre-substrate 100*p*. The substrate 100 may include the first surface 100*a* and the second surface 100*b* opposite to each other in the first direction D1. The gate cutting structure GSS may be formed by etching the pre-gate cutting structure GSS_p. The gate cutting structure GSS may include the third surface GSS_a and the fourth surface GSS_b opposite to each other in the first direction D1. The active cutting structure ASS may be formed by etching the pre-active cutting structure ASS_p. The active cutting structure ASS may include the fifth surface ASS_a and the sixth surface ASS_b opposite to each other in the first direction D1.

In some embodiments, the second surface 100*b* of the substrate 100, the fourth surface GSS_b of the gate cutting structure GSS, and the sixth surface ASS_b of the active cutting structure ASS may be coplanar with each other.

Figure 26A:
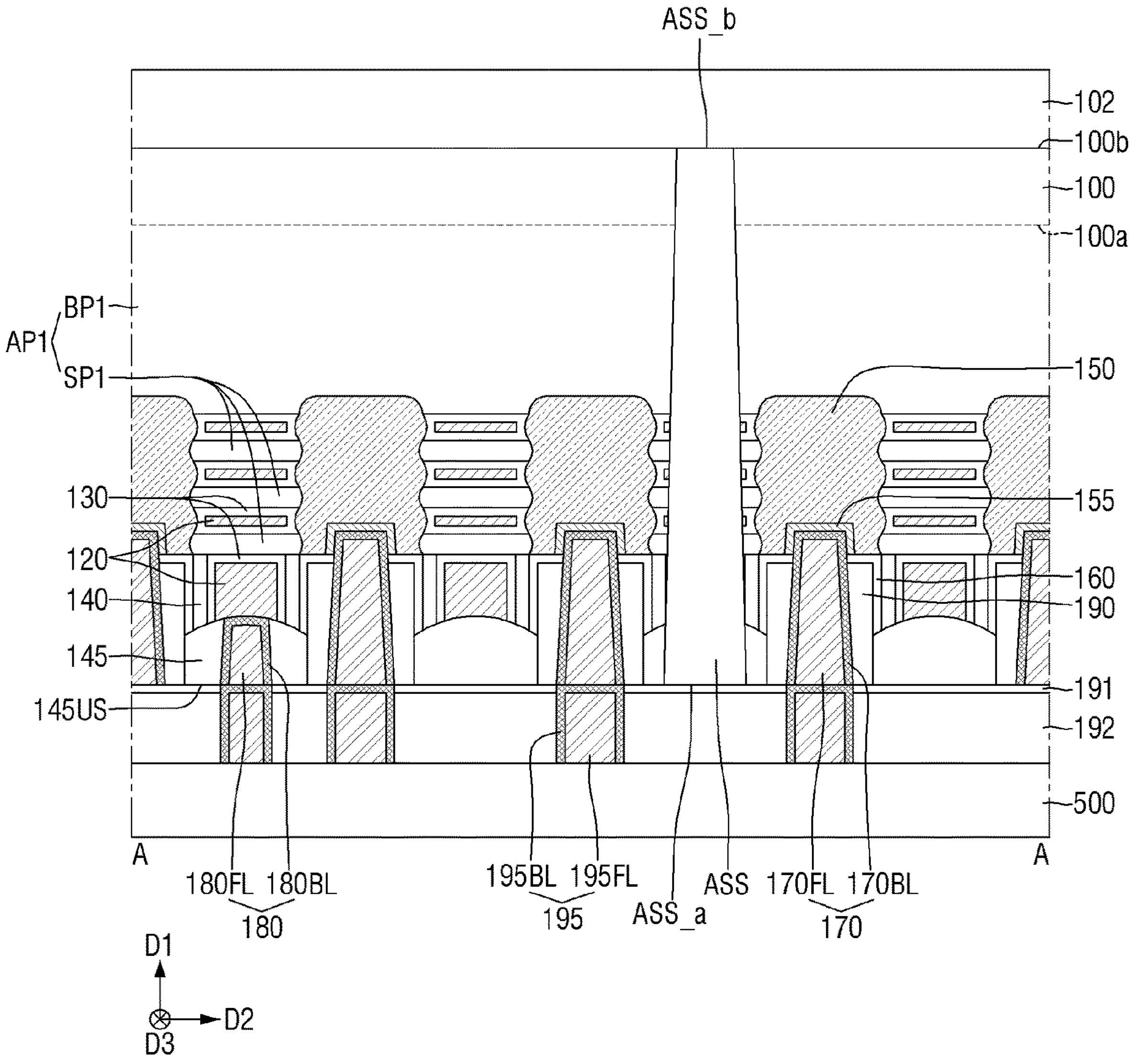
Figure 26B:
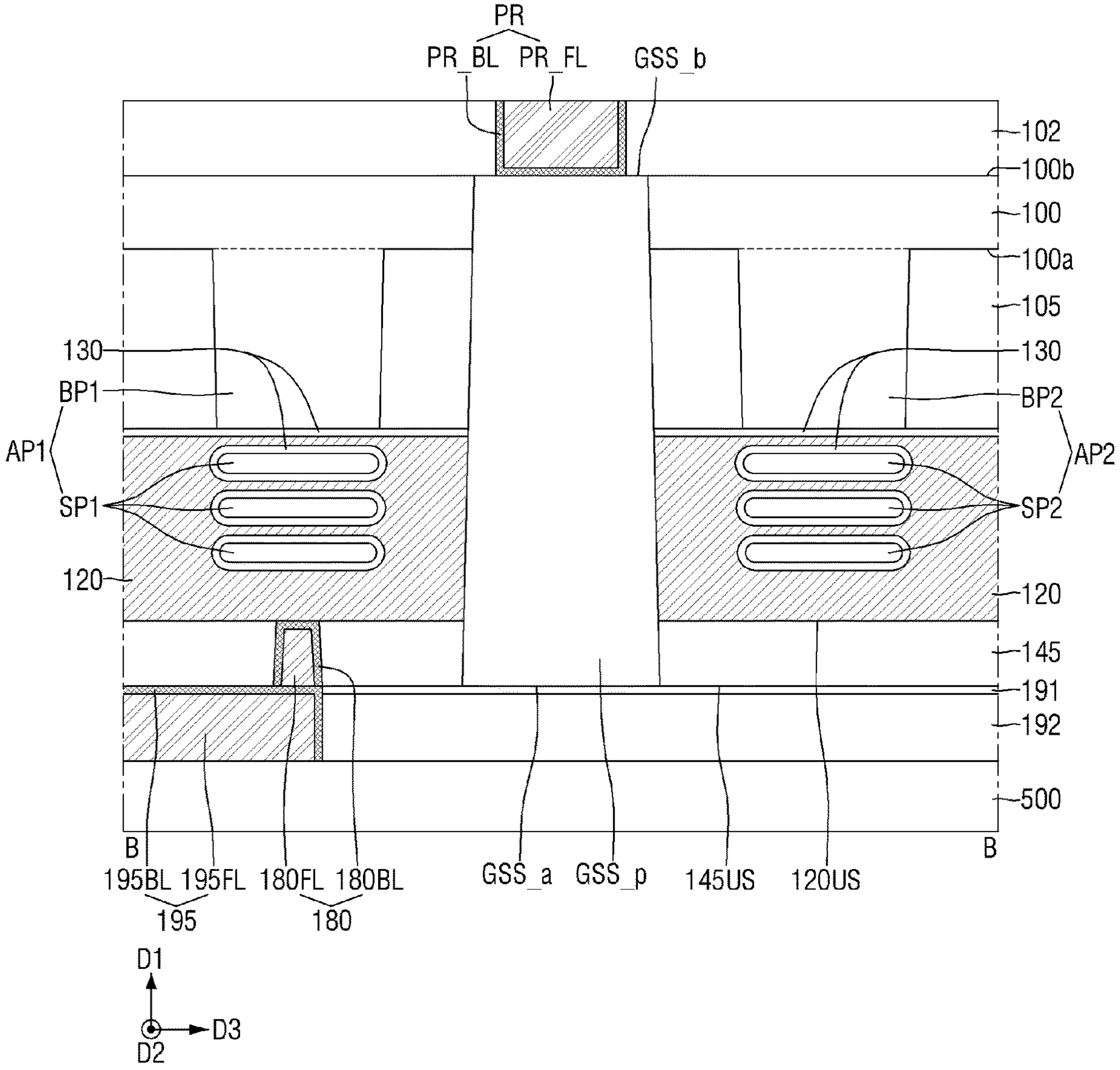

Referring to FIG. 26A and FIG. 26B, the lower insulating film 102 and the power rail PR may be formed. The lower insulating film 102 may be formed on the second surface 100*b* of the substrate 100. The power rail PR may be formed in the lower insulating film 102.

By way of summation and review, as a pitch size of a semiconductor device decreases, it is desired to reduce capacitance between contacts and to secure electrical stability in the semiconductor device.

Example embodiments provide a semiconductor device with improved reliability. That is, example embodiments provide a gate cutting structure and an active cutting structure that penetrate through an entire thickness of the substrate, e.g., trenches of the gate cutting structure and the active cutting structure are formed in a deep manner, so each of the gate cutting structure and the active cutting structure may be used as a stop layer, e.g., during the CMP process of the substrate 100.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:

a substrate including a first surface and a second surface opposite to each other in a first direction;

an active pattern on the first surface of the substrate and extending in a second direction intersecting the first direction;

a gate electrode on the first surface of the substrate and covering the active pattern, the gate electrode extending in a third direction intersecting the first direction and the second direction;

a source/drain pattern on at least one side of the gate electrode and connected to the active pattern;

a gate cutting structure on one side of the active pattern and cutting the gate electrode, the gate cutting structure including a third surface and a fourth surface opposite to each other in the first direction, and the fourth surface of the gate cutting structure being coplanar with the second surface of the substrate;

a power rail on the second surface of the substrate and extending in the second direction; and a via contact extending through the substrate, a first end of the via contact contacting the power rail, and a second end of the via contact being connected to the source/drain pattern.

2. The semiconductor device as claimed in claim 1, wherein the gate cutting structure is a single film.

3. The semiconductor device as claimed in claim 1, wherein the gate cutting structure includes a first gate sub-film and a second gate sub-film on the first gate sub-film, the first gate sub-film including a material different from a material of the second gate sub-film.

4. The semiconductor device as claimed in claim 3, wherein the first gate sub-film has a solid column shape, a cup shape, or a hollow column shape.

5. The semiconductor device as claimed in claim 1, further comprising a source/drain contact on the source/drain pattern and electrically connected to the source/drain pattern, the via contact being electrically connected to the source/drain contact.

6. The semiconductor device as claimed in claim 5, wherein the third surface of the gate cutting structure is coplanar with an upper surface of the source/drain contact.

7. The semiconductor device as claimed in claim 1, wherein the third surface of the gate cutting structure is coplanar with an upper surface of the gate electrode.

8. The semiconductor device as claimed in claim 1, wherein the active pattern includes:

a lower pattern extending in the second direction; and
sheet patterns on the lower pattern and spaced apart from the lower pattern in the first direction.

9. The semiconductor device as claimed in claim 8, wherein the via contact extends through the substrate and the lower pattern to contact the source/drain pattern.

* * * * *